US012616063B2

(12) United States Patent
Cha et al.

(10) Patent No.: US 12,616,063 B2
(45) Date of Patent: Apr. 28, 2026

(54) PIXEL DEVICE FOR LED DISPLAY AND LED DISPLAY APPARATUS HAVING THE SAME

(71) Applicant: SEOUL VIOSYS CO., LTD., Ansan-si (KR)

(72) Inventors: Namgoo Cha, Ansan-si (KR); Seongchan Park, Ansan-si (KR); Chung Jae Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 454 days.

(21) Appl. No.: 17/982,524

(22) Filed: Nov. 8, 2022

(65) Prior Publication Data

US 2023/0154895 A1 May 18, 2023

Related U.S. Application Data

(60) Provisional application No. 63/277,196, filed on Nov. 9, 2021.

(51) Int. Cl.
| | |
|---|---|
| *H01L 25/065* | (2023.01) |
| *H01L 27/15* | (2006.01) |
| *H10H 29/14* | (2025.01) |
| *H10W 90/00* | (2026.01) |
| *H10W 72/00* | (2026.01) |
(Continued)

(52) U.S. Cl.
CPC .......... *H10W 90/00* (2026.01); *H10H 29/142* (2025.01); *H10W 72/07354* (2026.01); *H10W 72/347* (2026.01); *H10W 72/353* (2026.01); *H10W 72/354* (2026.01); *H10W 90/297* (2026.01); *H10W 90/732* (2026.01)

(58) Field of Classification Search
CPC ... H01L 25/0657; H01L 27/156; H01L 24/29; H10H 29/352; H10H 29/142
See application file for complete search history.

(56) References Cited

U.S. PATENT DOCUMENTS

| | | | |
|---|---|---|---|
| 10,636,772 B1* | 4/2020 | Ray ...................... | H01L 25/167 |
| 2010/0230729 A1* | 9/2010 | Ellis-Monaghan ......................... | |
| | | | H10F 39/8057 |
| | | | 716/30 |

(Continued)

FOREIGN PATENT DOCUMENTS

| | | |
|---|---|---|
| CN | 108962930 A | 12/2018 |
| JP | 2017-116885 A | 6/2017 |
| WO | WO 2020/263183 A1 | 12/2020 |

OTHER PUBLICATIONS

International Search Report dated Feb. 27, 2023 in International Application No. PCT/KR2022/017505.

(Continued)

*Primary Examiner* — Dale E Page
*Assistant Examiner* — Wilner Jean Baptiste
(74) *Attorney, Agent, or Firm* — Oblon, McClelland, Maier & Neustadt, L.L.P.

(57) ABSTRACT

A pixel device including a first floor including a first LED, a first lower pad, and a first upper pad electrically connected to the first LED; a second floor disposed over the first floor, and including a second LED, a second lower pad, and a second upper pad electrically connected to the second LED; and a third floor disposed over the second floor, and including a third LED, a third lower pad, and a third upper pad electrically connected to the third LED.

18 Claims, 39 Drawing Sheets

(51) Int. Cl.
    *H10W 72/30*       (2026.01)
    *H10W 90/20*       (2026.01)

(56)             References Cited

U.S. PATENT DOCUMENTS

| 2019/0198485 | A1* | 6/2019 | Chae | H10H 20/857 |
| 2019/0229234 | A1 | 7/2019 | Zou et al. | |
| 2020/0152692 | A1* | 5/2020 | Liao | H10H 29/142 |
| 2021/0050334 | A1* | 2/2021 | Ray | H01L 25/0756 |
| 2021/0098527 | A1* | 4/2021 | Ikeda | H01L 25/0753 |

OTHER PUBLICATIONS

Extended European Search Report issued on Sep. 15, 2025, in corresponding European Application No. 22893167.1, 9 pages.
Office Action issued Feb. 23, 2026, in corresponding India Patent Application No. 202417038222, 7 pages.

* cited by examiner

PIXEL DEVICE FOR LED DISPLAY AND LED DISPLAY APPARATUS HAVING THE SAME

CROSS REFERENCE TO RELATED APPLICATION

This application claims the benefit of U.S. Provisional Patent Application No. 63/277,196, filed on Nov. 9, 2021, which is hereby incorporated by reference for all purposes as if fully set forth herein.

BACKGROUND

Field

Exemplary embodiments relate to a pixel device for an LED display that implements an image using a light emitting diode and a display apparatus having the same.

Discussion of the Background

Light emitting diodes are inorganic light sources, which are used in various fields, such as display apparatuses, automobile lamps, general lighting, and the like. The light emitting diodes have advantages such as longer lifespan, lower power consumption, and quicker response, than conventional light sources, and thus, they have been replacing the conventional light sources.

The conventional light emitting diodes have been generally used as backlight light sources in display apparatuses. However, LED displays that directly realize images using the light emitting diodes have been recently developed.

In general, the display apparatus displays various colors through mixture of blue, green, and red light. In order to realize various images, the display apparatus includes a plurality of pixels, each of the pixels includes sub-pixels of blue, green, and red light. In this manner, a color of a certain pixel is determined based on colors of the sub-pixels, and images can be realized through a combination of such pixels.

An LED display apparatus implements an image by using a very small LED of a micro unit. To manufacture the LED display apparatus, numerous pixel devices are manufactured, and the pixel devices are mounted on a circuit board using pads formed on the pixel devices. Each of the pixel devices includes one or more pixels. The pixel device may include a pixel in which LEDs are laterally arranged, or a pixel in which LEDs are vertically stacked.

The pixel of a vertically stacked structure is generally manufactured by bonding semiconductor layers grown on different growth substrates using a wafer-wafer bonding technique. The pixel device is manufactured by patterning semiconductor layers bonded to one another at a wafer level, forming an electrode structure for electrical connection, and thereafter, dividing the pixel device into individual pixel device units.

In general, since the electrode structure is formed after bonding the semiconductor layers, multiple layers having different materials, such as semiconductor layers and insulation layers, need to be etched. In this case, since etching is required through several layers, it is difficult to generate a hole having a relatively large aspect ratio. Accordingly, it is difficult to form the electrode structure, and a manufacturing process of a conventional pixel becomes complicated.

Furthermore, since electrical characteristics or optical characteristics can be measured after the pixel device is completed, tests for defective pixel device can be conducted only after the pixel device is completed. When a defective pixel device is identified, the defective pixel device is discarded or repaired. However, when blue, green, and red LEDs have a stacked structure, even when a defect occurs in any one of the LEDs, it leads to a defect in the pixel device, resulting in a very low yield of the pixel devices. In addition, even when the defective pixel device is repaired, since a repair process has to be performed after a final pixel device is completed, it is relatively difficult to repair the pixel device. Accordingly, even when repair is possible, the defective pixel device is often discarded instead of being repaired due to drawbacks, such as process complexity and costs, and thus, it is difficult to increase a process yield of pixel devices through repair.

The above information disclosed in this Background section is only for understanding of the background of the inventive concepts, and, therefore, it may contain information that does not constitute prior art.

SUMMARY

Exemplary embodiments provide a pixel device having a structure in which LEDs are vertically stacked while facilitating increased process yield, and a display apparatus having the same.

Exemplary embodiments also provide a pixel device that facilitates repairing defective LEDs during a manufacturing process and a display apparatus having the same.

Exemplary embodiments further provide a simplified manufacturing process for a pixel device, in which an electrode structure is easily formed, and a display apparatus having the same.

Additional features of the inventive concepts will be set forth in the description which follows, and in part will be apparent from the description, or may be learned by practice of the inventive concepts.

A pixel device according to an exemplary embodiment includes a first floor including a first LED, and a first lower pad and a first upper pad electrically connected to the first LED; a second floor disposed over the first floor, and including a second LED, and a second lower pad and a second upper pad electrically connected to the second LED; and a third floor disposed over the second floor, and including a third LED, and a third lower pad and a third upper pad electrically connected to the third LED.

As used herein, a term "pixel device" refers to a unit device configured to be mounted on a circuit board. The pixel device may include one or more pixels. Meanwhile, the pixel is generally a basic unit constituting an image in a display. To implement a color image, one pixel may include at least three sub-pixels each emitting a single color. Structurally, a term "pixel" refers to a combination of the sub-pixels, and the sub-pixels are stacked one above another.

The first LED, the second LED, and the third LED may emit visible light of different colors from one another. For example, the first LED may emit blue light, the second LED may emit green light, and the third LED may emit red light. In another embodiment, the first LED may emit green light, the second LED may emit blue light, and the third LED may emit red light.

The first through third lower pads may be electrically connected to one another, and the first through third upper pads may be electrically spaced apart from one another.

The pixel device may include a lower adhesive layer bonding the first floor and the second floor; and an upper adhesive layer bonding the second floor and the third floor.

The first through third LEDs may be disposed so as to overlap one another in a vertical direction. A pixel is provided by the first through third LEDs overlapping in the vertical direction.

The first through third LEDs may partially overlap one another.

The pixel device may further include a light blocking layer surrounding the first LED, the second LED, or the third LED.

The first floor may further include a first insulation layer covering the first LEDs and a first planarization layer covering the insulation layer, and the first upper pad may be disposed on the first planarization layer. Furthermore, the first lower pad may be disposed between the first insulation layer and the first planarization layer or on the first planarization layer.

The second floor may further include a second insulation layer covering the second LEDs and a second planarization layer covering the second insulation layer, and the second upper pad may be disposed on the second planarization layer. Furthermore, the second lower pad may be disposed between the second insulation layer and the second planarization layer or on the second planarization layer.

The third floor may further include a third insulation layer covering the third LEDs and a third planarization layer covering the third insulation layer, and the third upper pad may be disposed on the third planarization layer. Furthermore, the third lower pad may be disposed between the third insulation layer and the third planarization layer or on the third planarization layer.

The pixel device may further include an upper insulation layer covering the third floor and pixel device pads disposed on the upper insulation layer. Each of the pixel device pads may be electrically connected to at least one of the first through third lower pads and the first through third upper pads.

A plurality of first LEDs, a plurality of second LEDs, and a plurality of third LEDs may be arranged in a matrix of n×m (n, m is a positive integer) on the first through third floors, respectively, and the number of pixel pad electrodes may be (3n+m).

The pixel device pads may be electrically connected to at least one of the first through third lower pads and the first through third upper pads through connection vias. The connection vias may be spaced apart from the first through third LEDs in a lateral direction.

The first through third lower pads may be electrically connected to cathodes of the first through third LEDs, respectively, and the first through third upper pads may be electrically connected to anodes of the first through third LEDs, respectively.

A display apparatus according to an embodiment of the present disclosure includes a circuit board and a pixel device disposed on the circuit board, in which the pixel device includes a first floor including a first LED, and a first lower pad and a first upper pad electrically connected to the first LED; a second floor disposed over the first floor, and including a second LED, and a second lower pad and a second upper pad electrically connected to the second LED; and a third floor disposed over the second floor, and including a third LED, and a third lower pad and a third upper pad electrically connected to the third LED.

The pixel device may further include an upper insulation layer disposed on the third floor and pixel device pads disposed on the upper insulation layer, and the pixel device pads may be bonded to the circuit board.

The pixel device pads may be electrically connected to at least one of the first through third lower pads and the first through third upper pads through connection vias, and the connection vias may be spaced apart from the first through third LEDs in a lateral direction.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 22A is a schematic plan view illustrating a pixel device according to another exemplary embodiment.

DETAILED DESCRIPTION

Figure 1A:
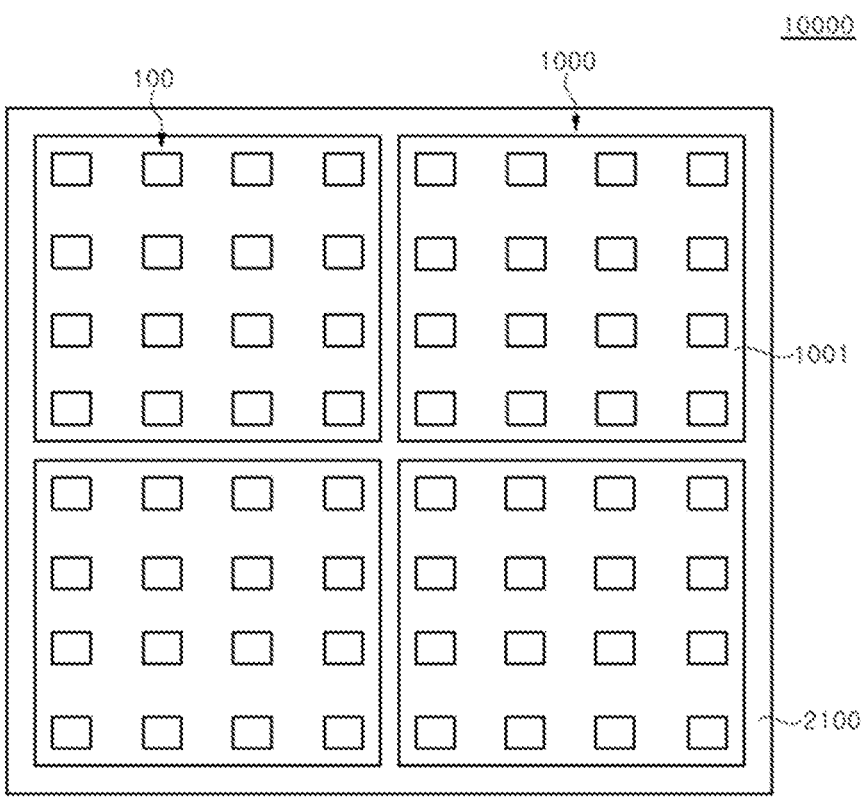
FIG. 1A is a schematic plan view illustrating a display apparatus according to an exemplary embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
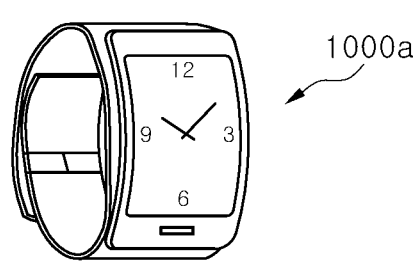
FIG. 1B are schematic perspective views illustrating various display apparatuses according to an exemplary embodiment.
Figure 1B:
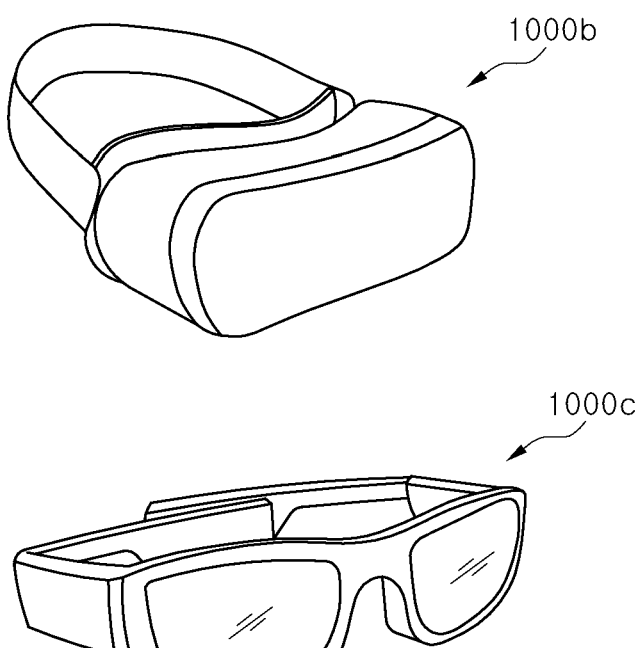
Figure 1C:
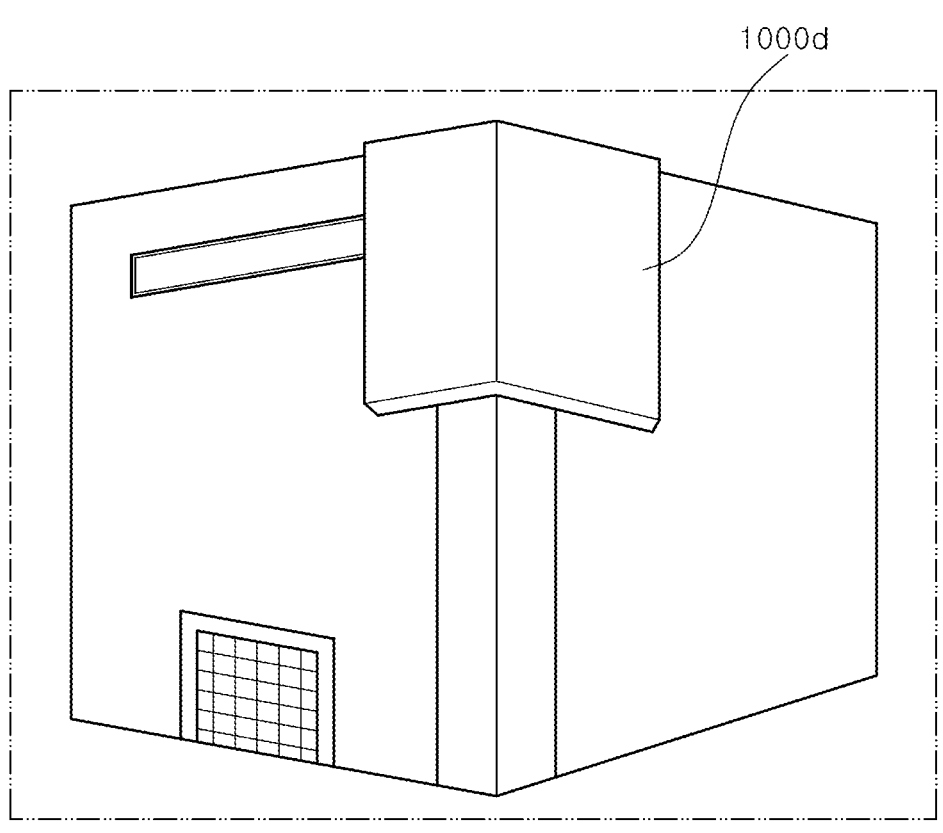
FIG. 1C is a schematic perspective view illustrating another display apparatus according to an exemplary embodiment.
Figure 1D:
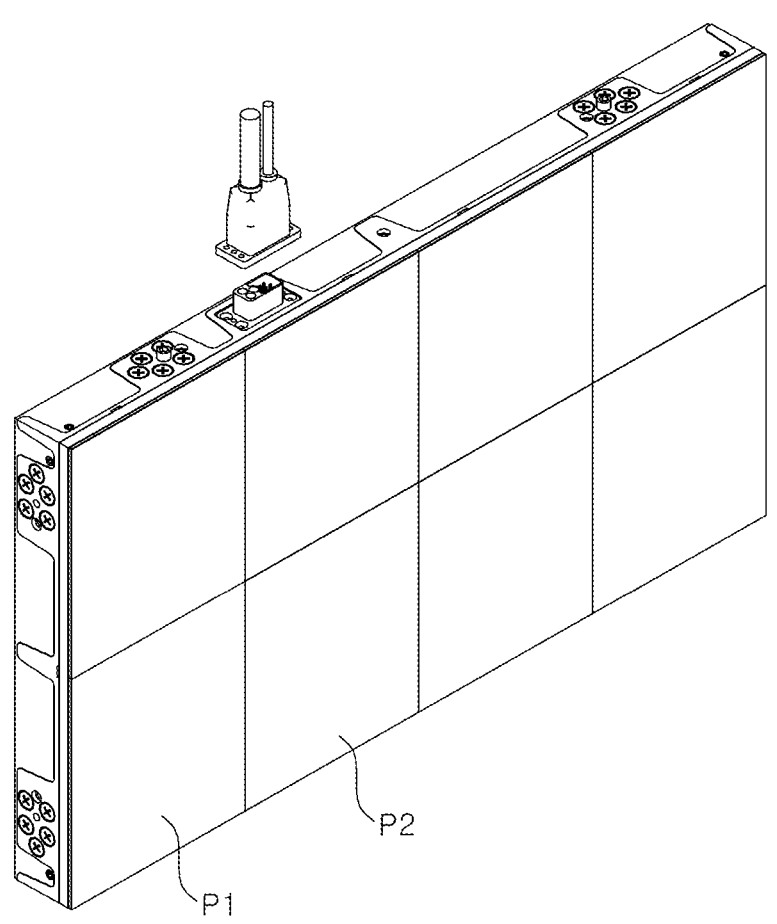
FIG. 1D is a schematic perspective view illustrating another display apparatus according to an exemplary embodiment.

FIG. 1A is a schematic plan view illustrating a display apparatus according to an exemplary embodiment, and FIGS. 1B, 1C, and 1D are schematic perspective views illustrating various display apparatuses 1000a, 1000b, 1000c, and 1000d according to an exemplary embodiment.

Referring to FIG. 1A, a display apparatus 10000 may include a panel substrate 2100 and a plurality of pixel modules 1000.

The display apparatus 10000 is not particularly limited, but may include a smart watch 1000a, a wearable display apparatus 1000b such as a VR headset or glasses, an AR display apparatus 1000c such as augmented reality glasses, or an indoor or outdoor display apparatus 1000d or 1000e such as a micro LED TV or signage. The panel substrate 2100 and the plurality of pixel modules 1000 may be disposed in the display apparatus 10000. A gap between pixels in the display apparatus 10000 may be very narrow, for example, the gap between pixels may be 0.01 mm or less. The display apparatus 10000 may implement an image through pixels mounted on a circuit board or a transparent substrate. In some display apparatuses, a distance between the display apparatus and an external receiver (e.g., a user's eyes) that recognizes the display may be 200 mm or less. The gap between pixels may be 0.005% to 0.1% of the distance between the external receiver and the display apparatus. The display apparatus 10000 may transmit an optical signal from a substrate including a curved surface to the external receiver. The display apparatus 10000 may also be a transparent display apparatus using a transparent substrate.

The panel substrate 2100 may include a circuit for a passive matrix driving or active matrix driving. In an exemplary embodiment, the panel substrate 2100 may include wirings and resistors therein, and, in another exemplary embodiment, the panel substrate 2100 may include wirings, transistors, and capacitors. The panel substrate 2100 may also have pads that are capable of being electrically connected to the circuit disposed on an upper surface thereof.

In an exemplary embodiment, the plurality of pixel modules 1000 is arranged on the panel substrate 2100. Each of the pixel modules 1000 may include a circuit board 1001, and a plurality of pixel devices 100 disposed on the circuit board 1001, and may include a molding member covering the pixel devices 100. In another exemplary embodiment, the plurality of pixel devices 100 may be directly arranged on the panel substrate 2100, and the molding member may cover the pixel devices 100.

The smart watch 1000a may have 500 to 1500 cd/m² (or nits) or more, and a brightness thereof may be adjusted according to an external illumination. The wearable display apparatus 1000b, such as a VR headset or glasses, may have 150 to 200 cd/m² (or nits), or a viewing angle thereof may be 50 degrees or more. The indoor or outdoor display apparatus 1000d or 1000e, such as Micro LED TV or signage, may have 1000 cd/m² (or nits) or more, or 80 degrees or more viewing angle, especially for outdoor use, 3000 cd/m² (or nits) or more. In the display apparatus 1000d or 1000e, a plurality of panels P1 and P2 is arranged in rows and columns and attached to a frame, and a plurality of micro LED pixels is disposed on the plurality of panels P1 and P2 to supply electricity or signals, and thus, the display apparatus may be turned on or its luminous intensity may be adjusted according to supplied electricity or signals. The plurality of panels P1 and P2 may be connected to an external power source using respective connectors, or the plurality of panels P1 and P2 may be electrically connected to one another using connectors.

Hereinafter, a pixel device 100 according to an exemplary embodiment will be described in detail with reference to FIGS. 2A, 2B, 2C, 3A, 3B, and 3C.

Figure 2A:
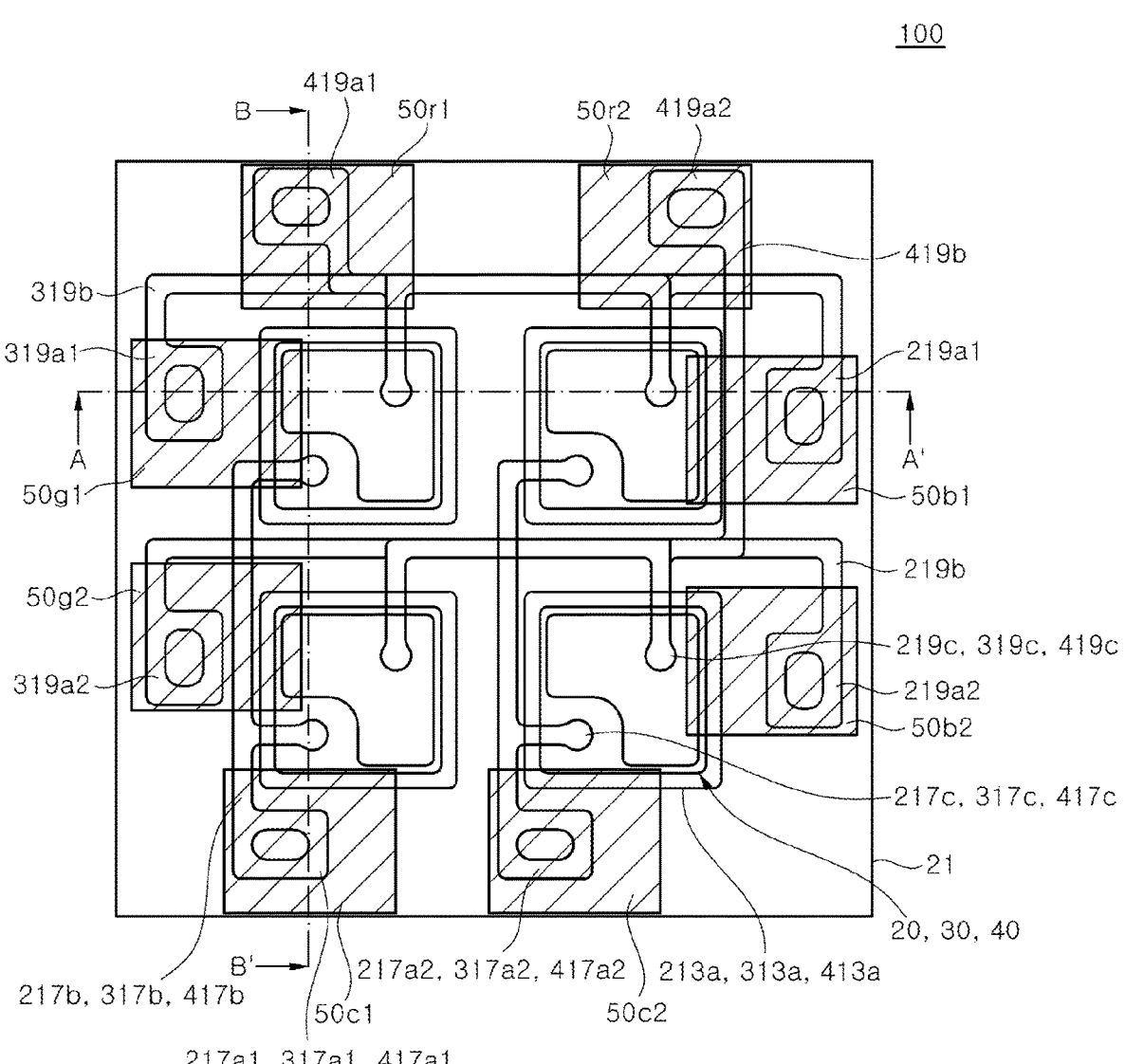
FIG. 2A is a schematic plan view illustrating a pixel device according to an exemplary embodiment.
Figure 2B:
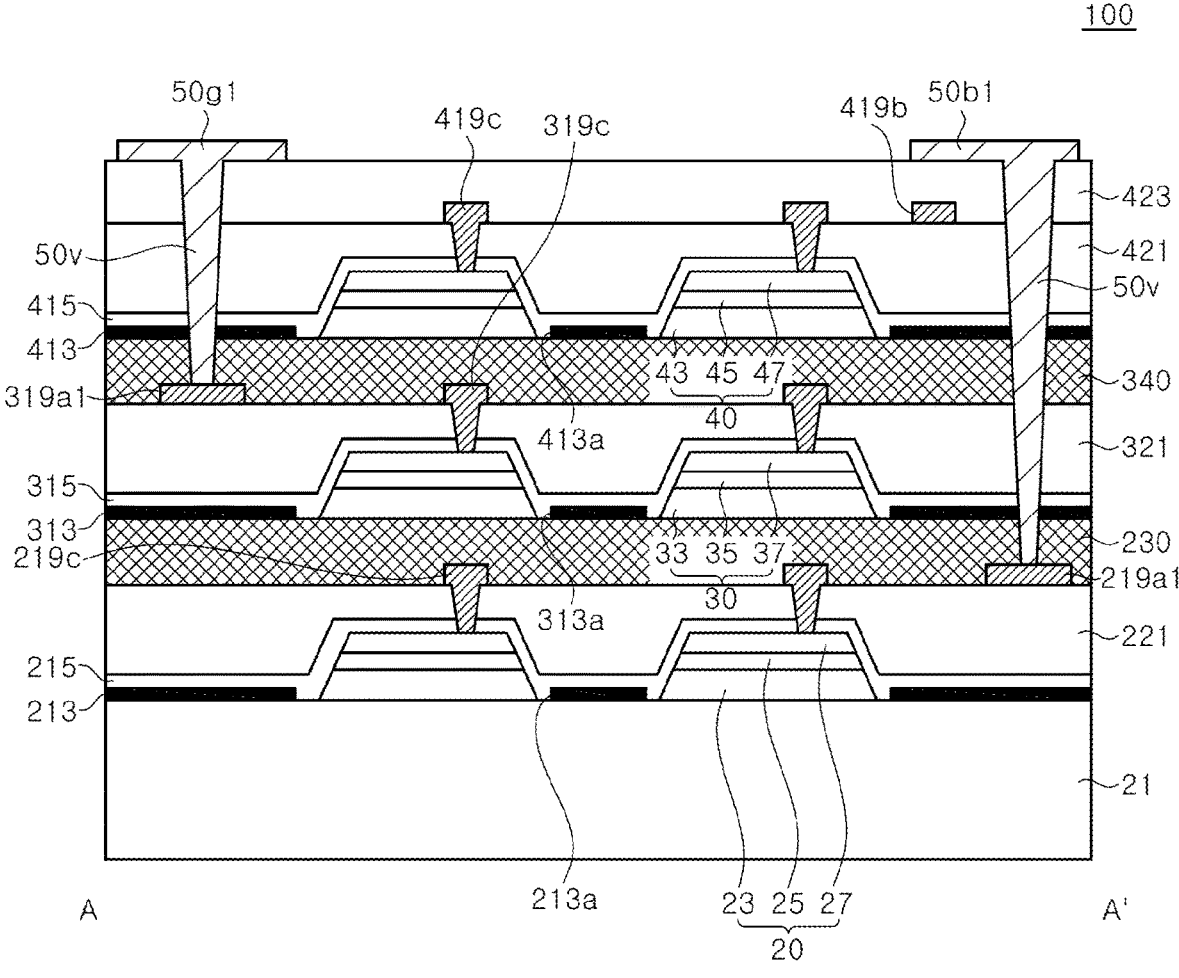
FIG. 2B is a schematic cross-sectional view taken along line A-A' of FIG. 2A.
Figure 2C:
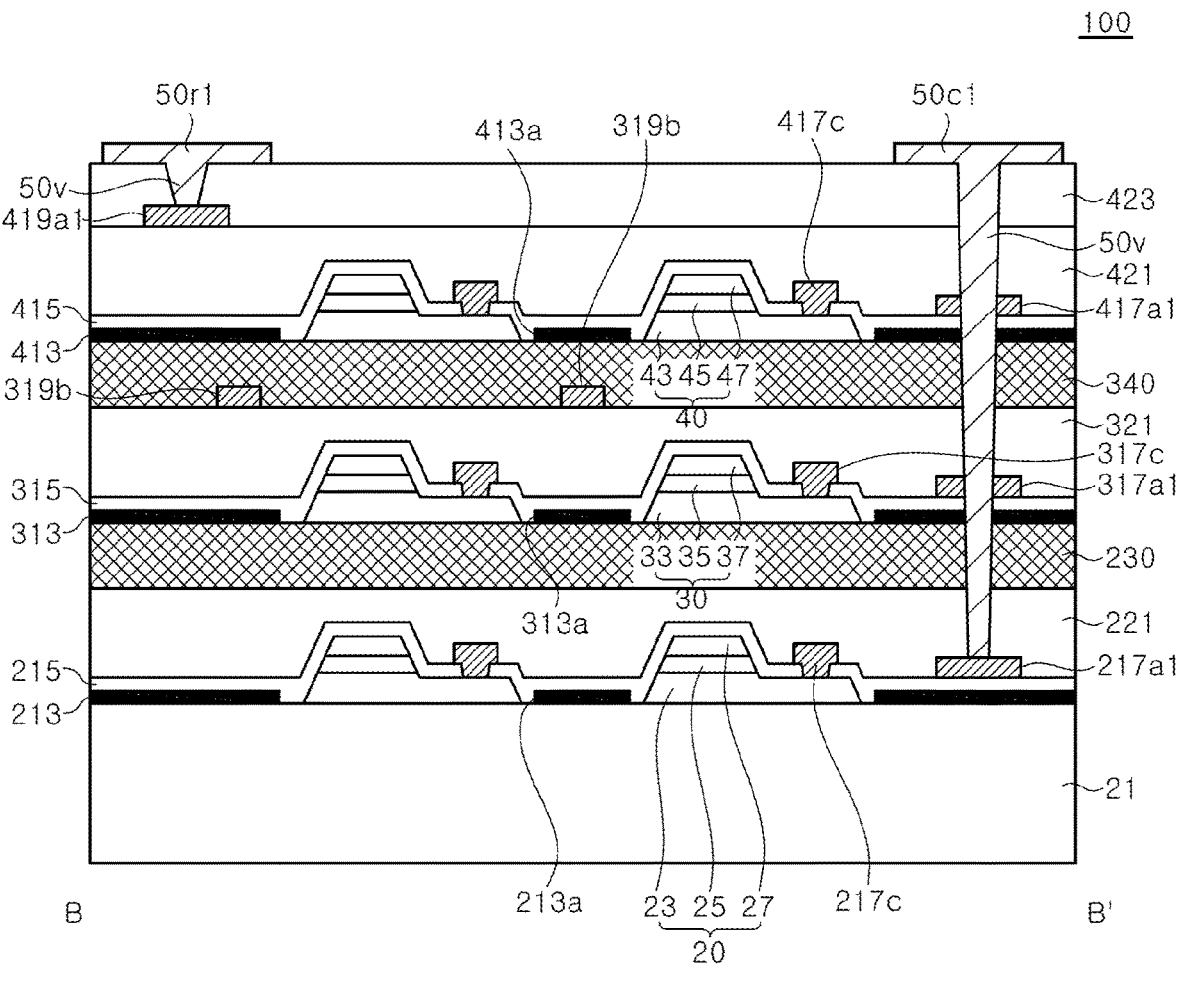
FIG. 2C is a schematic cross-sectional view taken along line B-B' of FIG. 2A.
Figure 3A:
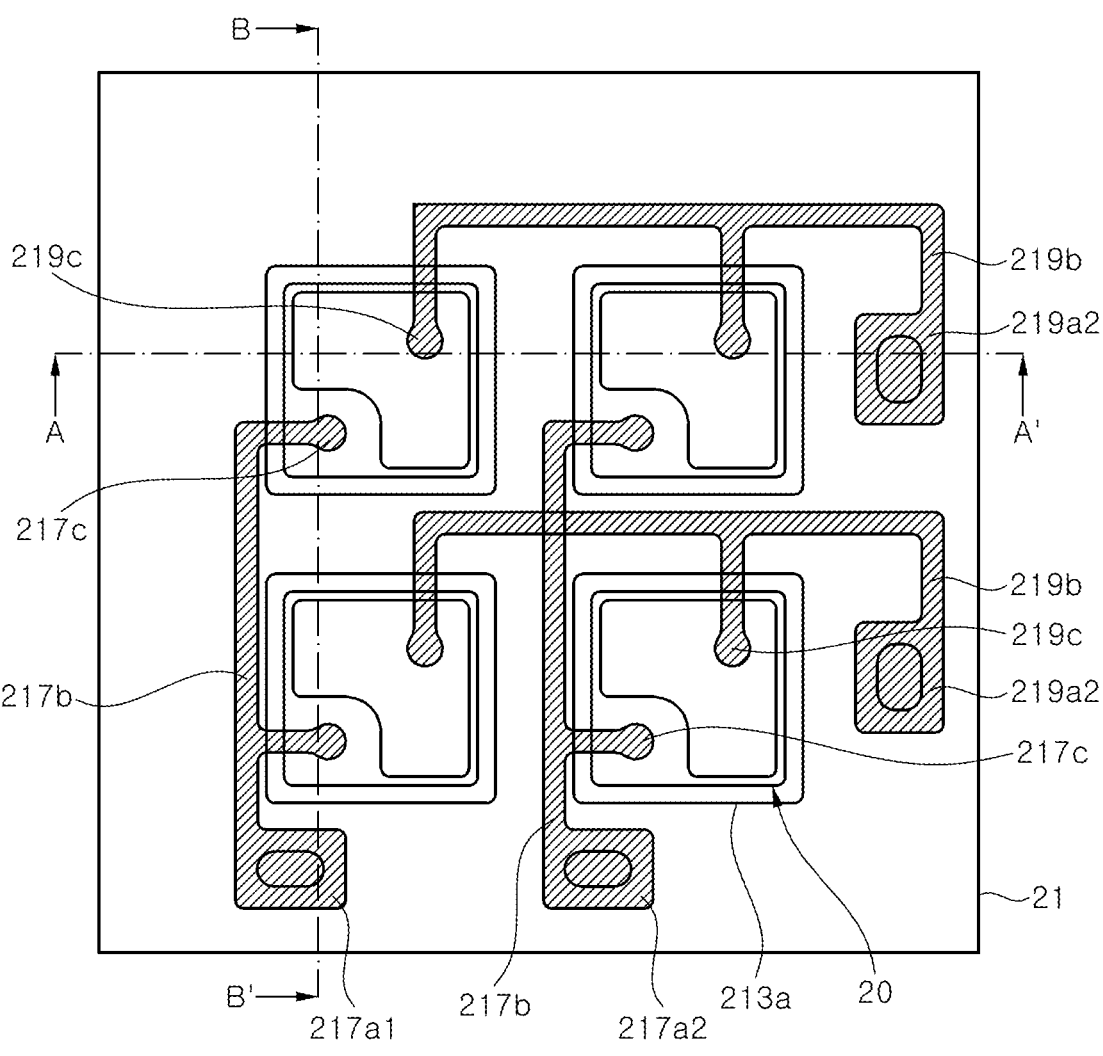
FIG. 3A is a schematic plan view illustrating a first floor of FIG. 2A.
Figure 3B:
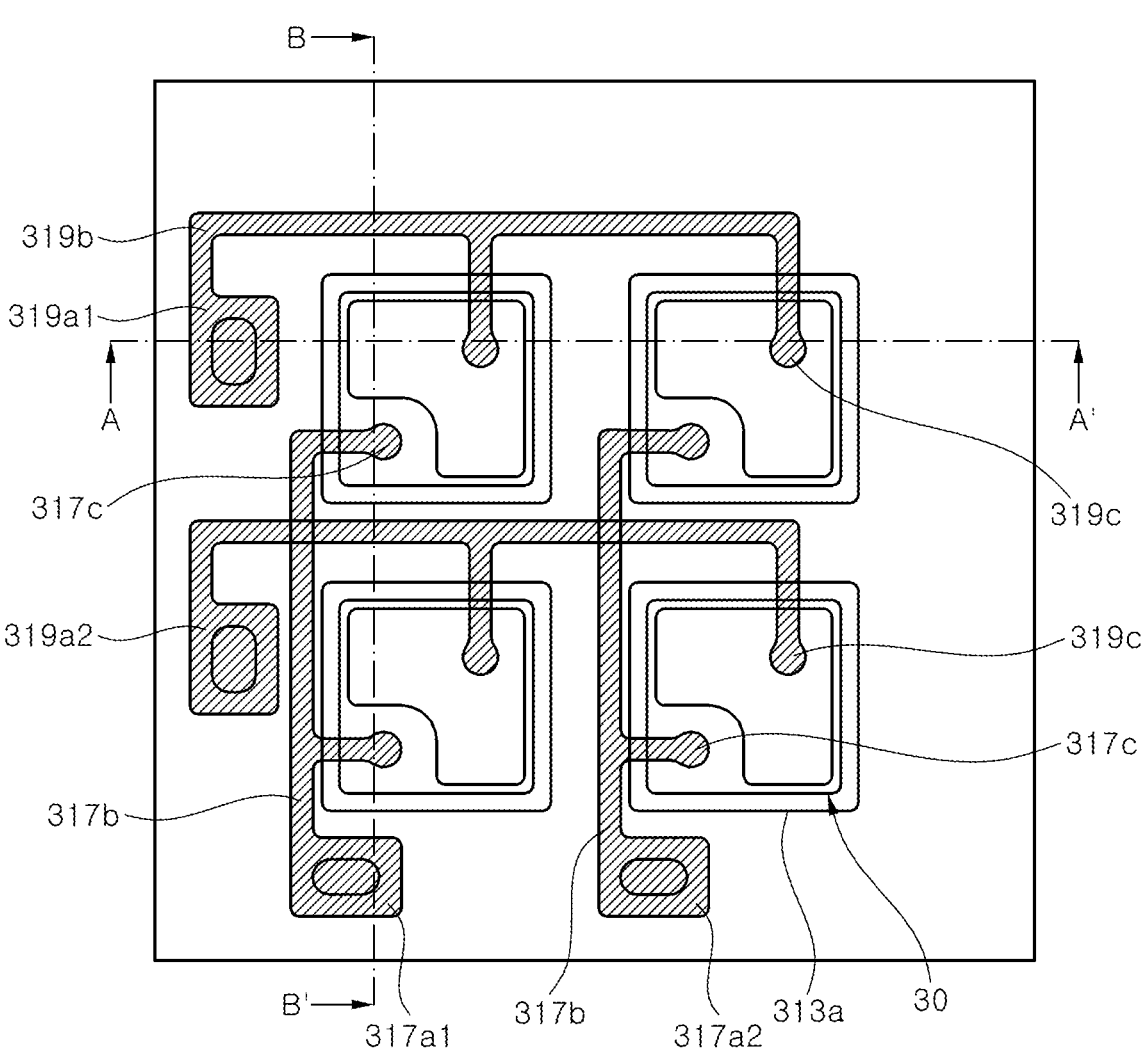
FIG. 3B is a schematic plan view illustrating a second floor of FIG. 2A.
Figure 3C:
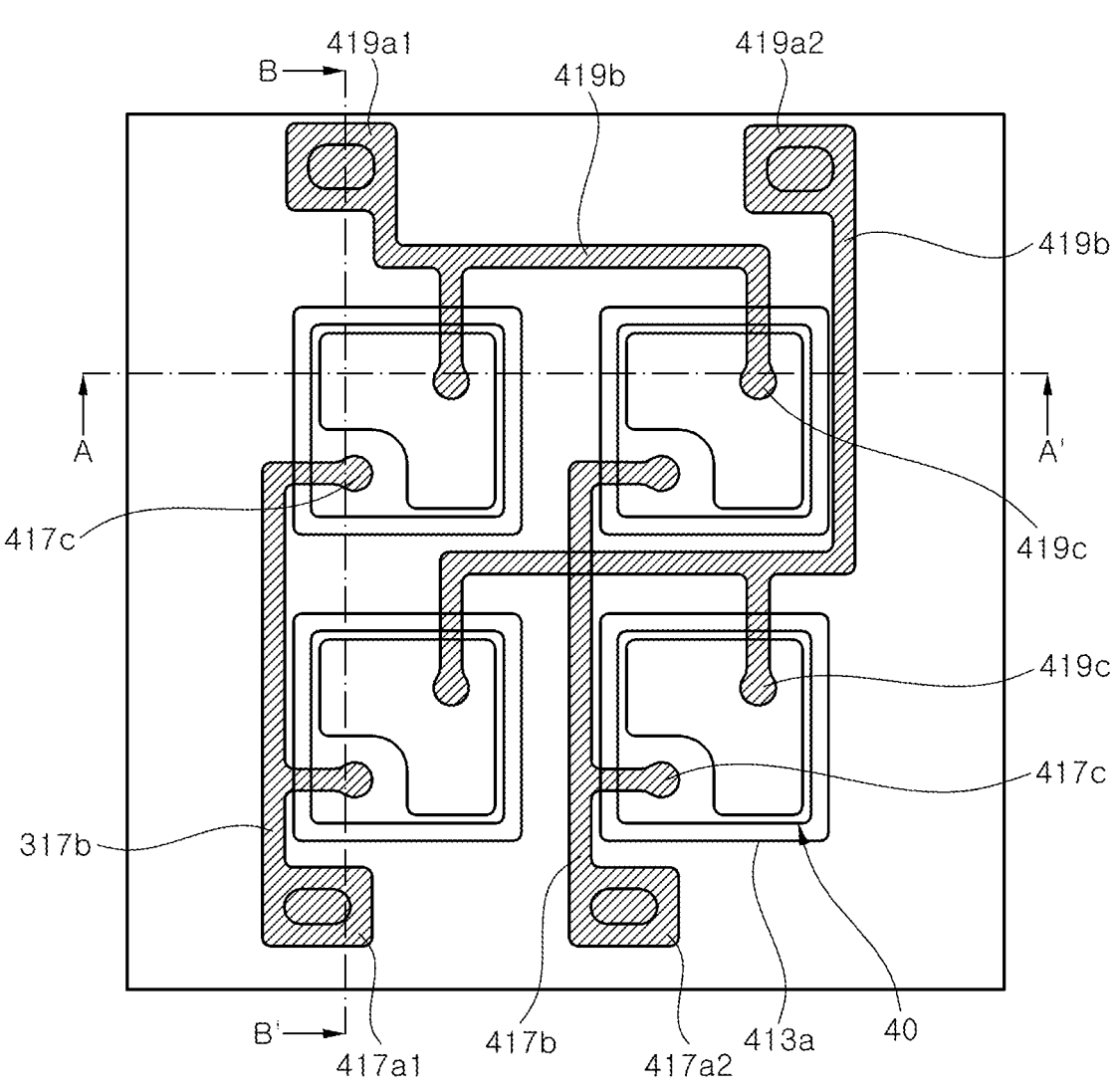
FIG. 3C is a schematic plan view illustrating a third floor of FIG. 2A.

FIG. 2A is a schematic plan view illustrating the pixel device 100 according to an exemplary embodiment, and FIGS. 2B and 2C are schematic cross-sectional views taken along lines A-A' and BB' of FIG. 2A, respectively. The pixel device includes a plurality of floors, and each of the floors is shown in FIGS. 3A, 3B and 3C. Herein, a pixel device including pixels arranged in a 2×2 matrix will be described as an example.

Referring to FIGS. 2A, 2B, and 2C, the pixel device 100 may include a substrate 21, light blocking layers 213, 313, and 413, insulation layers 215, 315, and 415, planarization layers 221, 321 and 421, lower and upper adhesive layers 230 and 340, LEDs 20, 30, and 40, first lower pads 217a1 and 217a2, first lower connection lines 217b, and first lower contacts 217c, first upper pads 219a1 and 219a2, first upper connection lines 219b, first upper contacts 219c, second lower pads 317a1 and 317a2, second lower connection lines 317b, second lower contacts 317c, second upper pads 319a1 and 319a2, second upper connection lines 319b, second upper contacts 319c, third lower pads 417a1 and 417a2, third lower connection lines 417b, third lower contacts 417c, third upper pads 419a1 and 419a2, third upper connection lines 419b, third upper contacts 419c, an upper insulation layer 423, connection vias 50v, and pixel device pads 50r1, 50r2, 50g1, 50g2, 50b1, 50b2, 50c1, and 50c2.

In particular, the pixel device 100 may include first through third floors disposed on the substrate 21, and these floors may be bonded through the adhesive layers 230 and 340, respectively. For example, the first floor includes the LEDs 20, the first lower pads 217*a*1 and 217*a*2, the first lower connection lines 217*b*, the first lower contacts 217*c*, the first upper pads 219*a*1 and 219*a*2, the first upper connection lines 219*b*, and the first upper contacts 219*c*. The second floor includes the LEDs 30, the second lower pads 317*a*1 and 317*a*2, the second lower connection lines 317*b*, the second lower contacts 317*c*, the second upper pads 319*a*1 and 319*a*2, the second upper connection lines 319*b*, and the second upper contacts 319*c*. The third floor includes the LEDs 40, the third lower pads 417*a*1 and 417*a*2, the third lower connection lines 417*b*, the third lower contacts 417*c*, the third upper pads 419*a*1 and 419*a*2, the third upper connection lines 419*b*, and the third upper contacts 419*c*.

The substrate 21 is a transparent substrate that transmits light generated in the pixels 20, 30, and 40, and may include a light-transmissive insulating material. In some exemplary embodiments, the substrate 21 may be translucent or partially transparent so as to transmit only light of a specific wavelength or only a portion of light of a specific wavelength. The substrate 21 may include glass, quartz, silicon, an organic polymer, or an organic-inorganic composite material, for example, silicon carbide (SiC), gallium nitride (GaN), indium gallium nitride (InGaN), aluminum gallium nitride (AlGaN), aluminum nitride (AlN), gallium oxide ($Ga_2O_3$) substrate, and the like. In some exemplary embodiments, the substrate 21 may be omitted.

(First Floor)

Referring to FIGS. 2A, 2B, 2C, and 3A, the LEDs 20 are arranged on the substrate 21. In this exemplary embodiment, it is described that four LEDs 20 are arranged, but the inventive concepts are not limited thereto. For example, in some exemplary embodiments, one LED 20 may be disposed on the substrate 21, or two or more LEDs 20 may be disposed on the substrate 21.

Each of the LEDs 20 includes a first conductivity type semiconductor layer 23, an active layer 25, and a second conductivity type semiconductor layer 27. The active layer 25 may be disposed between the first conductivity type semiconductor layer 23 and the second conductivity type semiconductor layer 27. The first conductivity type semiconductor layer 23 may be, for example, an n-type conductivity type semiconductor layer, and the second conductivity type semiconductor layer 27 may be a p-type conductivity type semiconductor layer, and vice versa. In an exemplary embodiment, the LED 20 may include a semiconductor material that emits blue light, such as GaN, InGaN, ZnSe, or the like, without being limited thereto. In another exemplary embodiment, the LED 20 may emit red or green light.

The LED 20 may be patterned such that a portion of the first conductivity type semiconductor layer 23 is exposed through the second conductivity type semiconductor layer 27 and the active layer 25. As shown in FIG. 2C, a portion of an upper surface of the first conductivity type semiconductor layer 23 is exposed. In this exemplary embodiment, it is shown that the second conductivity type semiconductor layer 27 and the active layer 25 are partially removed near an edge of the first conductivity type semiconductor layer 23, but the inventive concepts are not limited thereto. In some exemplary embodiments, a through hole passing through the second conductivity type semiconductor layer 27 and the active layer 25 may be formed to expose the first conductivity type semiconductor layer 23.

A light blocking layer 213 is disposed on the substrate 21. The light blocking layer 213 surrounds the LEDs 20 and defines a window region 213*a* through which light is emitted. The light blocking layer 20 may be formed of, for example, a black matrix, and may improve a contrast ratio by preventing cross-talk between the LEDs 20, 30, and 40 in the display apparatus 10000. In some exemplary embodiments, the light blocking layer 213 may be omitted.

The window region 213*a* through which light is emitted to the outside may be larger than or equal to a lower surface area of the LED 20. In an exemplary embodiment, the LED 20 may be in contact with the light blocking layer 213.

The insulation layer 215 covers the LEDs 20. Additionally, the insulation layer 215 may cover the light blocking layer 213. The insulation layer 215 may be formed of a light-transmitting material. For example, the insulation layer 215 may include silicon oxide such as $SiO_2$, silicon nitride such as $Si_3N_4$, or silicon oxynitride.

The insulation layer 215 may be patterned so as to allow electrical connection to the first conductivity type semiconductor layer 23 and the second conductivity type semiconductor layer 27. For example, the insulation layer 215 may have openings exposing the first conductivity type semiconductor layer 23 and the second conductivity type semiconductor layer 27. In some exemplary embodiments, a transparent electrode may be formed on the second conductivity type semiconductor layer 27, and in this case, the opening of the insulation layer 215 may expose the transparent electrode.

The first lower pads 217*a*1 and 217*a*2, the first lower connection lines 217*b*, and the first lower contacts 217*c* are formed on the insulation layer 215. The first lower contacts 217*c* are electrically connected to the first conductivity type semiconductor layer 23 of the LEDs 20. The first lower contact 217*c* may be connected to the first conductivity type semiconductor layer 23 through the opening of the insulation layer 215. Since the first lower contacts 217*c* are disposed on the LEDs 20, respectively, the number of first lower contacts 217*c* is at least equal to the number of the LEDs 20.

The first lower pads 217*a*1 and 217*a*2 may be spaced apart from the LEDs 20 in a lateral direction and disposed on the insulation layer 215. In an exemplary embodiment, both of the first lower pads 217*a*1 and 217*a*2 are spaced apart from the LEDs 20 and disposed near one side (lower side) of the substrate 21, as shown in FIG. 3A. However, the inventive concepts are not limited thereto, and at least one of the first lower pads 217*a*1 and 217*a*2 may be disposed in a region between the LEDs 20. In an exemplary embodiment, the first lower pads 217*a*1 and 217*a*2 may be disposed at least as many as the number of columns of the LEDs 20. In this exemplary embodiment, since the LEDs 20 are disposed in two rows, two first lower pads 217*a*1 and 217*a*2 are disposed.

The first lower connection lines 217*b* connect the first lower contacts 217*c* to the first lower pads 217*a*1 and 217*a*2. As shown in FIG. 3A, the first lower connection lines 217*b* may electrically connect the first lower contacts 217*c* on the LEDs 20 disposed in the same column to the first lower pad 217*a*1 or 217*a*2. More particularly, one first lower connection line 217*b* connects the first lower contacts 217*c* disposed in a first column to the first lower pad 217*a*1, and another first lower connection line 217*b* connects the first lower contacts 217*c* disposed in a second column to the first lower pad 217*a*2. The first lower connection lines 217*b* may be provided in the same number as those of the first lower pads 217*a*1 and 217*a*2.

The planarization layer 221 covers the LEDs 20, the insulation layer 215, the first lower pads 217*a*1 and 217*a*2, the first lower contacts 217*c*, and the first lower connection lines 217b. The planarization layer 221 may cover a surface morphology formed by the LEDs 20 to provide a flat upper surface. The planarization layer 221 may be formed of a light-transmitting insulating material, such as polyimide (PI) or epoxy molding compound (EMC).

The first upper pads 219a1 and 219a2, the first upper connection lines 219b, and the first upper contacts 219c are formed on the planarization layer 221. The first upper contacts 219c are electrically connected to the second conductivity type semiconductor layers 27 of the LEDs 20. The first upper contact 219c may be electrically connected to the second conductivity type semiconductor layers 27 through the planarization layer 221 and the insulation layer 215. Since the first upper contacts 219c are disposed on the LEDs 20, respectively, the number of first upper contacts 219c is at least equal to the number of the LEDs 20.

The first upper pads 219a1 and 219a2 may be spaced apart from the LEDs 20 in the lateral direction and disposed on the planarization layer 221. Also, the first upper pads 219a1 and 219a2 are spaced apart from the first lower pads 217a1 and 217a2 in the lateral direction. More particularly, the first upper pads 219a1 and 219a2 are disposed on the planarization layer 221 so as not to overlap the first lower pads 217a1 and 217a2. In an exemplary embodiment, both of the first upper pads 219a1 and 219a2 may be spaced apart from the LEDs 20 and disposed near one side (right side) of the substrate 21, as shown in FIG. 3A. However, the inventive concepts are not limited thereto, and in some exemplary embodiments, at least one of the first upper pads 219a1 and 219a2 may be disposed in the region between the LEDs 20. In exemplary an embodiment, the first upper pads 217a1 and 217a2 may be disposed at least as many as the number of rows of the LEDs 20. In this exemplary embodiment, since the LEDs 20 are disposed in two rows, two first upper pads 219a1 and 219a2 are disposed.

The first upper connection lines 219b connect the first upper contacts 219c to the first upper pads 219a1 and 219a2. As shown in FIG. 3A, the first upper connection lines 219b may connect the first upper contacts 219c on the LEDs 20 arranged in the same row to the first upper pad 219a1 or 219a2. More particularly, one first upper connection line 219b connects the first upper contacts 219c disposed in a first row to the first upper pad 219a1, and another first upper connection line 219b connects the first upper contacts 219c disposed in a second row to the first upper pad 219a2. The first upper connection lines 219b may be provided in a same number as those of the first upper pads 219a1 and 219a2.

In this exemplary embodiment, the first lower pads 217a1 and 217a2 are illustrated and described as being disposed between the insulation layer 215 and the planarization layer 221, but the inventive concepts are not limited thereto. For example, in some exemplary embodiments, the first lower pads 217a1 and 217a2, the first lower contacts 217c, and the first lower connection lines 217b may be disposed on the planarization layer 221, and the first lower contacts 217c may be electrically connected to the first conductivity type semiconductor layer 23 through the planarization layer 221 and the insulation layer 215. In another exemplary embodiment, in addition to the first lower pads 217a1 and 217a2 disposed on the insulation layer 215, additional pads electrically connected to the first lower pads 217a1 and 217a2 may be provided on the planarization layer 221.

(Second Floor)

The second floor may include the LEDs 30, the light blocking layer 313, the insulation layer 315, the second lower contacts 317c, the second lower pads 317a1 and 317a2, the second lower connection lines 317b, the planarization layer 321, the second upper contacts 319c, the second upper pads 319a1 and 319a2, and the second upper connection lines 319b. The second floor may be attached to the first floor by the lower adhesive layer 230.

The lower adhesive layer 230 covers the first upper contacts 219c, the first upper pads 219a1 and 219a2, the first upper connection lines 219b, and the planarization layer 221. The lower adhesive layer 230 may include an optically clear adhesive (OCA), which, for example, may include epoxy, polyimide, SU8, spin-on-glass (SOG), benzocyclobutene (BCB), without being limited thereto.

The LEDs 30 may be attached to the lower adhesive layer 230. In this exemplary embodiment, it is described that four LEDs 30 are arranged, but the inventive concepts are not limited thereto. The LEDs 30 may be arranged in a same number as that of the LEDs 20, and may be arranged such that at least a portion of a light emitting region overlaps the LEDs 20.

Each of the LEDs 30 includes a first conductivity type semiconductor layer 33, an active layer 35, and a second conductivity type semiconductor layer 37. The active layer 35 may be disposed between the first conductivity type semiconductor layer 33 and the second conductivity type semiconductor layer 37. The first conductivity type semiconductor layer 33 may be, for example, an n-type conductivity type semiconductor layer, and the second conductivity type semiconductor layer 37 may be a p-type conductivity type semiconductor layer, and vice versa. In an exemplary embodiment, the LED 30 may include a semiconductor material that emits green light, such as GaN, InGaN, GaP, AlGaInP, AlGaP, or the like, without being limited thereto. In some exemplary embodiments, the LED 30 may emit red or blue light.

The LED 30 may be patterned such that a portion of the first conductivity type semiconductor layer 33 is exposed through the second conductivity type semiconductor layer 37 and the active layer 35. As shown in FIG. 2C, a portion of an upper surface of the first conductivity type semiconductor layer 33 is exposed. In this exemplary embodiment, it is shown that the second conductivity type semiconductor layer 37 and the active layer 35 are partially removed near an edge of the first conductivity type semiconductor layer 33, but the inventive concepts are not limited thereto. In some exemplary embodiments, a through hole passing through the second conductivity type semiconductor layer 37 and the active layer 35 may be formed to expose the first conductivity type semiconductor layer 33.

The light blocking layer 313 is disposed on the lower adhesive layer 230. The light blocking layer 313 surrounds the LEDs 30 and defines a window region 313a through which light is emitted. The light blocking layer 313 may be formed of, for example, a black matrix, and may improve a contrast ratio by preventing cross-talk between the LEDs 20, 30, and 40 in the display apparatus 10000. In some exemplary embodiments, the light blocking layer 313 may be omitted.

The window region 313a formed by the light blocking layer 313 may be larger than or equal to a lower surface area of the LED 30. In an exemplary embodiment, the LED 30 may be in contact with the light blocking layer 313.

The insulation layer 315 covers the LEDs 30. The insulation layer 315 may also cover the light blocking layer 313. The insulation layer 315 may be formed of a light-transmitting material. For example, the insulation layer 315 may include silicon oxide such as $SiO_2$, silicon nitride such as $Si_3N_4$, or silicon oxynitride.

The insulation layer 315 may be patterned so as to allow electrical connection to the first conductivity type semiconductor layer 33 and the second conductivity type semiconductor layer 37. For example, the insulation layer 315 may have openings exposing the first conductivity type semiconductor layer 33 and the second conductivity type semiconductor layer 37. In some exemplary embodiments, a transparent electrode may be formed on the second conductivity type semiconductor layer 37, and in this case, the opening of the insulation layer 315 may expose the transparent electrode.

The second lower pads 317a1 and 317a2, the second lower connection lines 317b, and the second lower contacts 317c are formed on the insulation layer 315. The second lower contacts 317c are electrically connected to the first conductivity type semiconductor layer 33 of the LEDs 30. The second lower contact 317c may be connected to the first conductivity type semiconductor layer 33 through the opening of the insulation layer 315. Since the second lower contacts 317c are disposed on the LEDs 30, respectively, the number of second lower contacts 317c is at least equal to the number of the LEDs 30.

The second lower pads 317a1 and 317a2 may be spaced apart from the LEDs 30 in the lateral direction and disposed on the insulation layer 315. In an exemplary embodiment, the second lower pads 317a1 and 317a2 may be disposed so as to overlap the first lower pads 217a1 and 217a2, respectively. For example, both of the second lower pads 317a1 and 317a2 may be spaced apart from the LEDs 30 and disposed near one side (lower side) of the substrate 21, as shown in FIG. 3B. However, the inventive concepts are not limited thereto, and at least one of the second lower pads 317a1 and 317a2 may be disposed in a region between the LEDs 30. Also, the second lower pads 317a1 and 317a2 may be laterally spaced apart from the first lower pads 217a1 and 217a2 so as to partially overlap, or so as not to overlap the first lower pads 217a1 and 217a2. In an exemplary embodiment, the second lower pads 317a1 and 317a2 may be disposed at least as many as the number of columns of the LEDs 30. In this exemplary embodiment, since the LEDs 30 are disposed in two rows, two second lower pads 317a1 and 317a2 are disposed.

The second lower connection lines 317b electrically connect the second lower contacts 317c to the second lower pads 317a1 and 317a2. As shown in FIG. 3A, the second lower connection lines 317b may connect the second lower contacts 317c on the LEDs 30 disposed in the same column to the second lower pad 317a1 or 317a2. More particularly, one second lower connection line 317b connects the second lower contacts 317c disposed in a first column to the second lower pad 317a1, and another second lower connection line 317b connects the second lower contacts 317c disposed in a second column to the second lower pad 317a2. The second lower connection lines 317b may be provided in a same number as those of the second lower pads 317a1 and 317a2.

The planarization layer 321 covers the LEDs 30, the insulation layer 315, the second lower pads 317a1 and 317a2, the second lower contacts 317c, and the second lower connection lines 317b. The planarization layer 321 may cover a surface morphology formed by the LEDs 30 to provide a flat upper surface. The planarization layer 321 may be formed of a light-transmitting insulating material, such as polyimide (PI) or epoxy molding compound (EMC).

The second upper pads 319a1 and 319a2, the second upper connection lines 319b, and the second upper contacts 319c are formed on the planarization layer 321. The second upper contacts 319c are electrically connected to the second conductivity type semiconductor layers 37 of the LEDs 30. The second upper contact 319c may be electrically connected to the second conductivity type semiconductor layers 37 through the planarization layer 321 and the insulation layer 315. Since the second upper contacts 319c are disposed on the LEDs 30, respectively, the number of second upper contacts 319c is at least equal to the number of the LEDs 30.

The second upper pads 319a1 and 319a2 may be spaced apart from the LEDs 30 in the lateral direction and disposed on the planarization layer 321. Also, the second upper pads 319a1 and 319a2 are spaced apart from the second lower pads 317a1 and 317a2 in the lateral direction. Furthermore, the second upper pads 319a1 and 319a2 may be spaced apart from the first upper pads 219a1 and 219a2 in the lateral direction. More particularly, the second upper pads 319a1 and 319a2 may be disposed on the planarization layer 321 so as not to overlap the first lower pads 217a1 and 217a2, the first upper pads 219a1 and 219a2, and the second lower pads 317a1 and 317a2. In an exemplary embodiment, both of the second upper pads 319a1 and 319a2 may be spaced apart from the LEDs 30 and disposed near one side (left side) of the substrate 21, as shown in FIG. 3B. However, the inventive concepts are not limited thereto, and in some exemplary embodiments, at least one of the second upper pads 319a1 and 319a2 may be disposed in the region between the LEDs 30. In an exemplary embodiment, the second upper pads 317a1 and 317a2 may be disposed at least as many as the number of rows of the LEDs 30. In this exemplary embodiment, since the LEDs 30 are disposed in two rows, two second upper pads 319a1 and 319a2 are disposed.

The second upper connection lines 319b electrically connect the second upper contacts 319c to the second upper pads 319a1 and 319a2. As shown in FIG. 3B, the second upper connection lines 319b may connect the second upper contacts 319c on the LEDs 30 disposed in the same row to the second upper pad 319a1 or 319a2. More particularly, one second upper connection line 319b connects the second upper contacts 319c disposed in a first row to the second upper pad 319a1, and another second upper connection line 319b connects the second upper contacts 319c disposed in a second row to the second upper pad 319a2. The second upper connection lines 319b may be provided in a same number as those of the second upper pads 319a1 and 319a2.

In this exemplary embodiment, the second lower pads 317a1 and 317a2 are illustrated and described as being disposed between the insulation layer 315 and the planarization layer 321, but the inventive concepts are not limited thereto. For example, the second lower pads 317a1 and 317a2, the second lower contacts 317c, and the second lower connection lines 317b may be disposed on the planarization layer 321, and the second lower contacts 317c may be electrically connected to the first conductivity type semiconductor layer 33 through the planarization layer 321 and the insulation layer 315. In another exemplary embodiment, in addition to the second lower pads 317a1 and 317a2 disposed on the insulation layer 315, additional pads electrically connected to the second lower pads 317a1 and 317a2 may be provided on the planarization layer 321.

(Third Floor)

The third floor may include the LEDs 40, the light blocking layer 413, the insulation layer 415, the third lower contacts 417c, the third lower pads 417a1 and 417a2, and the third lower connection lines 417b, the planarization layer 421, the third upper contacts 419c, the third upper pads 419a1 and 419a2, and the third upper connection lines 419b. The third floor may be attached to the second floor by the upper adhesive layer 340.

The upper adhesive layer 340 covers the second upper contacts 319c, the second upper pads 319a1 and 319a2, the second upper connection lines 319b, and the planarization layer 321. The upper adhesive layer 340 may include an optically clear adhesive (OCA), for example, epoxy, polyimide, SU8, spin-on-glass (SOG), or benzocyclobutene (BCB), without being limited thereto.

The LEDs 40 may be attached to the upper adhesive layer 340. In this exemplary embodiment, it is described that four LEDs 40 are arranged, but the inventive concepts are not limited thereto. The LEDs 30 may be disposed in a same number as that of the LEDs 20, and may be disposed so as to overlap the LEDs 20. In this manner, one pixel is provided by the LEDs 20, 30, and 40 overlapping one another.

Each of the LEDs 40 includes a first conductivity type semiconductor layer 43, an active layer 45, and a second conductivity type semiconductor layer 47. The active layer 45 may be disposed between the first conductivity type semiconductor layer 43 and the second conductivity type semiconductor layer 47. The first conductivity type semiconductor layer 43 may be, for example, an n-type conductivity type semiconductor layer, and the second conductivity type semiconductor layer 47 may be a p-type conductivity type semiconductor layer, and vice versa. In an exemplary embodiment, the LED 40 may include a semiconductor material that emits red light, such as AlGaAs, GaAsP, AlGaInP, and GaP, without being limited thereto. In some exemplary embodiments, the LED 40 may emit blue or green light based on a nitride semiconductor.

The LED 40 may be patterned such that a portion of the first conductivity type semiconductor layer 43 is exposed through the second conductivity type semiconductor layer 47 and the active layer 45. As shown in FIG. 2C, a portion of an upper surface of the first conductivity type semiconductor layer 43 is exposed. In this exemplary embodiment, it is shown that the second conductivity type semiconductor layer 47 and the active layer 45 are partially removed near an edge of the first conductivity type semiconductor layer 43, but the inventive concepts are not limited thereto. In some exemplary embodiments, a through hole passing through the second conductivity type semiconductor layer 47 and the active layer 45 may be formed to expose the first conductivity type semiconductor layer 43.

The light blocking layer 413 is disposed on the upper adhesive layer 340. The light blocking layer 413 surrounds the LEDs 40 and defines a window region 413a through which light is emitted. The light blocking layer 413 may be formed of, for example, a black matrix, and may improve a contrast ratio by preventing cross-talk between the LEDs 20, 30, and in the display apparatus 10000. In some exemplary embodiments, the light blocking layer 343 may be omitted.

The window region 413a formed by the light blocking layer 413 may be larger than or equal to a lower surface area of the LED 40. In an exemplary embodiment, the LED 40 may be in contact with the light blocking layer 413.

The insulation layer 415 covers the LEDs 40. The insulation layer 415 may also cover the light blocking layer 413. The insulation layer 415 may be formed of a light-transmitting material. For example, the insulation layer 415 may include silicon oxide, such as $SiO_2$, silicon nitride such as $Si_3N_4$, or silicon oxynitride.

The insulation layer 415 may be patterned so as to allow electrical connection to the first conductivity type semiconductor layer 43 and the second conductivity type semiconductor layer 47. For example, the insulation layer 415 may have openings exposing the first conductivity type semiconductor layer 43 and the second conductivity type semiconductor layer 47. In some exemplary embodiments, a transparent electrode may be formed on the second conductivity type semiconductor layer 47, and in this case, the opening of the insulation layer 415 may expose the transparent electrode.

The third lower pads 417a1 and 417a2, the third lower connection lines 417b, and the third lower contacts 417c are formed on the insulation layer 415. The third lower contacts 417c are electrically connected to the first conductivity type semiconductor layer 43 of the LEDs 40. The third lower contact 417c may be connected to the first conductivity type semiconductor layer 43 through the opening of the insulation layer 415. Since the third lower contacts 417c are disposed on the LEDs 40, respectively, the number of the third lower contacts 417c is at least equal to the number of the LEDs 40.

The third lower pads 417a1 and 417a2 may be spaced apart from the LEDs 40 in the lateral direction and disposed on the insulation layer 415. In an exemplary embodiment, the third lower pads 417a1 and 417a2 may be disposed so as to overlap the first lower pads 217a1 and 217a2, respectively. For example, each of the third lower pads 417a1 and 417a2 may be spaced apart from the LEDs 40 and disposed near one side (lower side) of the substrate 21, as shown in FIG. 3C. However, the inventive concepts are not limited thereto, and at least one of the third lower pads 417a1 and 417a2 may be disposed in a region between the LEDs 40. In addition, the third lower pads 417a1 and 417a2 may be laterally spaced apart from the first lower pads 217a1 and 217a2 so as to partially overlap or so as not to overlap the first lower pads 217a1 and 217a2. In an exemplary embodiment, the third lower pads 417a1 and 417a2 may be disposed at least as many as the number of columns of the LEDs 40. In this exemplary embodiment, since the LEDs 40 are disposed in two rows, two second lower pads 417a1 and 417a2 are disposed.

The third lower connection lines 417b electrically connect the third lower contacts 417c to the third lower pads 417a1 and 417a2. As shown in FIG. 3C, the third lower connection lines 417b may connect the third lower contacts 417c on the LEDs 40 disposed in the same column to the third lower pad 417a1 or 417a2. More particularly, one third lower connection line 417b connects the third lower contacts 417c disposed in a first column to the third lower pad 417a1, and another third lower connection line 417b connects the third lower contacts 417c disposed in a second column to the third lower pad 417a2. The third lower connection lines 417b may be provided in a same number as that of the third lower pads 417a1 and 417a2.

The planarization layer 421 covers the LEDs 40, the insulation layer 415, the third lower pads 417a1 and 417a2, the third lower contacts 417c, and the third lower connection lines 417b. The planarization layer 421 may cover a surface morphology formed by the LEDs 40 to provide a flat upper surface. The planarization layer 421 may be formed of a light-transmitting insulating material, such as polyimide (PI) or epoxy molding compound (EMC).

The third upper pads 419a1 and 419a2, the third upper connection lines 419b, and the third upper contacts 419c are formed on the planarization layer 421. The third upper contacts 419c are electrically connected to the second conductivity type semiconductor layers 47 of the LEDs 40. The third upper contact 419c may be electrically connected to the second conductivity type semiconductor layers 47 through the planarization layer 421 and the insulation layer 415. Since the third upper contacts 419c are disposed on the LEDs 40, respectively, the number of fourth upper contacts 419c is at least equal to the number of the LEDs 40.

The third upper pads 419a1 and 419a2 may be spaced apart from the LEDs 40 in the lateral direction and disposed on the planarization layer 421. However, the inventive concepts are not limited thereto. In some exemplary embodiments, the third upper pads 419a1 and 419a2 may be disposed so as to overlap the LEDs 40. Also, the third upper pads 419a1 and 419a2 are spaced apart from the third lower pads 417a1 and 417a2 in the lateral direction. Furthermore, the third upper pads 419a1 and 419a2 may be spaced apart from the first upper pads 219a1 and 219a2 and the second upper pads 319a1 and 319a2 in the lateral direction. More particularly, the third upper pads 419a1 and 419a2 may be disposed on the planarization layer 421 so as not to overlap the first through third lower pads 217a1, 217a2, 317a1, 317a2, 417a1, and 417a2, the first and second upper pads 219a1, 219a2, 319a1, and 319a2. In an exemplary embodiment, both of the third upper pads 419a1 and 419a2 may be spaced apart from the LEDs 40 and disposed near one side (upper side) of the substrate 21, as shown in FIG. 3C. However, the inventive concepts are not limited thereto, and in some exemplary embodiments, at least one of the third upper pads 419a1 and 419a2 may be disposed in the region between the LEDs 40. In an exemplary embodiment, the third upper pads 417a1 and 417a2 may be disposed at least as many as the number of rows of the LEDs 40. In this exemplary embodiment, since the LEDs 40 are disposed in two rows, two third upper pads 419a1 and 419a2 are disposed.

The third upper connection lines 419b electrically connect the third upper contacts 419c to the third upper pads 419a1 and 419a2. As shown in FIG. 3C, the third upper connection lines 419b may electrically connect the third upper contacts 419c on the LEDs 40 arranged in the same row to the same third upper pad 419a1 or 419a2. More particularly, one third upper connection line 419b connects the third upper contacts 419c disposed in a first row to the third upper pad 419a1, and another third upper connection line 419b connects the third upper contacts 419c disposed in a second row to the third upper pad 419a2. The third upper connection lines 419b may be provided in a same number as those of the third upper pads 419a1 and 419a2.

In this exemplary embodiment, the third lower pads 417a1 and 417a2 are illustrated and described as being disposed between the insulation layer 415 and the planarization layer 421, but the inventive concepts are not limited thereto. For example, the third lower pads 417a1 and 417a2, the third lower contacts 417c, and the third lower connection lines 417b may be disposed on the planarization layer 421, and the third lower contacts 417c may be electrically connected to the first conductivity type semiconductor layer 43 through the planarization layer 421 and the insulation layer 415. In another exemplary embodiment, in addition to the third lower pads 417a1 and 417a2 disposed on the insulation layer 415, additional layers electrically connected to the third lower pads 417a1 and 417a2 may be provided on the planarization layer 421.

(Pixel Device Pad)

The upper insulation layer 423 and the pixel device pads 50r1, 50r2, 50g1, 50g2, 50b1, 50b2, 50c1, and 50c2 may be disposed on the third floor.

The upper insulation layer 423 may include, for example, an organic material such as polyimide, or an epoxy molding compound or an inorganic material such as $SiO_2$, $Si_3N_4$, or SiON. Furthermore, the upper insulation layer 423 may include a distributed Bragg reflector. The upper insulation layer 423 covers the planarization layer 421, the third upper contact 419c, the third upper pads 419a1 and 419a2, and the third upper connection lines 419b.

The pixel device pads 50r1, 50r2, 50g1, 50g2, 50b1, 50b2, 501, and 50c2 may be disposed on the upper insulation layer 423. The pixel device pads 50r1, 50r2, 50g1, 50g2, 50b1, 50b2, 50c1, and 50c2 may be electrically connected to the first through third lower pads 217a1, 217a2, 317a1, 317a2, 417a1, and 417a2 and the first through third upper pads 219a1, 219a2, 319a1, 319a2, 419a1, and 419a2 through the connection vias 50v.

In this exemplary embodiment, the connection vias 50v are laterally or vertically spaced apart from the LEDs 20, 30, and 40. Moreover, the connection vias 50v may be laterally spaced apart from the LEDs 20, 30, and 40 so as not to overlap the LEDs 20, 30, and 40. Accordingly, during the process of forming the connection vias 50v, the LEDs 20, 30, and 40 may not be subject to etching, and electrical connection is made possible by penetrating through a plurality of insulation materials.

The pixel device pads 50r1 and 50r2 may be electrically connected to the third upper pads 419a1 and 419a2 through the connection vias 50v passing through the upper insulation layer 423, respectively. The pixel device pads 50g1 and 50g2 may be electrically connected to the second upper pads 319a1 and 319a2 through the connection vias 50v passing through the upper insulation layer 423, the planarization layer 421, and the upper adhesive layer 340, respectively. In addition, the pixel device pads 50b1 and 50b2 may be electrically connected to the first upper pads 219a1 and 219a2 through the connection vias 50v passing through the upper insulation layer 423, the planarization layer 421, the upper adhesive layer 340, the planarization layer 321, and the lower adhesive layer 230, respectively.

Meanwhile, the pixel device pad 50c1 is commonly electrically connected to the first through third lower pads 217a1, 317a1, and 417a1 through the connection via 50v, and the pixel device pad 50c2 is commonly electrically connected to the third lower pads 217a2, 317a2, and 417a2 through the connection via 50v. As shown in FIG. 2C, when the first lower pad 217a1 or 217a2, the second lower pad 317a1 or 317a2, and the third lower pad 417a1 or 417a2 overlap one another, the connection via 50v may pass through the third lower pad 417a1 or 417a2 and the second lower pad 317a1 or 317a2. In another exemplary embodiment, the first lower pad 217a1 or 217a2, the second lower pad 317a1 or 317a2, and the third lower pad 417a1 or 417a2 may be disposed so as not to overlap one another, and the pixel device pad 50c1 or 50c2 may be commonly electrically connected to the first lower pad 217a1 or 217a2, the second lower pad 317a1 or 317a2, and the third lower pad 417a1 or 417a2 through a plurality of connection vias spaced apart from one another.

In this exemplary embodiment, it is described that LEDs 20 emit blue light and LEDs 30 emit green light, but the inventive concepts are not limited thereto. In some exemplary embodiments, the LEDs 20 may emit green light, and the LEDs 30 may emit blue light. The pixel device 100 may be flip-bonded to the circuit board 1001 using the pixel device pads 50r1, 50r2, 50g1, 50g2, 50b1, 50b2, 50c1, and 50c2, and light emitted from the LEDs 20, 30, and 40 may be emitted over the circuit board 1001.

In this exemplary embodiment, the LEDs 20, 30, and 40 are vertically stacked one above another to constitute a pixel. Each of the LEDs 20, 30, and 40 constitutes a sub-pixel. The LEDs 20, 30, and 40 are disposed on the first through third floors, respectively, and the lower pads 217$a$1, 217$a$2; 317$a$1, 317$a$2; 417$a$1, 417$a$2 and the upper pads 219$a$1, 219$a$2; 319$a$1, 319$a$2; 419$a$1, 419$a$2 connected to the LEDs 20, 30, and 40 are also disposed on corresponding floors. Each of the floors is manufactured through different processes and thereafter, attached to one another using the lower and upper adhesive layers 230 and 340. Accordingly, before bonding the floors, electrical and/or optical characteristics of the LEDs 20, 30, or 40 in each of the floors may be evaluated to select any defective LEDs, and repair may be performed for each of the floors. As such, the defective LEDs may be easily repaired, and as a result, a process yield of the pixel device may be improved.

In this exemplary embodiment, the pixel device 100 in which four pixels each including vertically stacked LEDs 20, 30, and 40 are arranged has been exemplarily described. When four pixels are arranged, the pixels may be individually driven using at least eight pixel device pads 50$r$1, 50$r$2, 50$g$1, 50$g$2, 50$b$1, 50$b$2, 50$c$1, and 50$c$2. Meanwhile, the inventive concepts are not limited to a particular number of pixels. For example, the pixel device 100 may include pixels arranged in n rows and m columns of positive integers. In this case, for example, anodes (e.g., second conductivity type semiconductor layers) of the LEDs 20, 30, or 40 disposed on the same floor and in the same row may be commonly connected to the same pixel device pad, respectively, and cathodes (e.g., first conductivity type semiconductor layers) of the LEDs 20, 30, and 40 disposed in the same column may be commonly connected to the same pixel device pad. Since the LEDs 20, 30, and 40 are disposed on three different floors, respectively, the anodes of the LEDs 20, 30, and 40 disposed on the same row are connected to three different pixel device pads, and the cathodes of the LEDs 20, 30, and 40 arranged in the same column are commonly connected to one pixel device pad. Accordingly, pixels arranged in an n×m matrix may be individually driven with only a minimum of (3×n+m) pixel device pads.

In this exemplary embodiment, the cathodes of the LEDs 20, 30, and 40 disposed on different floors are described as being commonly electrically connected to one another, and vice versa. More particularly, cathodes (e.g., first conductivity type semiconductor layers) of the LEDs 20, 30, or 40 disposed on the same floor and in the same row may be commonly connected to the same pixel device pad, respectively, and anodes (e.g., second conductivity type semiconductor layers) of the LEDs 20, 30, and 40 disposed in the same column may be commonly connected to the same pixel device pad.

Hereinafter, a manufacturing method of the pixel device 100 will be described in detail.

FIGS. 4A, 4B, 5A, 5B, 6A, 6B, 7A, and 7B are schematic cross-sectional views illustrating a manufacturing process of the first floor, and FIGS. 8A, 8B, 9A, 9B 10A, 10B, 11A, 11B, 12A, 12B, 13A, and 13B are schematic cross-sectional views illustrating a manufacturing process of the second floor, FIGS. 14A, 14B, 15A, 15B, 16A, 16B, 17A, and 17B are schematic cross-sectional views illustrating a manufacturing process of the third floor, and FIGS. 18A, 18B, 19A, and 19B are schematic cross-sectional views illustrating a process of manufacturing a pixel device by bonding the first through third floors. Each of the cross-sectional views corresponds to a view taken along line A-A' or B-B' in FIG. 3A, 3B, or 3C.

(Formation of First Floor)

Figure 4A:
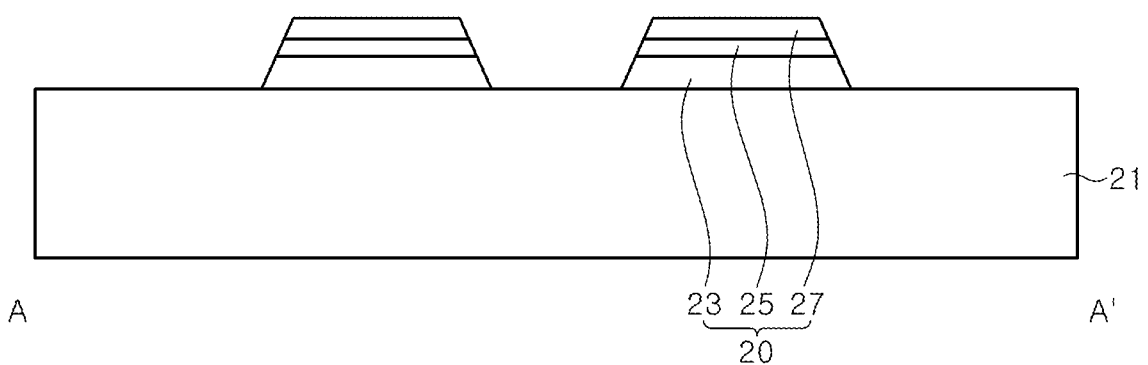
FIGS. 4A, 4B, 5A, 5B, 6A, 6B, 7A, and 7B are schematic cross-sectional views illustrating a manufacturing process of the first floor.
Figure 4B:
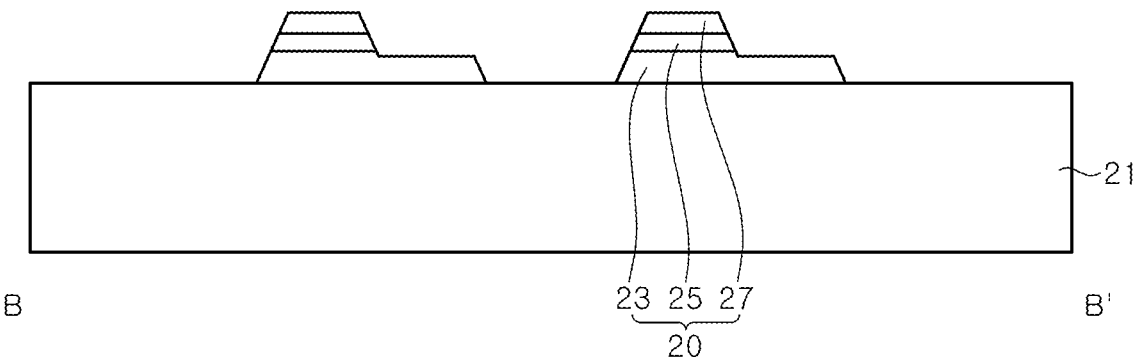

First, referring to FIGS. 3A, 4A, and 4B, LEDs 20 are formed on a substrate 21. The substrate 21 is a substrate on which a gallium nitride-based semiconductor layer can be grown, and may be, for example, a sapphire substrate. A first conductivity type semiconductor layer 23, an active layer 25, and a second conductivity type semiconductor layer 27 may be grown on the substrate 21 using, for example, metal organic chemical vapor deposition (MOCVD) technology or molecular beam epitaxy (MBE) technology. The grown semiconductor layers may be patterned using photolithography and etching techniques. The second conductivity type semiconductor layer 27 and the active layer 25 may be partially removed, such that a portion of the first conductivity type semiconductor layer 23 is exposed, and the LEDs 20 may be separated from one another through an isolation process. Although four LEDs 20 are exemplarily shown in FIG. 3A, the inventive concepts are not limited thereto. FIG. 3A shows only one block for manufacturing the pixel device 100, and a plurality of blocks may be formed together on the substrate 21.

Figure 5A:
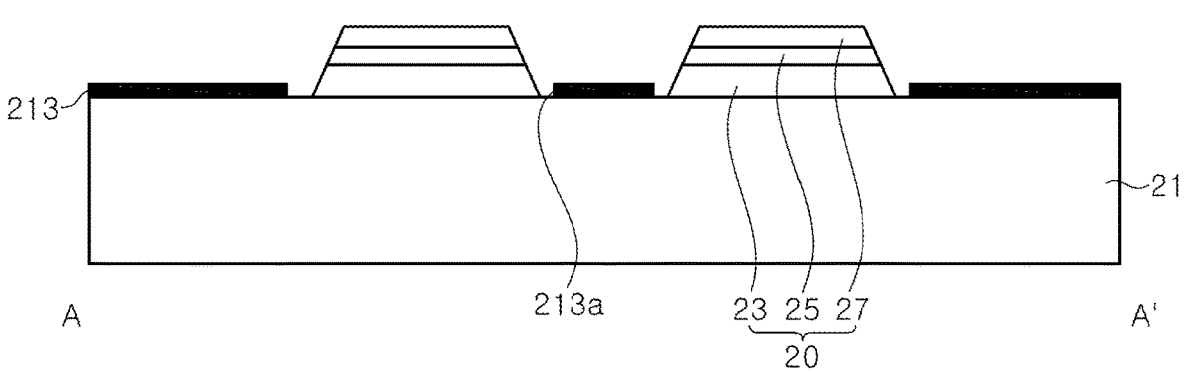
Figure 5B:
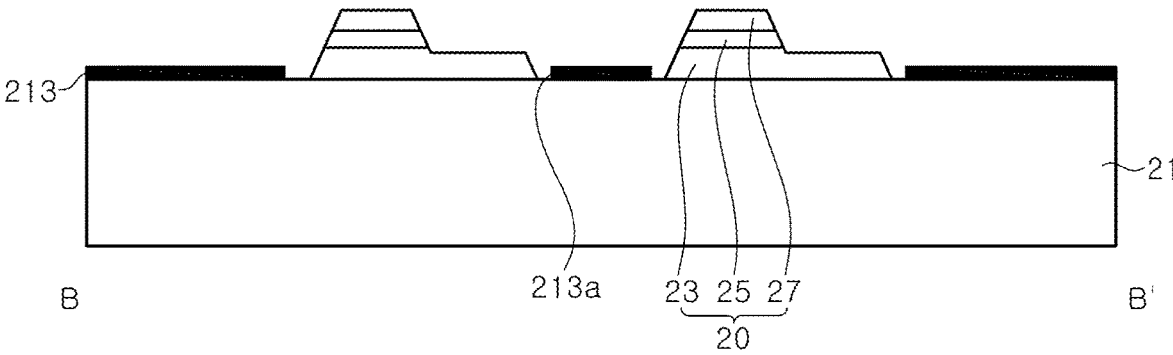

Referring to FIGS. 3A, 5A, and 5B, a light blocking layer 213 may be formed on the substrate 21. The light blocking layer 213 surrounds the LEDs 20 and defines a window region 213$a$ through which light is emitted. The window regions 213$a$ formed by the light blocking layer 213 may be larger than or equal to bottom areas of the corresponding LEDs 20, respectively.

Figure 6A:
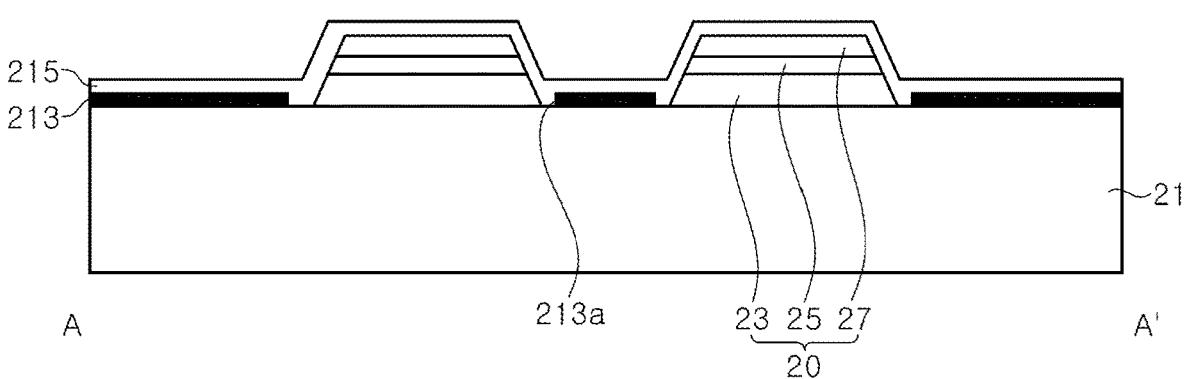
Figure 6B:
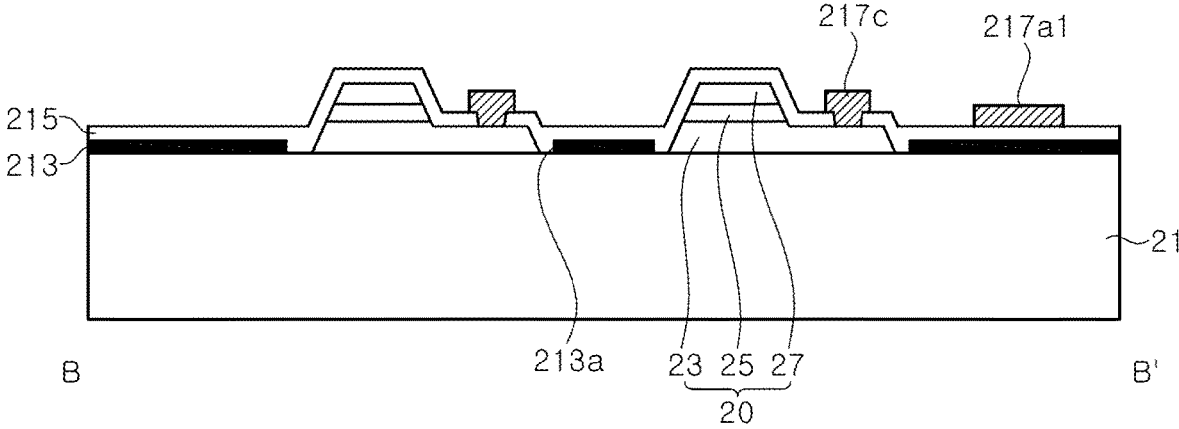

Referring to FIGS. 3A, 6A, and 6B, an insulation layer 215 covering the LEDs 20 is formed. The insulation layer 215 may cover the light blocking layer 213. The insulation layer 215 may be patterned so as to expose the first conductivity type semiconductor layer 23. Although not shown herein, the insulation layer 215 may be patterned so as to expose the first conductivity type semiconductor layer 23 and to expose the second conductivity type semiconductor layer 27. Subsequently, first lower pads 217$a$1 and 217$a$2, first lower contacts 217$c$, and first lower connection lines 217$b$ may be formed. The first lower contacts 217$c$ may be electrically connected to the first conductivity type semiconductor layers 23 through the opening in the insulation layer 215.

Figure 7A:
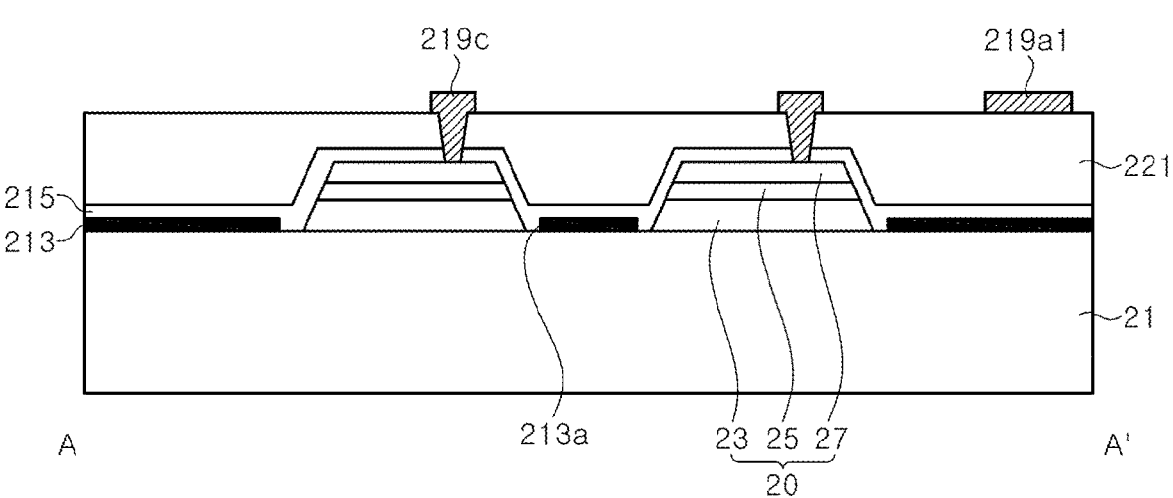
Figure 7B:
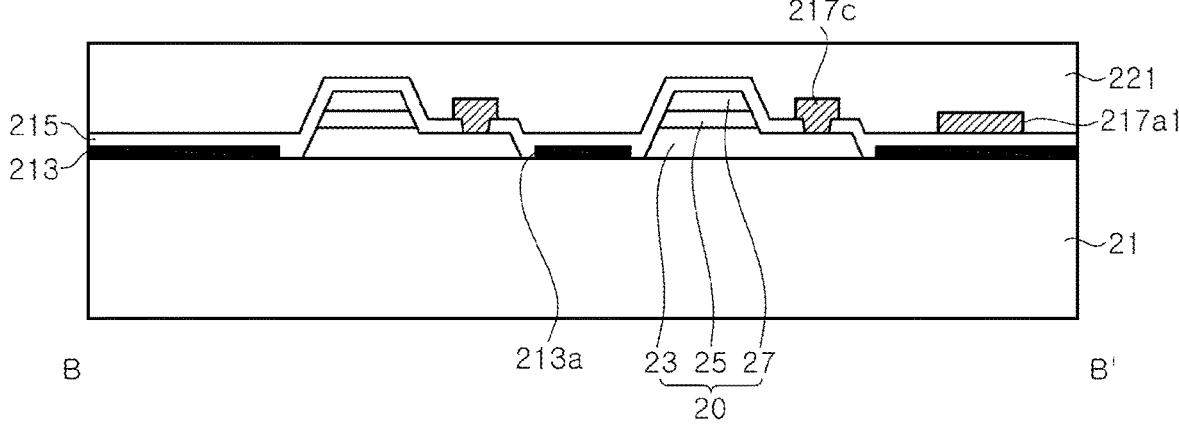

Referring to FIGS. 3A, 7A, and 7B, a planarization layer 221 covering the LEDs formed. The planarization layer 221 may cover the insulation layer 215, the first lower pads 217$a$1 and 217$a$2, the first lower contacts 217$c$, and the first lower connection lines 217$b$. The planarization layer 221 may be formed of a transparent insulating material, such as polyimide or an epoxy molding compound. The planarization layer 221 covers a surface morphology formed by the LEDs 20 to provide a flat upper surface.

Meanwhile, first upper pads 291$a$1 and 291$a$2, first upper contacts 291$c$, and first upper connection lines 291$b$ may be formed on the planarization layer 221. The second conductivity type semiconductor layer 27 may be partially exposed through the planarization layer 221 and the insulation layer 215, and the first upper contacts 291$c$ may be electrically connected to the second conductivity type semiconductor layers 27 through the planarization layer 221 and the insulation layer 215.

In this exemplary embodiment, it is described that the first lower pads 271$a$1 and 271$a$2, the first lower contacts 271$c$, and the first lower connection lines 271$c$ are formed under the planarization layer 221, but the inventive concepts are not limited thereto. For example, in some exemplary embodiments, the first lower pads 271$a$1 and 271$a$2, the first lower contacts 271$c$, and the first lower connection lines 271$c$ may be formed on the planarization layer 221, and the first lower contacts 271$c$ may be electrically connected to the first conductivity type semiconductor layer 23 through the planarization layer 221 and the insulation layer 215. In another exemplary embodiment, additional pads may be formed on the planarization layer 221, and these pads may be electrically connected to the first lower pads 271a1 and 271a2 through connection vias passing through the planarization layer 221.

(Formation of Second Floor)

Figure 8A:
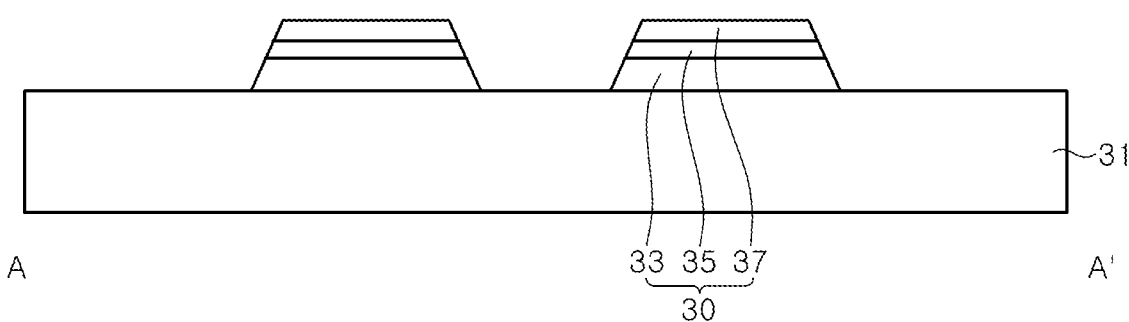
FIGS. 8A, 8B, 9A, 9B, 10A, 10B, 11A, 11B, 12A, 12B, 13A, and 13B are schematic cross-sectional views illustrating a manufacturing process of the second floor.
Figure 8B:
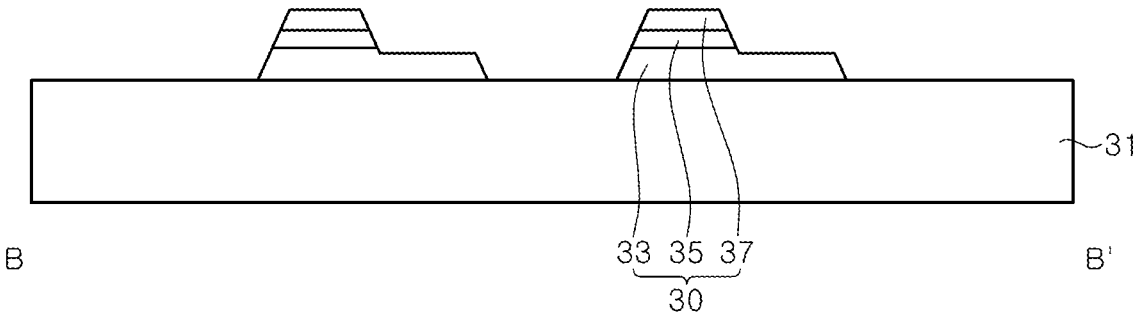

Referring to FIGS. 3B, 8A, and 8B, LEDs 30 are formed on a substrate 31. The substrate 31 is a substrate on which a gallium nitride-based semiconductor layer can be grown, and may be, for example, a sapphire substrate. A first conductivity type semiconductor layer 33, an active layer 35, and a second conductivity type semiconductor layer 37 may be grown on a temporary substrate 31 using, for example, metal organic chemical vapor deposition (MOCVD) technology or molecular beam epitaxy (MBE) technology. The grown semiconductor layers may be patterned using photolithography and etching techniques. The second conductivity type semiconductor layer 37 and the active layer 35 may be partially removed, such that a portion of the first conductivity type semiconductor layer 33 is exposed, and the LEDs 30 may be separated from one another through an isolation process. The LEDs 30 may be formed in block units so as to correspond to the LEDs 20 formed on the first floor. Although four LEDs 30 are exemplarily shown in FIG. 3B, the inventive concepts are not limited thereto. FIG. 3B shows only one block for manufacturing the pixel device 100, and a plurality of blocks may be formed together on the substrate 31.

Figure 9A:
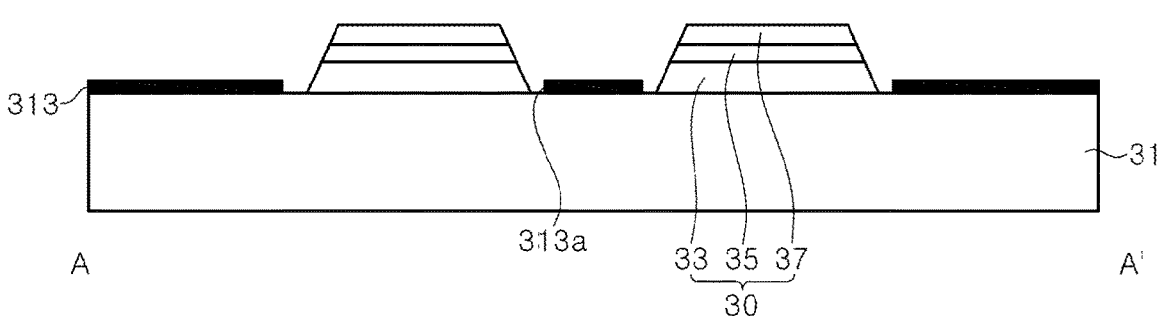
Figure 9B:
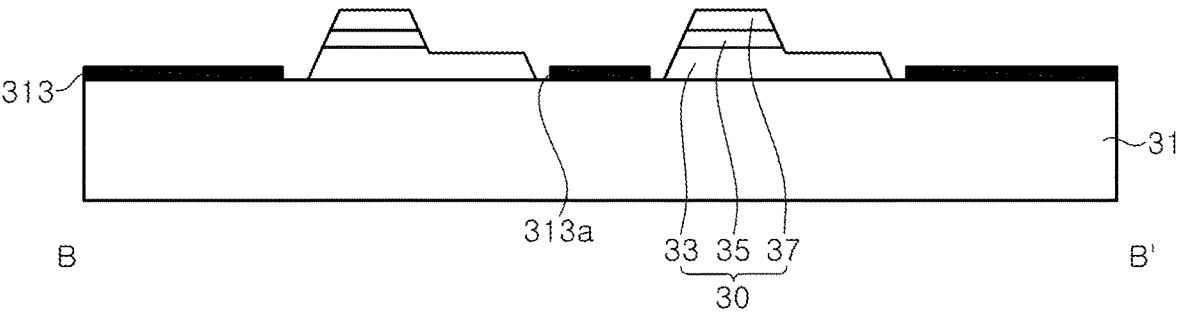

Referring to FIGS. 3B, 9A, and 9B, a light blocking layer 313 may be formed on the substrate 31. The light blocking layer 313 surrounds the LEDs 30 and defines a window region 313a through which light is emitted. The window regions 313a formed by the light blocking layer 313 may be larger than or equal to bottom areas of the corresponding LEDs 30, respectively.

Figure 10A:
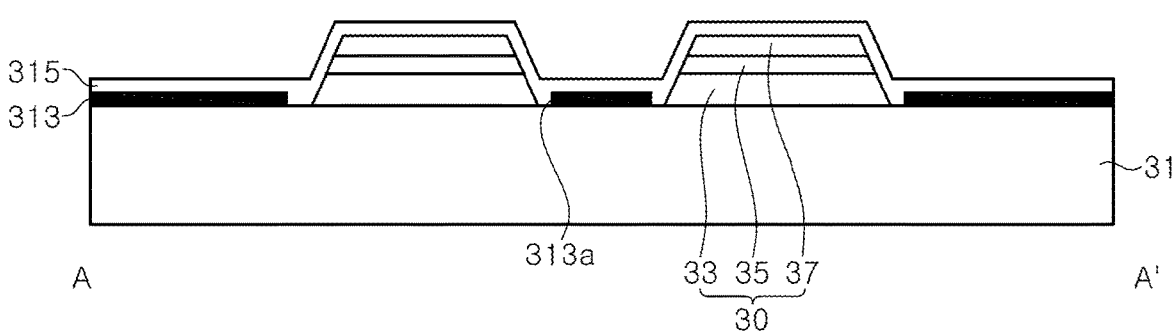
Figure 10B:
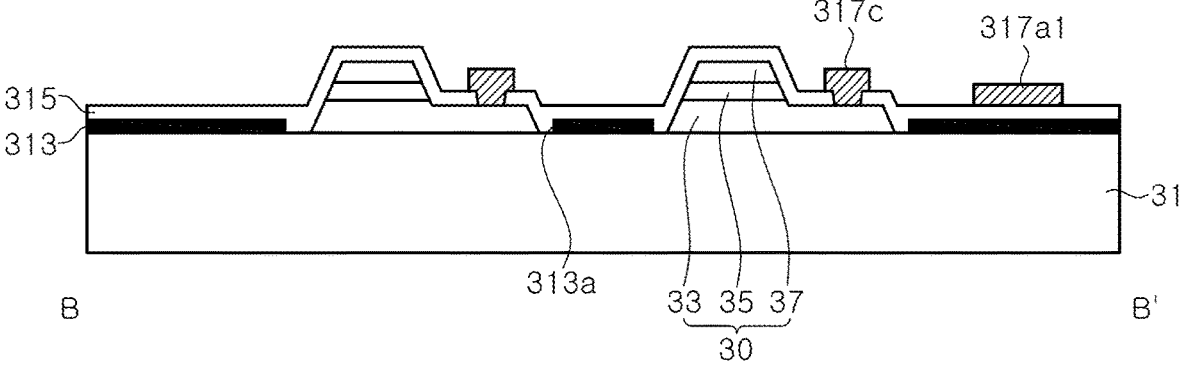

Referring to FIGS. 3B, 10A, and 10B, an insulation layer 315 covering the LEDs is formed. The insulation layer 315 may cover the light blocking layer 313. The insulation layer 315 may be patterned so as to expose the first conductivity type semiconductor layer 33. Although not shown herein, the insulation layer 315 may be patterned so as to expose the first conductivity type semiconductor layer 33 and to expose the second conductivity type semiconductor layer 37. Subsequently, second lower pads 317a1 and 317a2, second lower contacts 317c, and second lower connection lines 317b may be formed. The second lower contacts 317c may be electrically connected to the first conductivity type semiconductor layers 33 through the openings in the insulation layer 315.

Figure 11A:
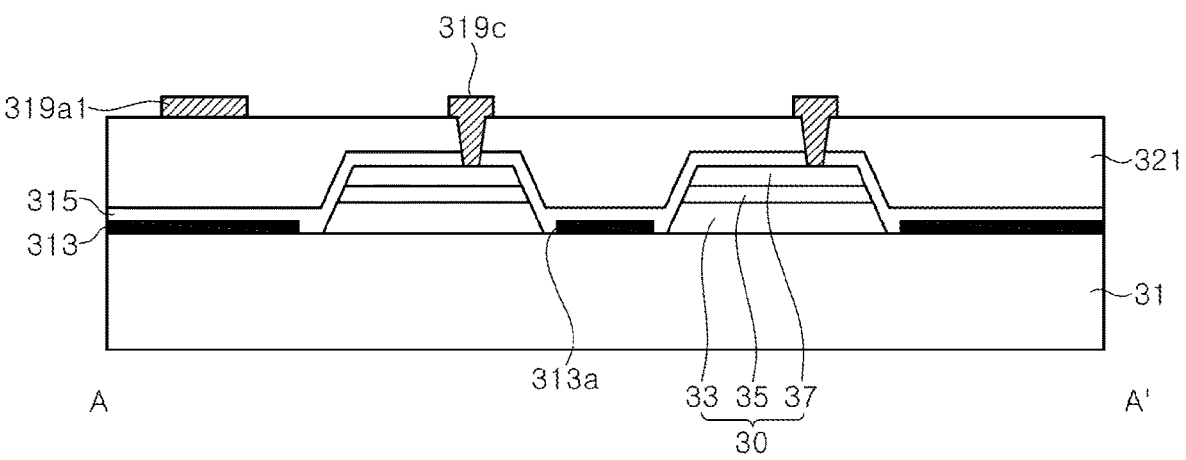
Figure 11B:
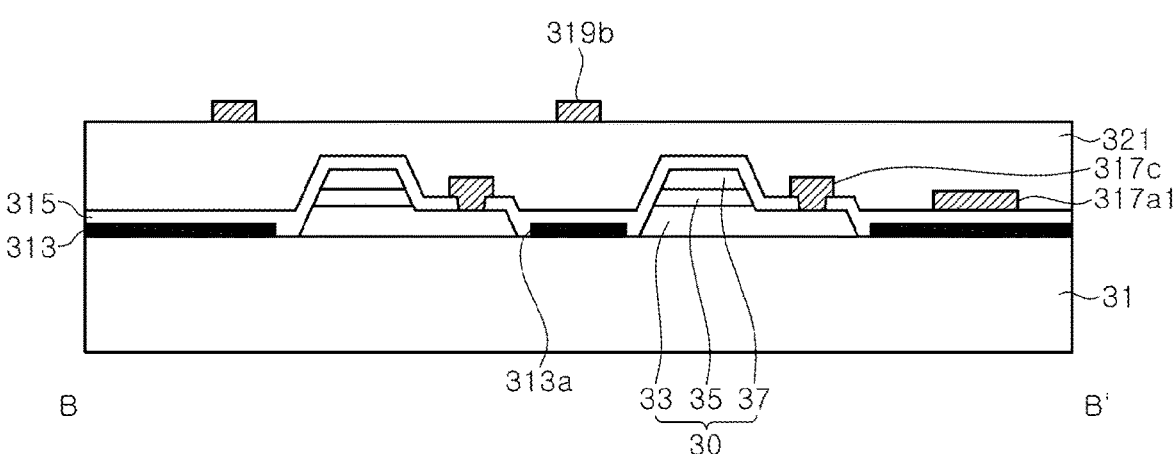

Referring to FIGS. 3B, 11A, and 111B, a planarization layer 321 covering the LEDs 30 is formed. The planarization layer 321 may cover the insulation layer 315, the second lower pads 317a1 and 317a2, the second lower contacts 317c, and the first lower connection lines 317b. The planarization layer 321 may be formed of a transparent insulating material, such as polyimide or an epoxy molding compound. The planarization layer 321 covers a surface morphology formed by the LEDs 30 to provide a flat upper surface.

Meanwhile, second upper pads 391a1 and 391a2, second upper contacts 391c, and second upper connection lines 391b may be formed on the planarization layer 321. The second conductivity type semiconductor layer 37 may be partially exposed through the planarization layer 321 and the insulation layer 315, and the second upper contacts 391c may be electrically connected to the second conductivity type semiconductor layers 37 through the planarization layer 321 and the insulation layer 315.

In this exemplary embodiment, it is described that the second lower pads 371a1 and 371a2, the second lower contacts 371c, and the second lower connection lines 371c are formed under the planarization layer 321, but the inventive concepts are not limited thereto. For example, in some exemplary embodiments, the second lower pads 371a1 and 371a2, the second lower contacts 371c, and the second lower connection lines 371c may be formed on the planarization layer 321, and the contacts 371c may be electrically connected to the first conductivity type semiconductor layer 33 through the planarization layer 321 and the insulation layer 315. In another exemplary embodiment, additional pads may be formed on the planarization layer 321, and these pads may be electrically connected to the second lower pads 371a1 and 371a2 through connection vias passing through the planarization layer 321.

Figure 12A:
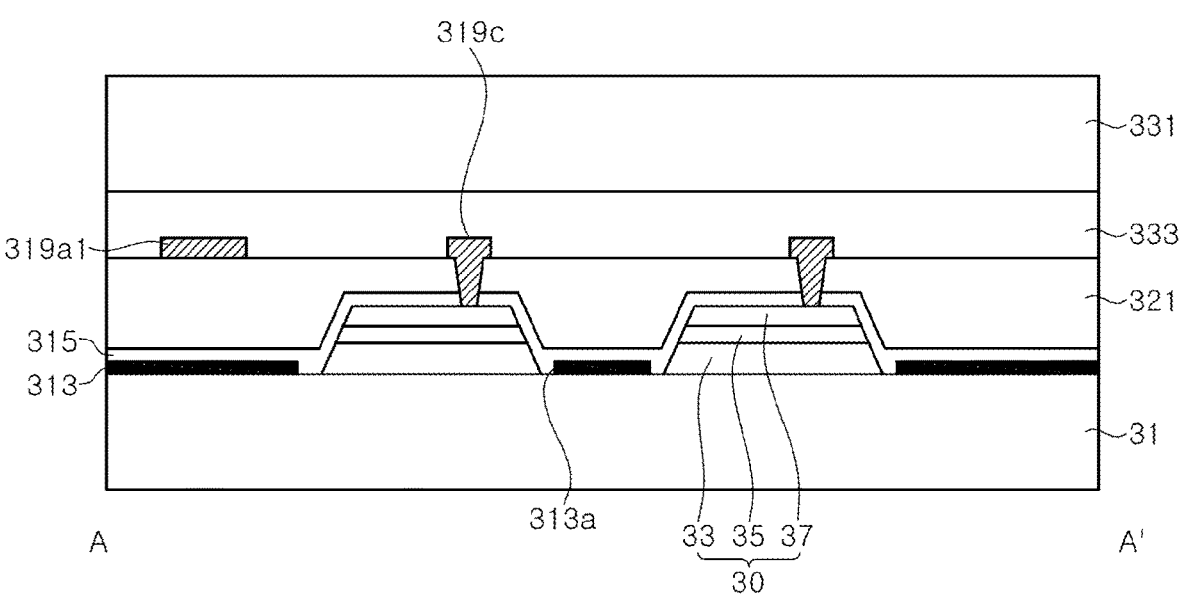
Figure 12B:
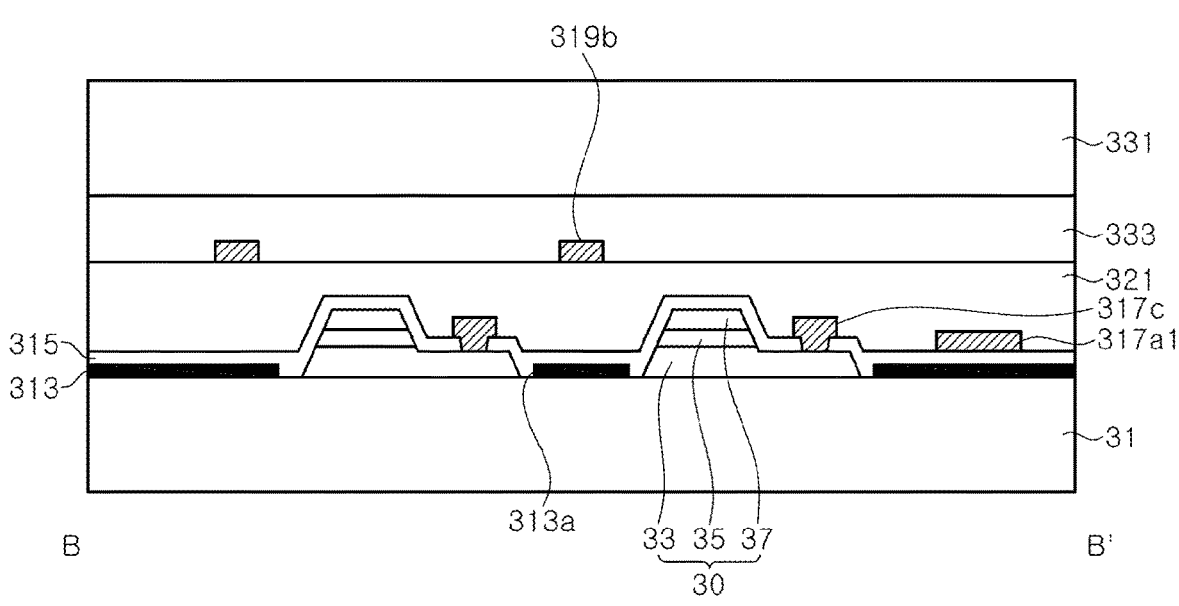

Referring to FIGS. 3B, 12A, and 12B, a carrier substrate 331 may be attached to the planarization layer 321 using an adhesive tape 333. The carrier substrate 331 is not particularly limited, and may be, for example, a sapphire substrate. The adhesive tape 333 is for attaching the LEDs 30 to the carrier substrate 331, and any tape of which adhesion can be reduced by heat or ultraviolet light may be used.

Figure 13A:
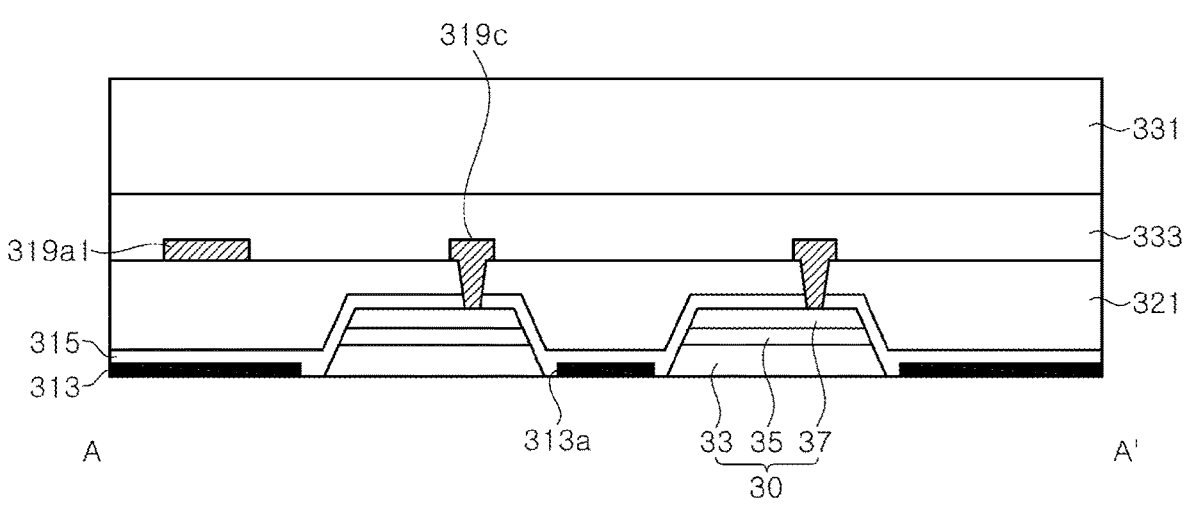
Figure 13B:
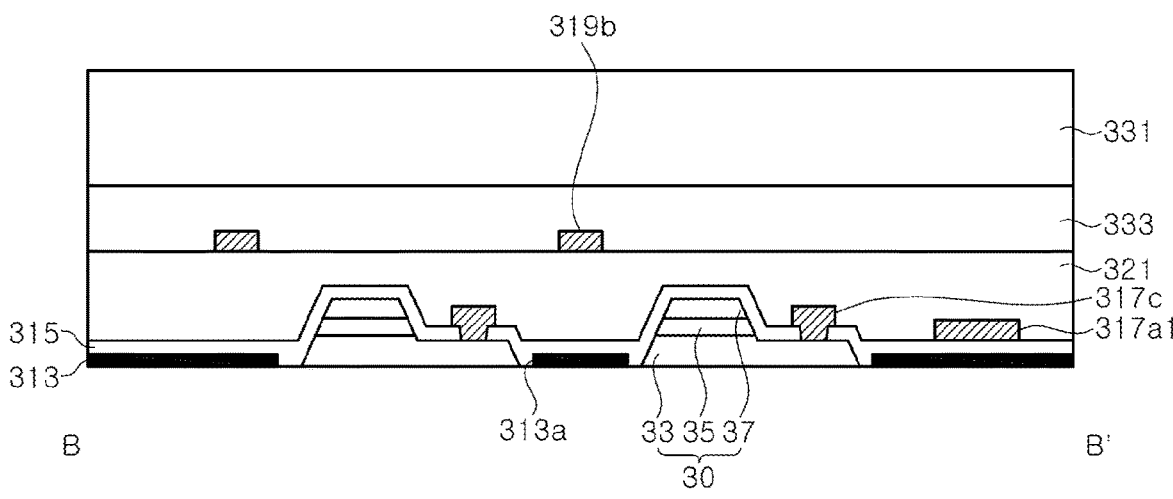

Referring to FIGS. 3B, 13A, and 13B, the substrate 31 from the LEDs 30 may be removed. The substrate 31 may be removed using, for example, a laser lift off technique.

(Formation of Third Floor)

Figure 14A:
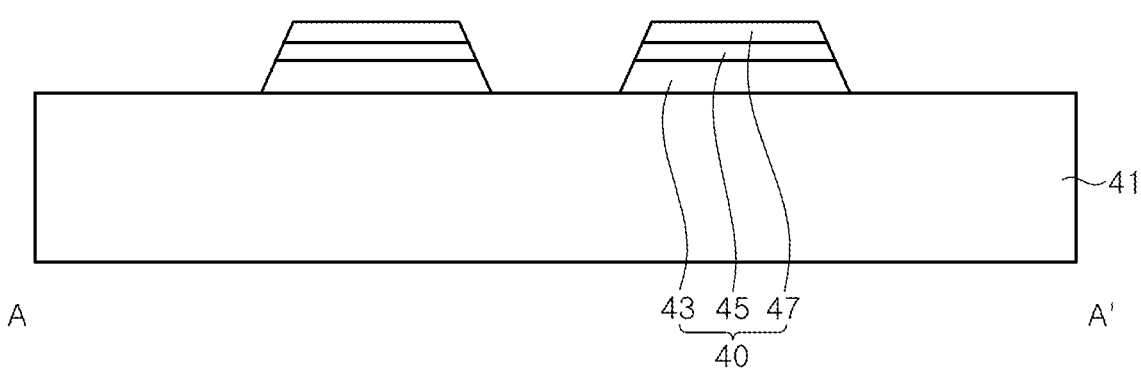
FIGS. 14A, 14B, 15A, 15B, 16A, 16B, 17A, and 17B are schematic cross-sectional views illustrating a manufacturing process of the third floor.
Figure 14B:
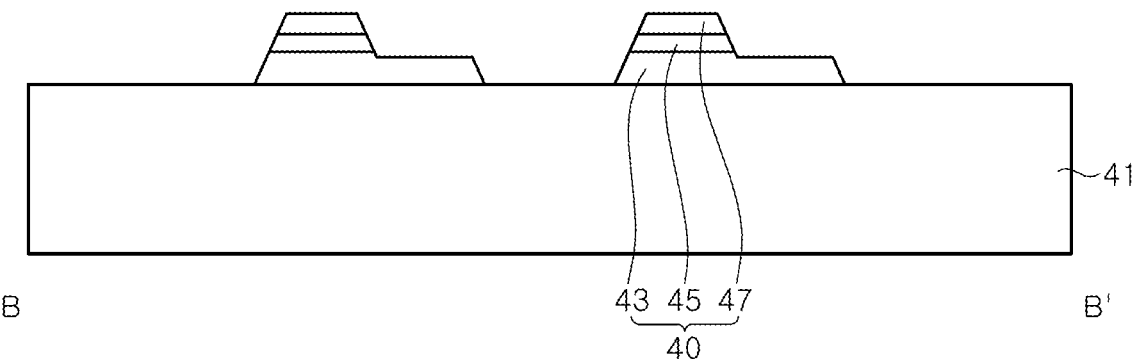

Referring to FIGS. 3C, 14A, and 14B, LEDs 40 are formed on a substrate 41. The substrate 41 is a substrate on which a phosphorus nitride (GaP)-based semiconductor layer can be grown, and may be, for example, a GaAs substrate. A first conductivity type semiconductor layer 43, an active layer 45, and a second conductivity type semiconductor layer 47 may be grown on the substrate 41 using, for example, metal organic chemical vapor deposition (MOCVD) technology or molecular beam epitaxy (MBE) technology. The grown semiconductor layers may be patterned using photolithography and etching techniques. The second conductivity type semiconductor layer 47 and the active layer 45 may be partially removed, such that a portion of the first conductivity type semiconductor layer 43 is exposed, and the LEDs 40 may be separated from one another through an isolation process. The LEDs may be formed in block units so as to correspond to the LEDs 20 formed on the first floor. Although four LEDs 40 are exemplarily shown in FIG. 3C, the inventive concepts are not limited thereto. FIG. 3C shows only one block for manufacturing the pixel device 100, and a plurality of blocks may be formed together on the substrate 41.

Figure 15A:
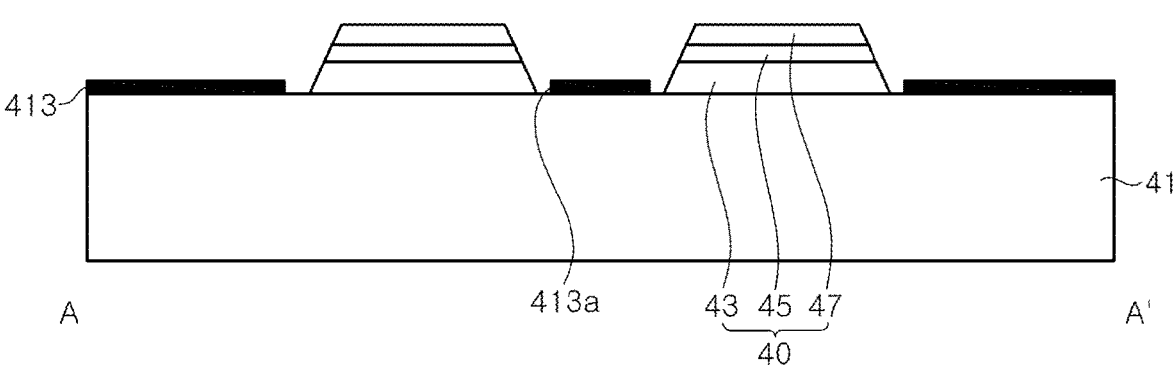
Figure 15B:
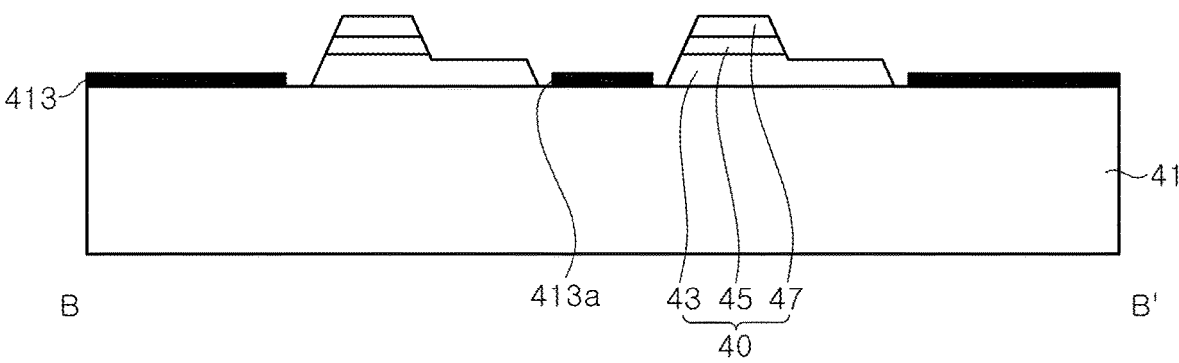

Referring to FIGS. 3B, 15A, and 15B, a light blocking layer 413 may be formed on the substrate 41. The light blocking layer 413 surrounds the LEDs 40 and defines a window region 413a through which light is emitted. The window regions 413a formed by the light blocking layer 413 may be larger than or equal to bottom areas of the corresponding LEDs 40, respectively.

Figure 16A:
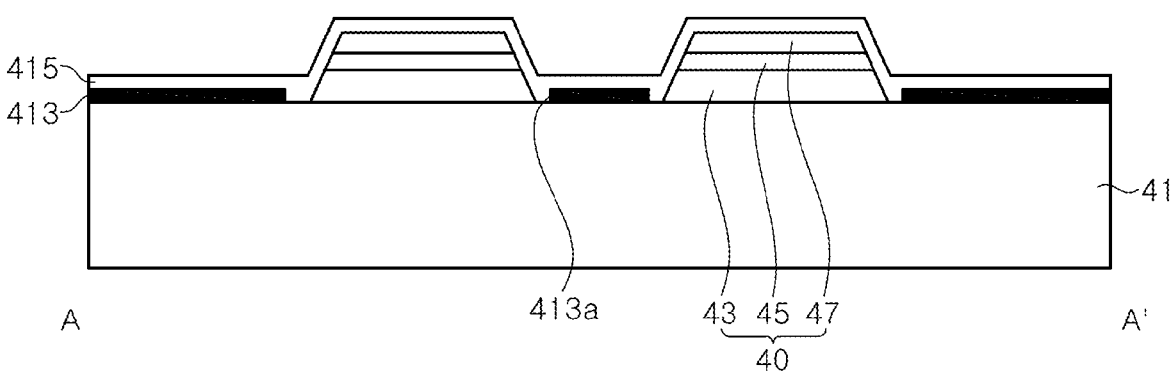
Figure 16B:
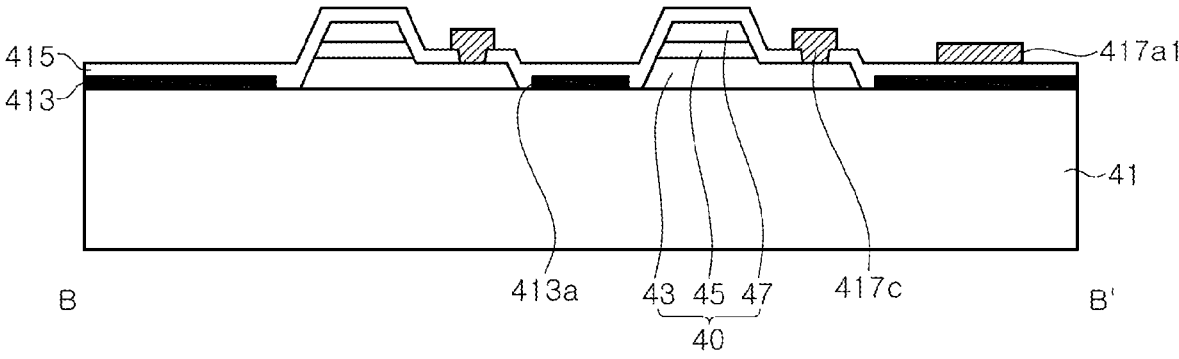

Referring to FIGS. 3C, 16A, and 16B, an insulation layer 415 covering the LEDs formed. The insulation layer 415 may cover the light blocking layer 413. The insulation layer 415 may be patterned so as to expose the first conductivity type semiconductor layer 43. Although not shown herein, the insulation layer 415 may be patterned so as to expose the first conductivity type semiconductor layer 43 and to expose the second conductivity type semiconductor layer 47. Subsequently, third lower pads 417a1 and 417a2, third lower contacts 417c, and third lower connection lines 417b may be formed. The third lower contacts 417c may be electrically connected to the first conductivity type semiconductor layers 43 through the opening in the insulation layer 415, respectively.

Figure 17A:
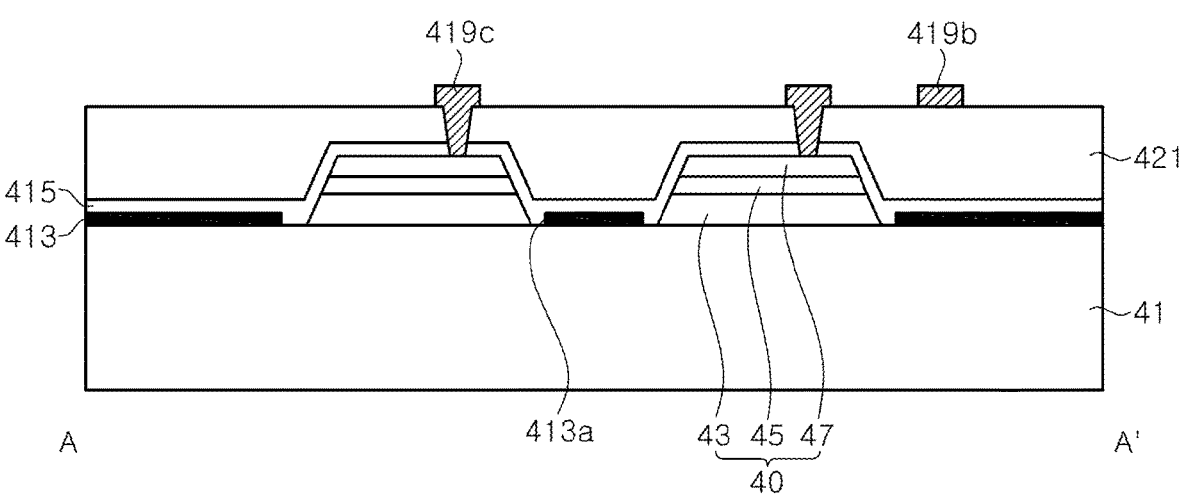
Figure 17B:
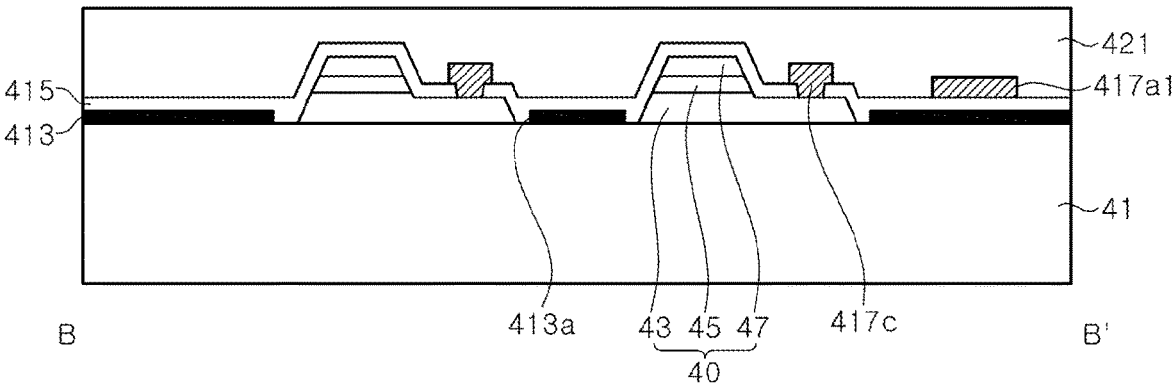

Referring to FIGS. 3C, 17A, and 17B, a planarization layer 421 covering the LEDs 40 is formed. The planarization layer 421 may cover the insulation layer 415, the third lower pads 417a1 and 417a2, the third lower contacts 417c, and the first lower connection lines 417b. The planarization layer 421 may be formed of a transparent insulating material, such as polyimide or an epoxy molding compound. The planarization layer 421 covers a surface morphology formed by the LEDs 40 to provide a flat upper surface.

Meanwhile, third upper pads 491a1 and 491a2, third upper contacts 491c, and third upper connection lines 491b may be formed on the planarization layer 421. The second conductivity type semiconductor layer 47 may be partially exposed through the planarization layer 421 and the insulation layer 415, and the third upper contacts 491c may be electrically connected to the second conductivity type semiconductor layers 47 through the planarization layer 421 and the insulation layer 415.

In this exemplary embodiment, it is described that the third lower pads 471a1 and 471a2, the third lower contacts 471c, and the third lower connection lines 471c are formed under the planarization layer 421, but the inventive concepts are not limited thereto. For example, in some exemplary embodiments, the third lower pads 471a1 and 471a2, the third lower contacts 471c, and the third lower connection lines 471c may be formed on the planarization layer 421, and the contacts 471c may be electrically connected to the first conductivity type semiconductor layer 43 through the planarization layer 421 and the insulation layer 415. In another exemplary embodiment, additional pads may be formed on the planarization layer 421, and these pads may be electrically connected to the third lower pads 471a1 and 471a2 through connection vias passing through the planarization layer 421.

Subsequently, similar to that described with reference to FIGS. 3B, 12A, and 12B, the carrier substrate may be attached to the planarization layer 421 using the adhesive tape, and the substrate 41 may be removed using, for example, a wet etching technique.
(Manufacture of Pixel Device)

Figure 18A:
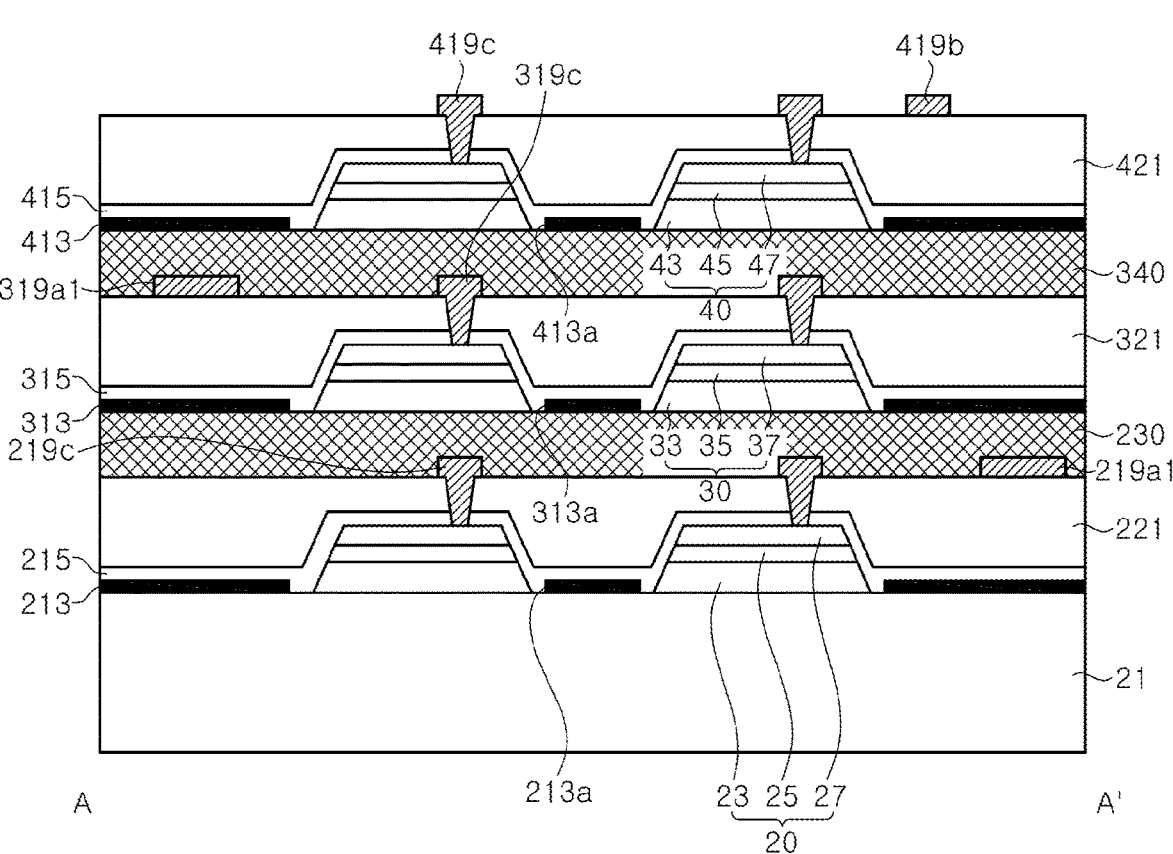
FIGS. 18A, 18B, 19A, and 19B are schematic cross-sectional views illustrating a process of manufacturing a pixel device by bonding the first through third floors.
Figure 18B:
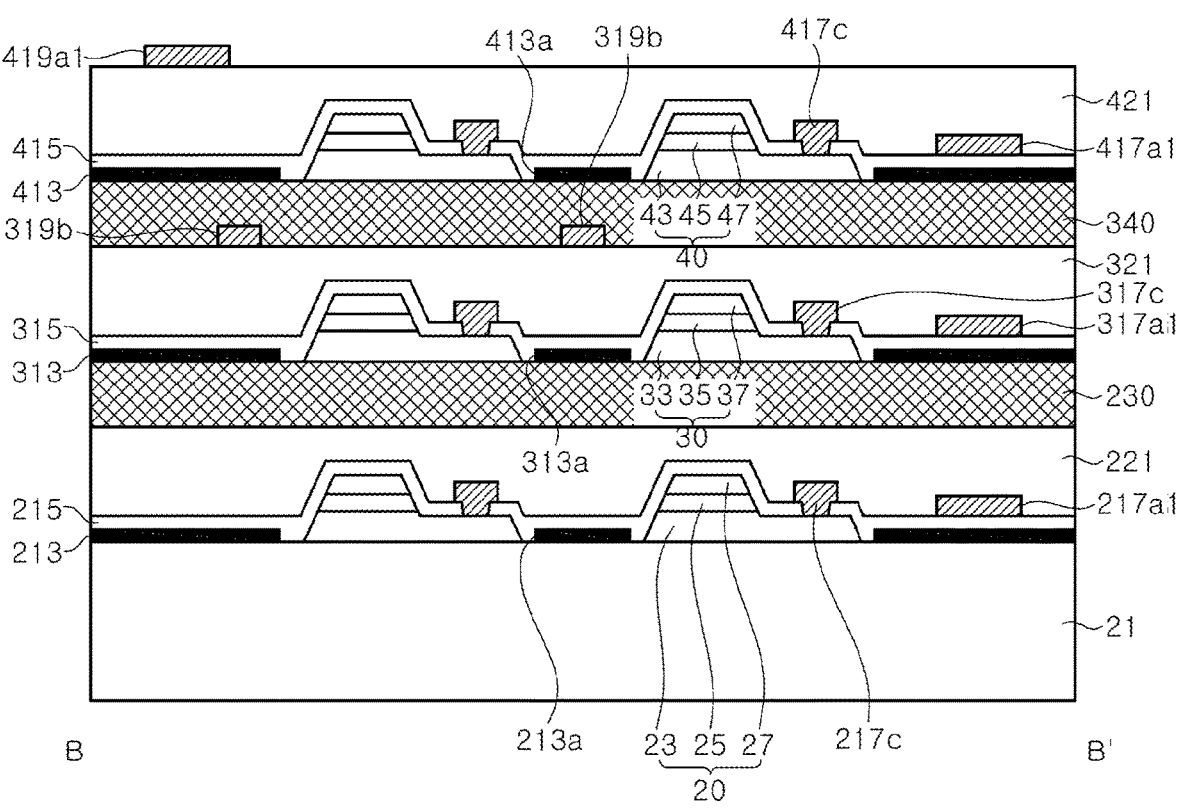

Referring to FIGS. 2A, 18A, and 18B, the second floor may be attached to the first floor using a lower adhesive layer 230, and the third floor may be attached to the second floor using an upper adhesive layer 340. After attaching the second floor to the first floor, the carrier substrate 331 and the adhesive tape 333 may be removed, and after attaching the third floor to the second floor, the carrier substrate and the adhesive tape may be removed. Accordingly, as shown in FIGS. 18A and 18B, a structure in which the first through third floors are stacked one above another is provided.

Figure 19A:
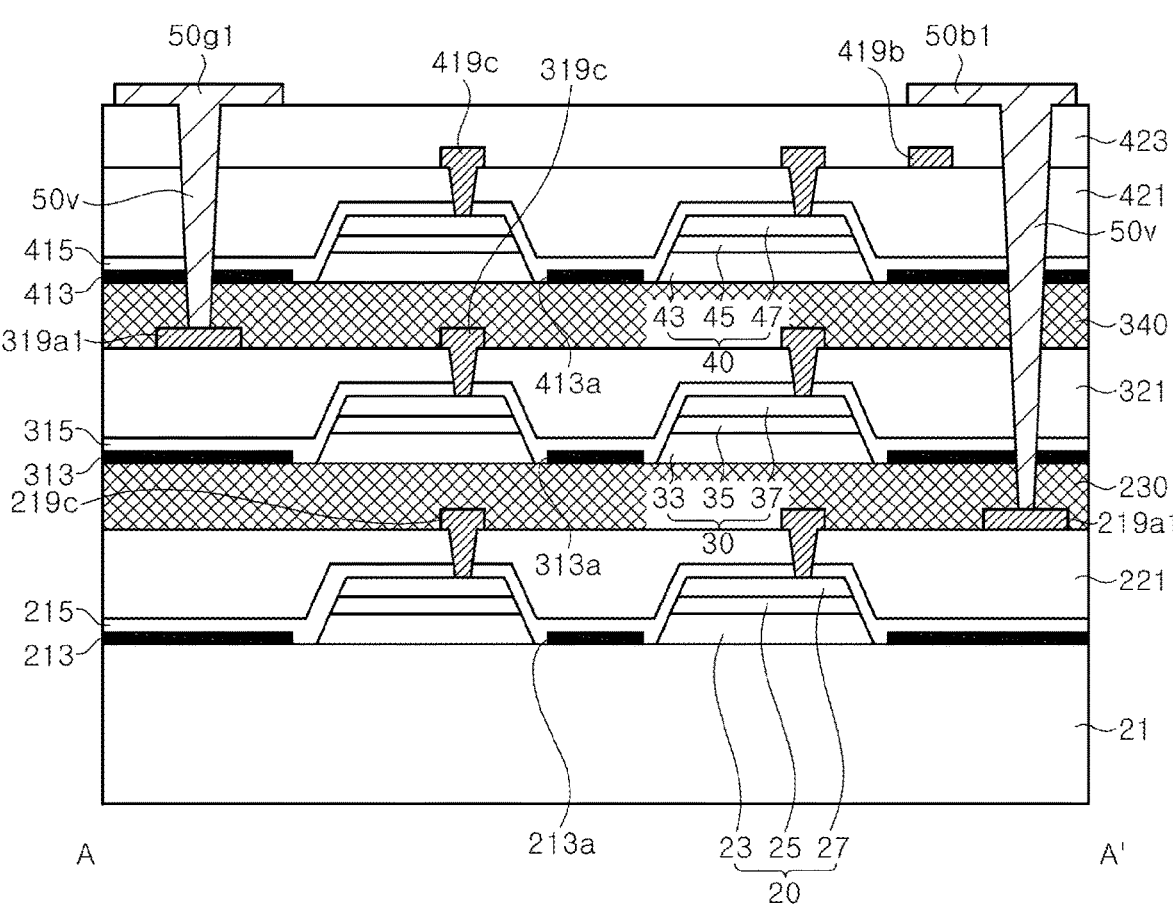
Figure 19B:
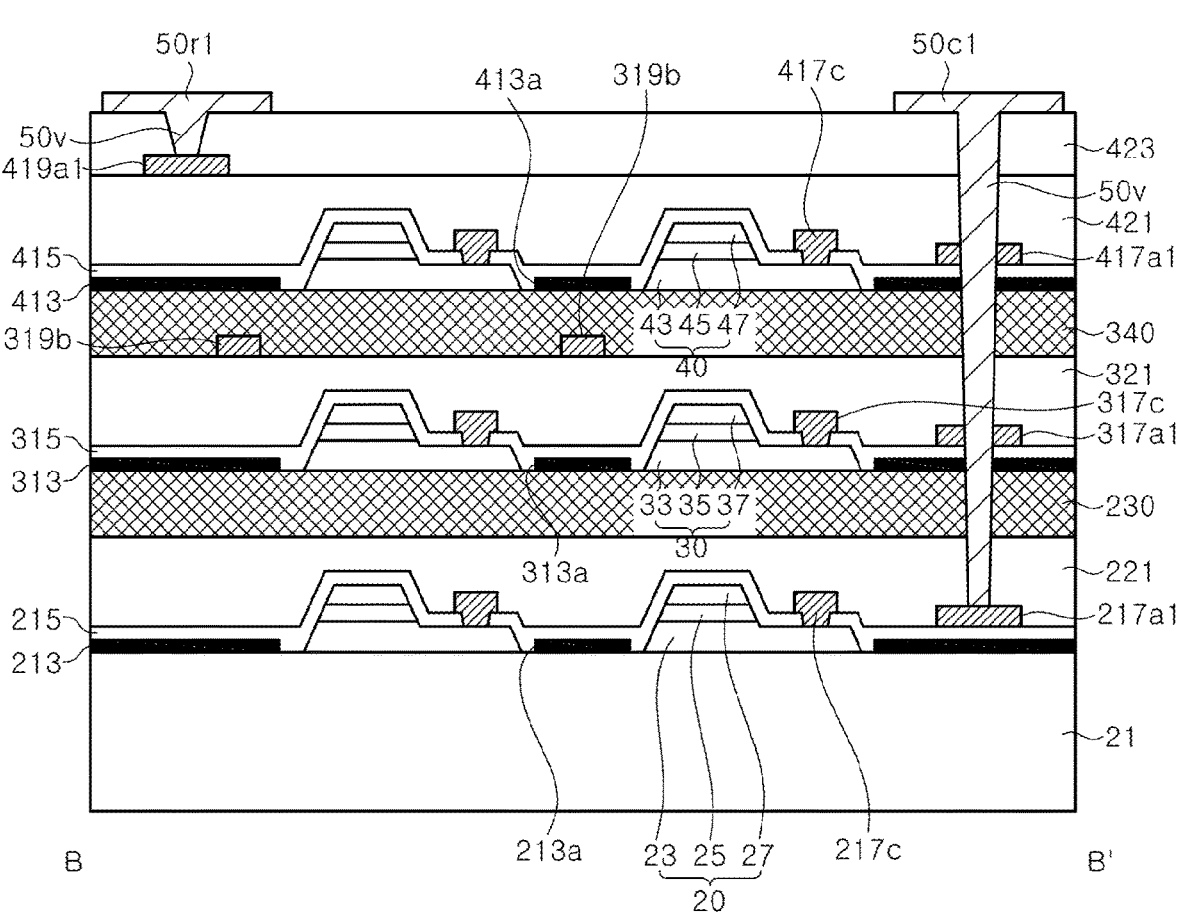

Referring to FIGS. 2A, 19A, and 19B, an upper insulation layer 423 may be formed on the third floor. The upper insulation layer 423 may include an organic insulation layer or an inorganic insulation layer. Subsequently, the upper insulation layer 423, the planarization layers 221, 321, and 421, and the lower and upper adhesive layers 230 and 340 may be patterned to form via holes exposing the first through third lower pads 217a1, 271a2, 317a1, 317a2, 417a1, and 417a2 and the first through third upper pads 219a1, 219a2, 319a1, 319a2, 419a1, and 419a2. Thereafter, pixel device pads 50r1, 50r2, 50g1, 50g2, 50b1, 50b2, 50c1, and 50c2 and connection vias 50v may be formed on the upper insulation layer 423 so as to be electrically connected to the first through third lower pads 217a1, 271a2, 317a1, 317a2, 417a1, and 417a2 and the first through third upper pads 219a1, 219a2, 319a1, 319a2, 419a1, and 419a2.

A plurality of blocks may be formed on the substrate 21, and these blocks may be singularized into individual blocks using a cutting technique. Accordingly, a plurality of individually separated pixel devices 100 is provided. In some exemplary embodiments, the substrate 21 may be removed from the pixel devices 100.

According to this exemplary embodiment, the LEDs 20, 30, or 40 are isolated from one another on each independently manufactured floor, and the pads are electrically connected to the LEDs 20, 30, and 40. Accordingly, after manufacturing each of the floors, it is possible to electrically and/or optically check for defective LEDs 20, 30, and 40 before attaching the floors. Accordingly, since defective LEDs can be repaired in a state in which each of the floors is manufactured, a repair process may be easily performed, and thus, a process yield of the pixel device 100 may be improved.

Figure 20:
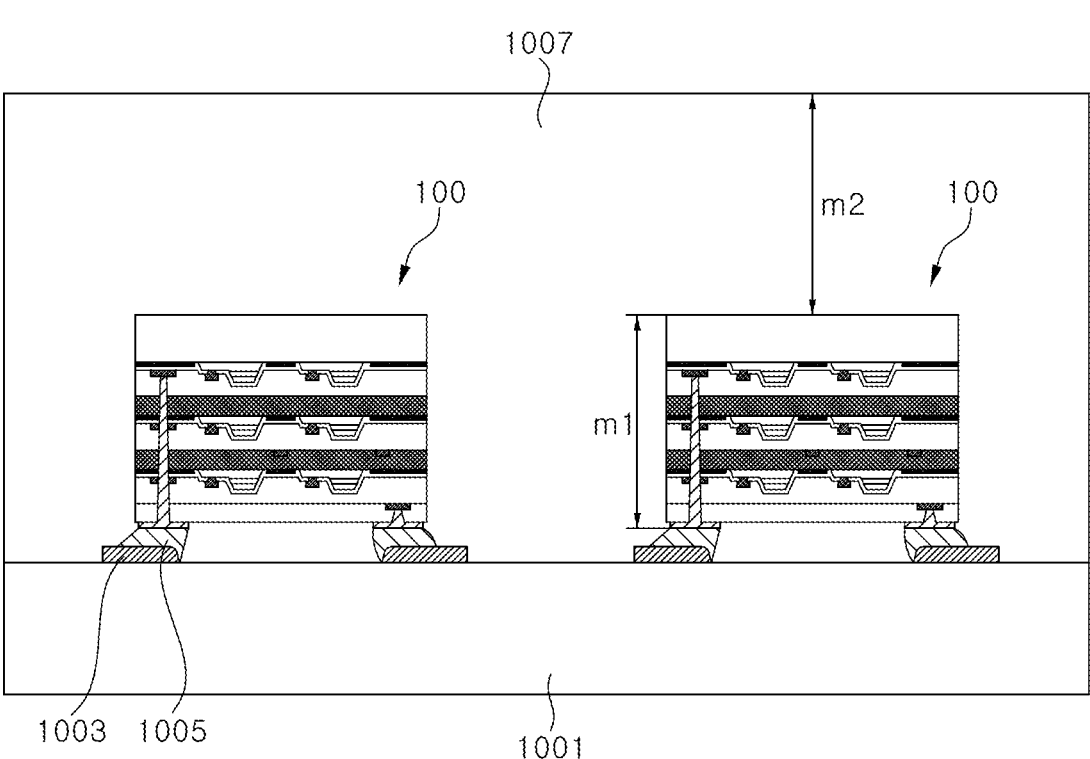
FIG. 20 is a schematic cross-sectional view illustrating a pixel module including pixel devices according to an exemplary embodiment.

FIG. 20 is a schematic cross-sectional view illustrating a pixel module 1000 including the pixel devices 100 according to an exemplary embodiment.

Referring to FIG. 20, the pixel devices 100 may be flip-bonded to a circuit board 1001, such that the pixel device pads 50r1, 50r2, 50g1, 50g2, 50b1, 50b2, 50c1, and 50c2 are electrically connected to the circuit board 1001. Herein, since the pixel devices 100 are same as those described with reference to FIGS. 2A, 2B, 19A, and 19B, a detailed description thereof is omitted to avoid redundancy.

As shown in FIG. 20, the pixel device pads may be bonded to pads 1003 on the circuit board 1001 through a bonding material 1005. A gap between the pads 1003 on the circuit board 1001 may be greater than a gap between the pixel device pads. Meanwhile, the bonding materials 1005 may have a larger gap between lower surfaces than a gap between upper surfaces.

A molding layer 1007 covering a plurality of pixel devices 100 may be formed over the pixel module 1000 in which the plurality of pixel devices 100 is arrayed. The molding layer 1007 is not particularly limited as long as it is a light-transmissive material. A thickness m1 of the pixel device 100 may be less than a distance m2 from an upper surface of the molding layer 1007 to an upper surface of the pixel device 100 in contact with the molding layer 1007. Accordingly, the pixel module and the display apparatus can be made thinner, and thus, a distance between the user's eyes and the pixel device 100 may be reduced when viewed from the outside, thereby further improving visibility.

Figure 21:
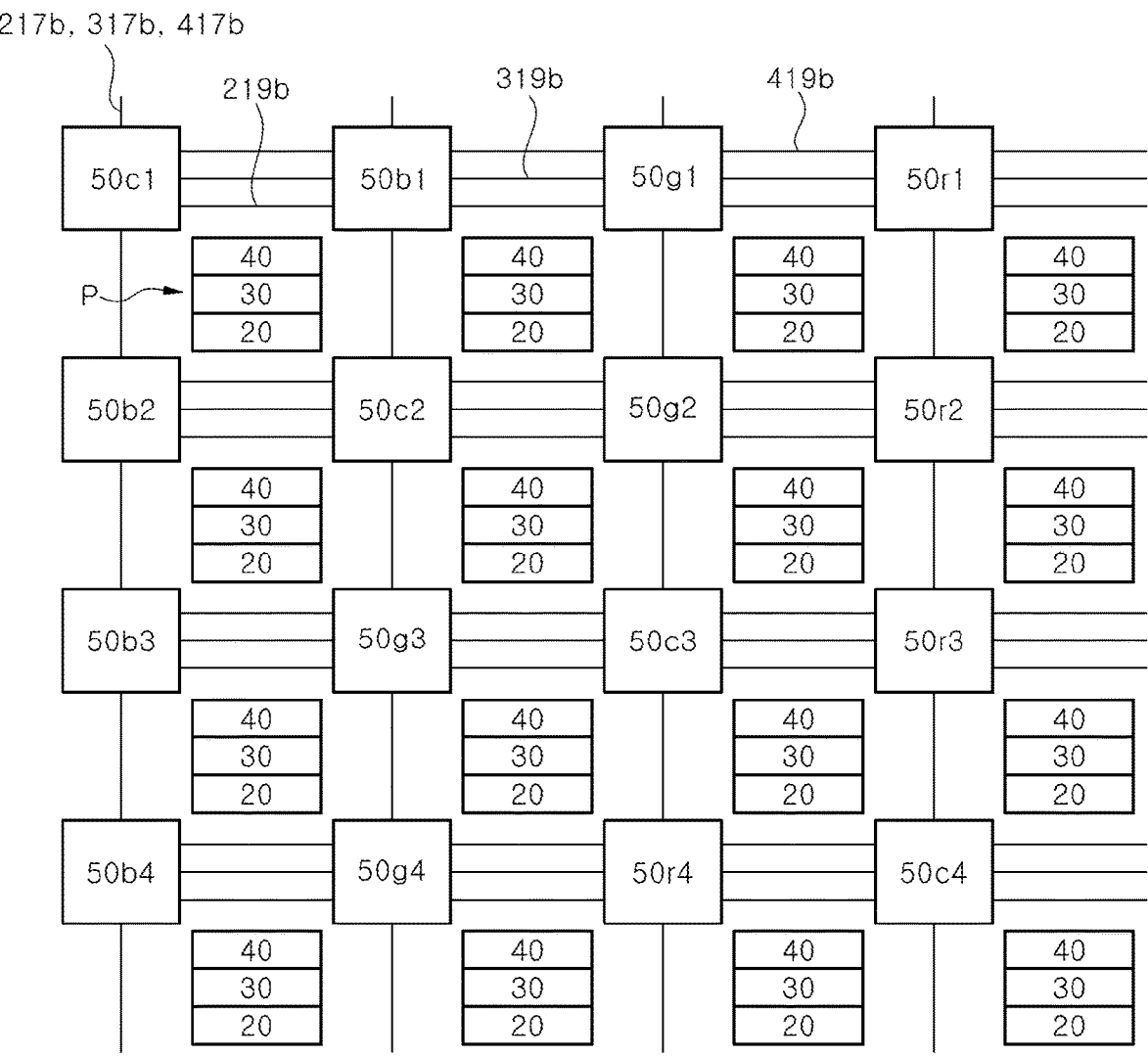
FIG. 21 is a schematic diagram illustrating a pixel device according to an exemplary embodiment.

FIG. 21 is a schematic diagram illustrating a pixel device according to an exemplary embodiment.

Although the pixels are described as being arranged in the 2×2 matrix in the above exemplary embodiments, the inventive concepts are not limited thereto, and they may be arranged in any matrix. FIG. 21 shows an example in which pixels are arranged in a 4×4 matrix. Each of pixels P includes vertically stacked LEDs 20, 30, and 40. The LEDs 20, 30, and 40 may be electrically connected to first through third lower connection lines 217b, 317b, and 417b and first through third upper connection lines 219b, 319b, and 419b, such that the LEDs 20, 30, and 40 can be driven in a passive matrix manner. In the drawings, specific electrical connections of the LEDs 20, 30, and 40 are omitted. For example, the first through third lower connection lines 217b, 317b, and 417b may be commonly electrically connected to cathodes of LEDs arranged in the same column. Since they are commonly electrically connected, the first through third lower connection lines 217b, 317b, and 417b are indicated by the same line in the drawing. The first through third lower connection lines 217b, 317b, and 417b disposed in the same column are electrically connected to a same pixel device pad 50c1, 50c2, 50c3, or 50c4. Accordingly, the pixel device pads 50c1, 50c2, 50c3, and 50c4 may be arranged in corresponding columns. Meanwhile, the LEDs 20, 30, and 40 disposed in the same row are electrically connected to the first through third upper connection lines 219b, 319b, and 419b. As described above, the LEDs 20, 30, or 40 on the same floor are connected to the same upper connection line, but the LEDs disposed on different floors are connected to different upper connection lines. For example, the LEDs 20 disposed on a first floor are connected to the first upper connection line 219b, the LEDs 30 disposed on a second floor are connected to the second upper connection line 319b, and the LEDs 40 disposed on a third floor may be connected to the third upper connection line 419b. Accordingly, the LEDs 20, 30, and 40 disposed in one row are electrically connected to three different upper connection lines 219b, 319b, and 419b. Anodes of the LEDs arranged in four rows are electrically connected to 12 pixel device pads 50r1, 50r2, 50r3, 50r4, 50g1, 50g2, 50g3, 50g4, 50b1, 50b2, 50b3, and 50b4, respectively, and cathodes of the LEDs arranged in four columns are electrically connected to four pixel device pads 50C1, 50C2, 50C3, and 50C4, respectively. Accordingly, a total of 16 pixel device pads may be provided to independently drive the LEDs 20, 30, and 40 in the pixels P.

The pixel device pads 50r1, 50r2, 50r3, 50r4, 50g1, 50g2, 50g3, 50g4, 50b1, 50b2, 50b3, 50b4, 50C1, 50C2, 50C3, and 50C4 may be disposed in various positions. As shown in FIG. 21, in an exemplary embodiment, the pixel device pads 50c1, 50b1, 50g1, and 50r1 may be disposed in a first row in this order, the pixel device pads 50b2, 50c2, 50g2, and 50r2 may be disposed in a second row in this order, the pixel device pads 50b3, 50g3, 50c3, and 50r3 may be disposed in a third row, and the pixel device pads 50b4, 50g4, 50r4, and 50c4 may be disposed in a last row. However, an arrangement order of pixel device pads may be changed. The pixel device pads may be arranged in the same shape while maintaining the same distance from one another, but the inventive concepts are not limited thereto.

Figure 22A:
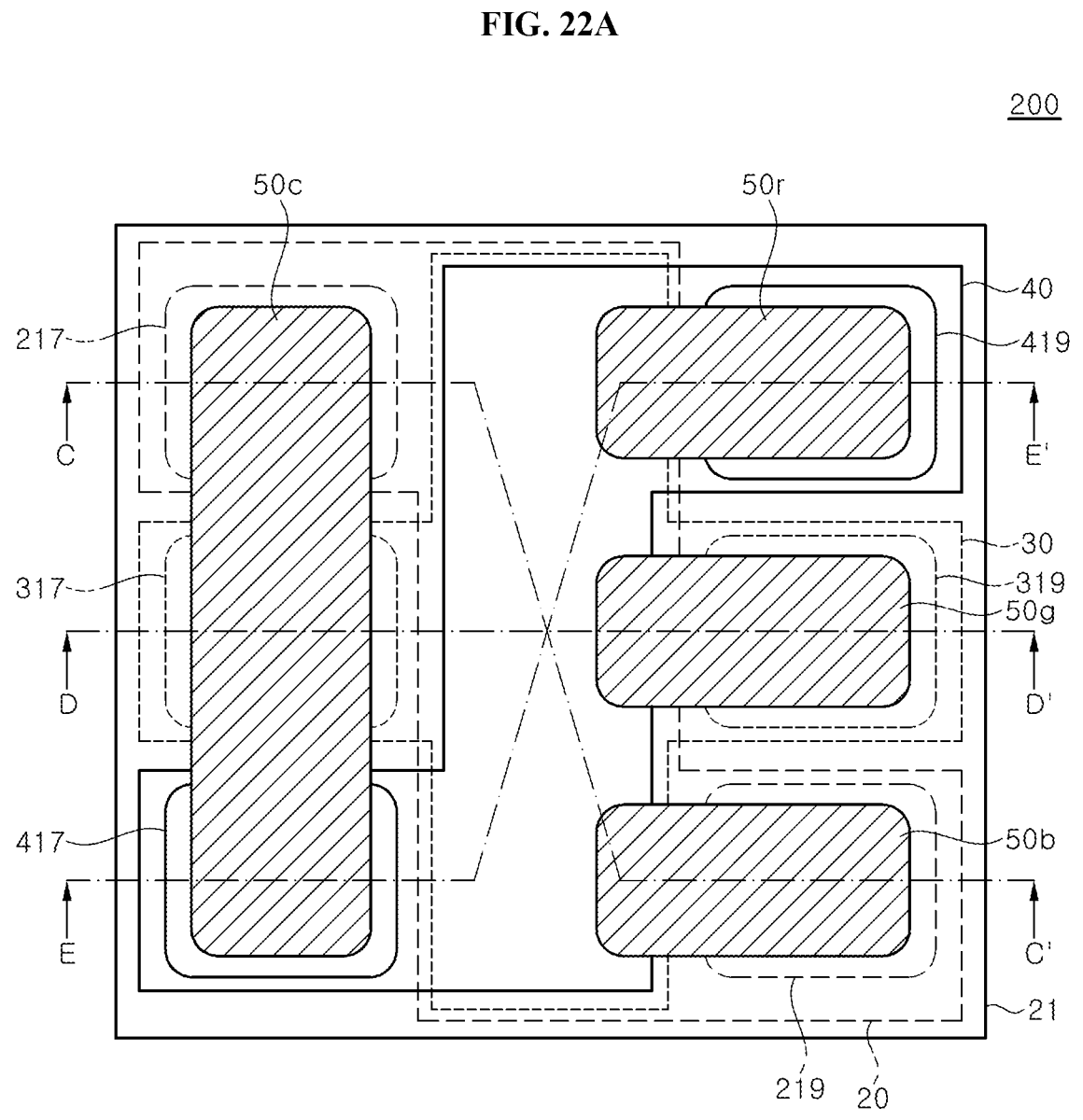
Figure 22B:
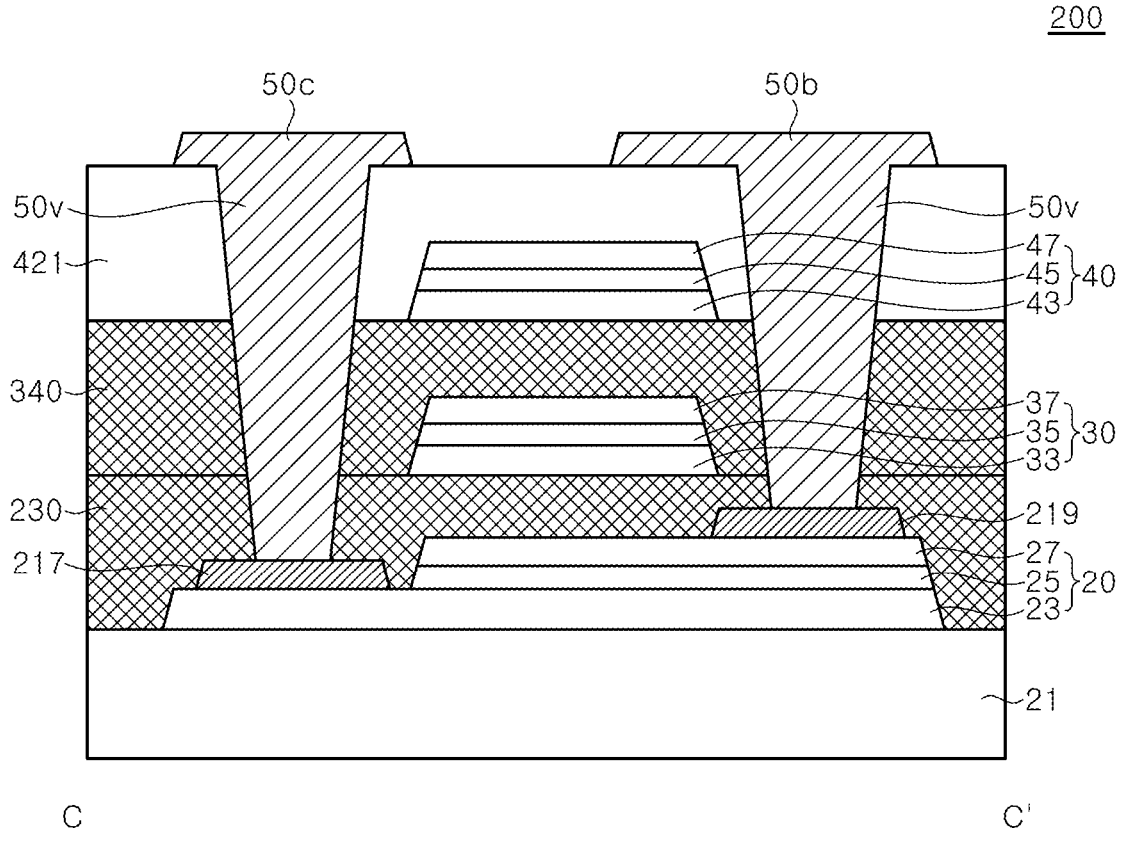
FIG. 22B is a schematic cross-sectional view taken along line C-C' of FIG. 22A.
Figure 22C:
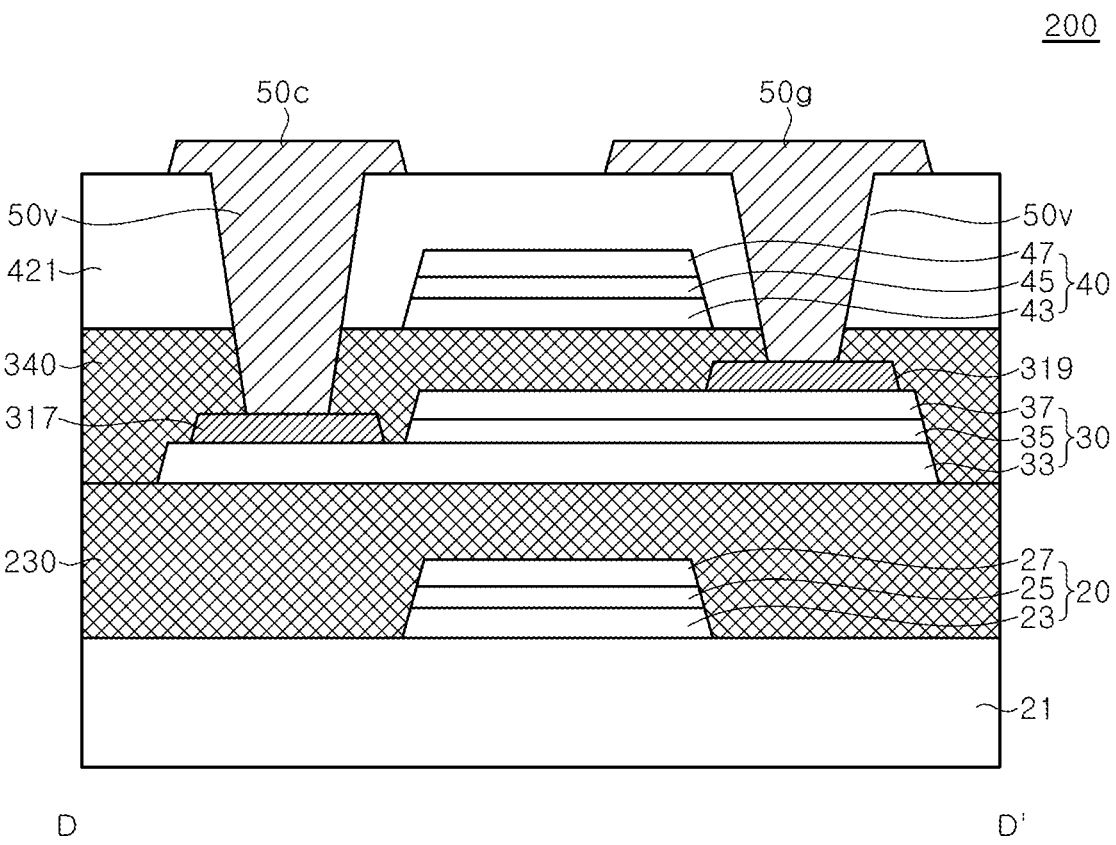
FIG. 22C is a schematic cross-sectional view taken along line D-D' of FIG. 22A.
Figure 22D:
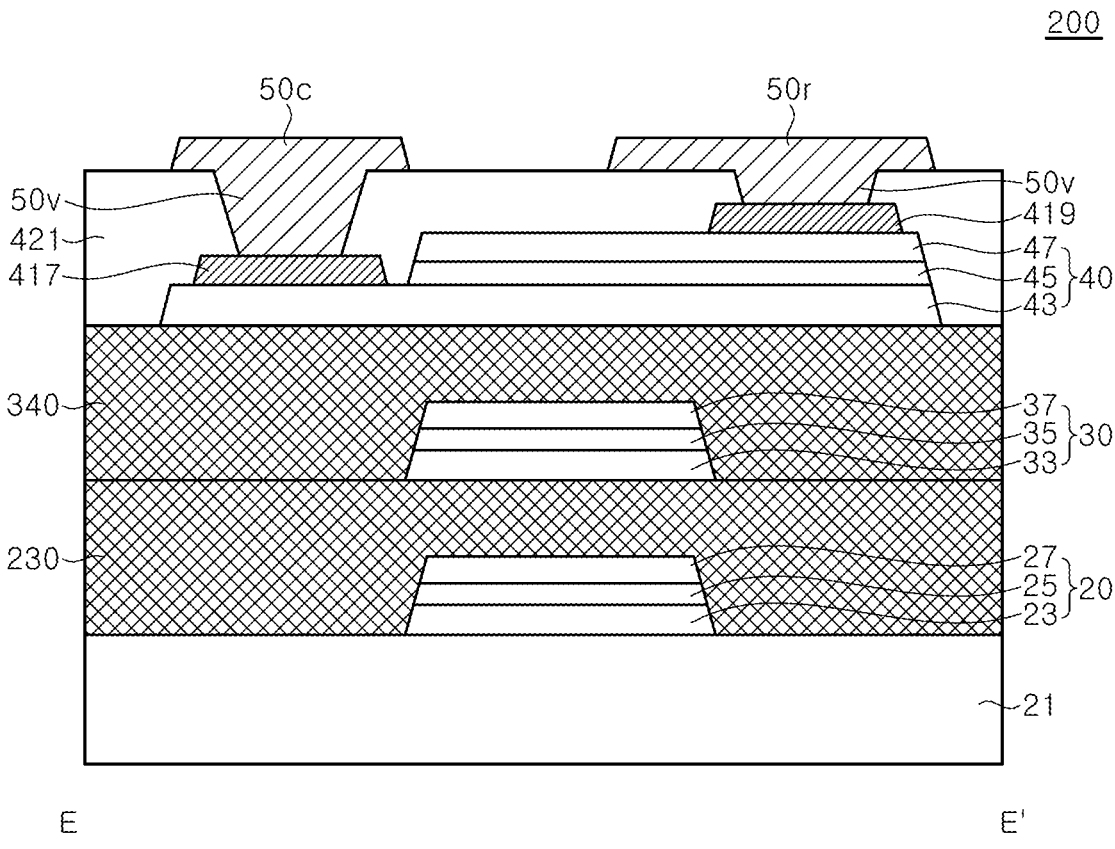
FIG. 22D is a schematic cross-sectional view taken along line E-E' of FIG. 22A.
Figure 23A:
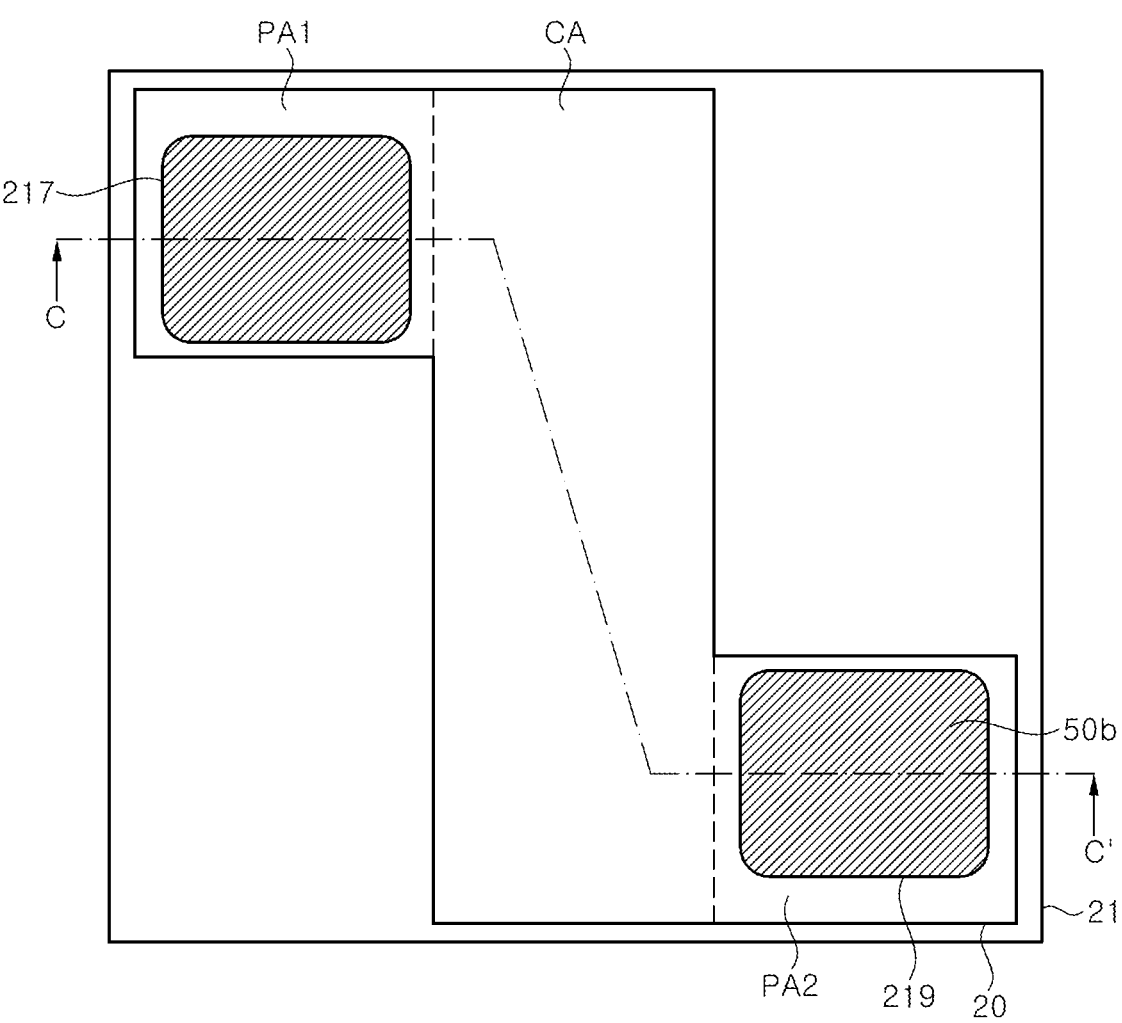
FIG. 23A is a schematic plan view illustrating a first floor of FIG. 22A.
Figure 23B:
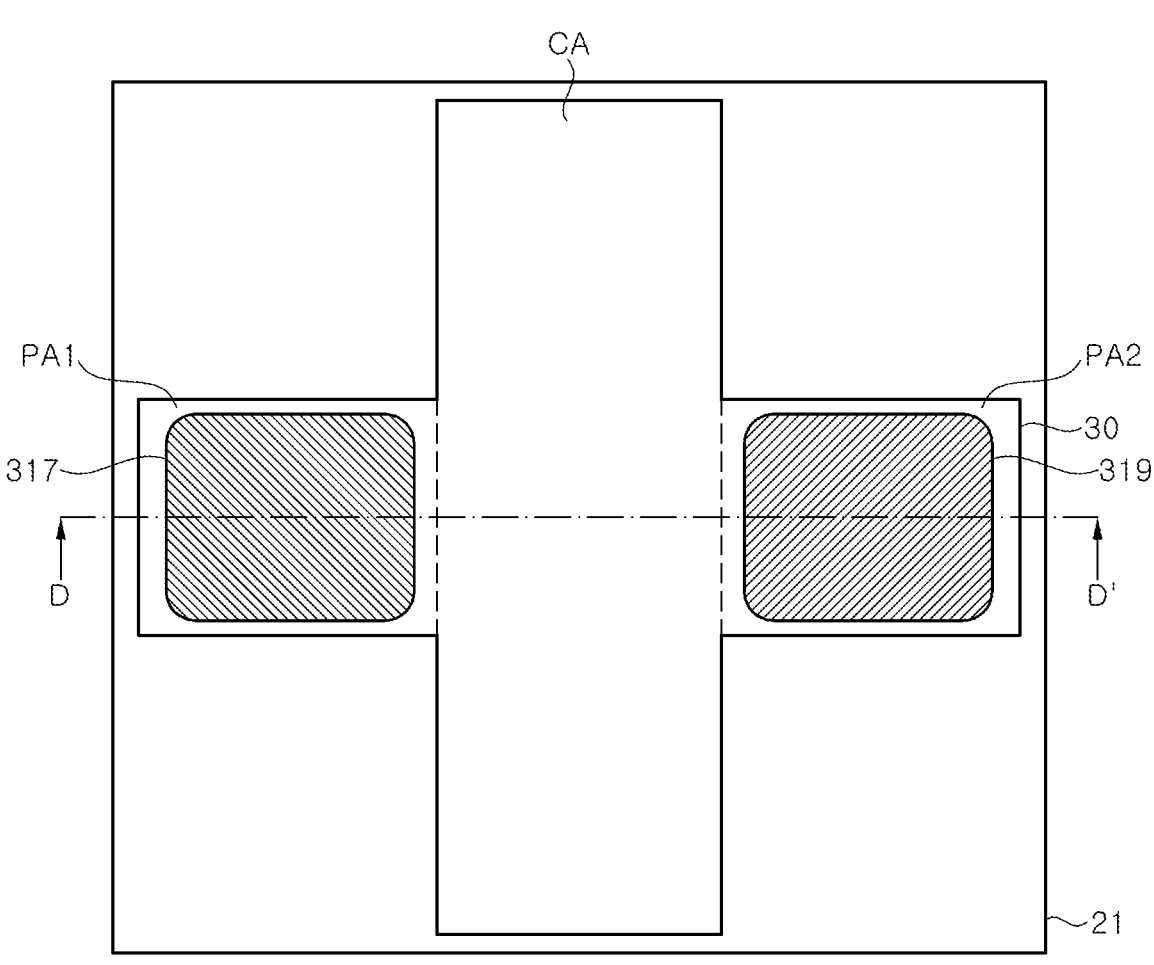
FIG. 23B is a schematic plan view illustrating a second floor of FIG. 22A.
Figure 23C:
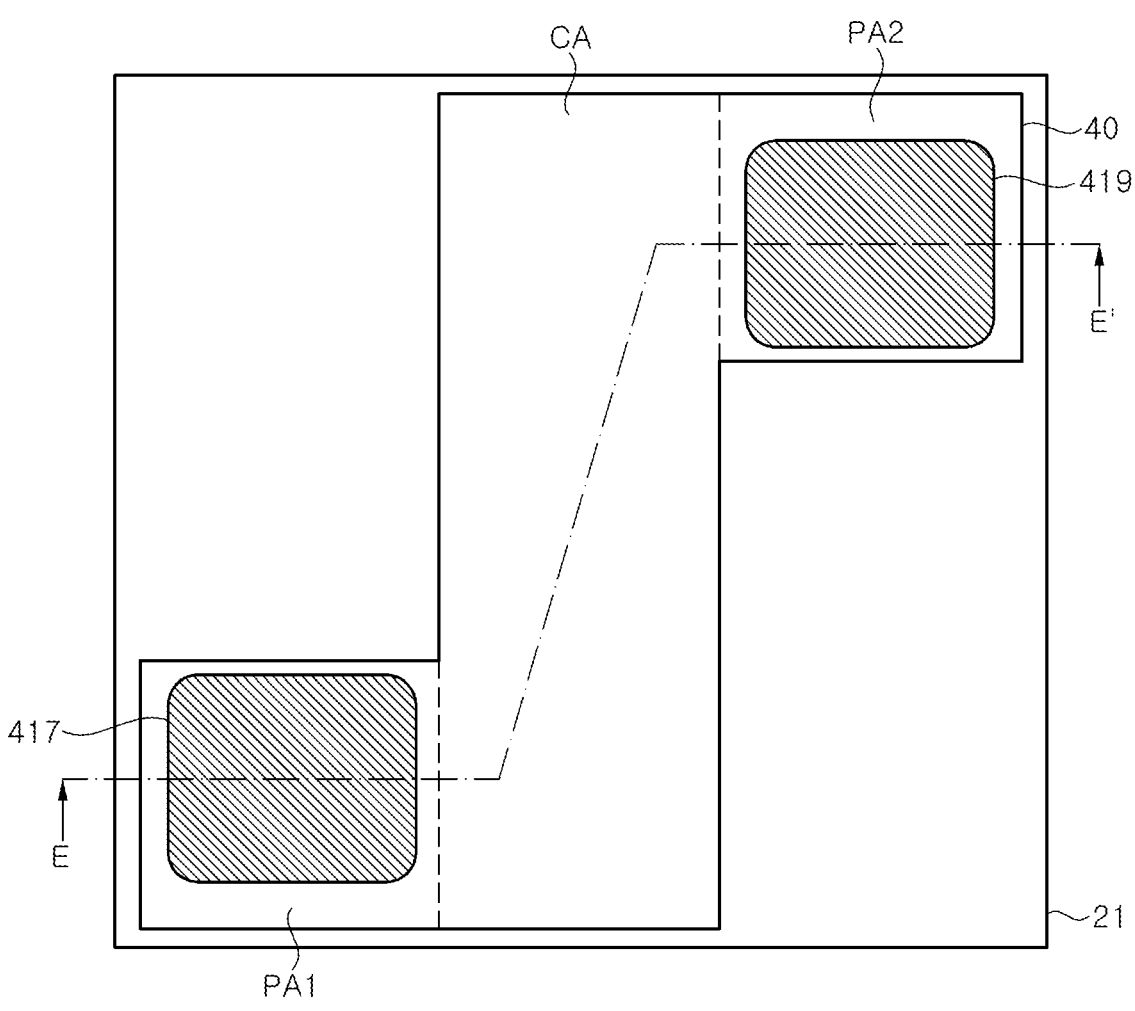
FIG. 23C is a schematic plan view illustrating a third floor of FIG. 22A.

FIG. 22A is a schematic plan view illustrating a pixel device 200 according to another exemplary embodiment, FIG. 22B is a schematic cross-sectional view taken along line C-C' of FIG. 22A, FIG. 22C is a schematic cross-sectional view taken along line D-D' of FIG. 22A, and FIG. 22D is a schematic cross-sectional view taken along line E-E' of FIG. 22A. Meanwhile, FIGS. 23A through 23C show plan views of LEDs 20, 30, and 40 of first through third floors, respectively.

Referring to FIGS. 22A, 22B, 22C, and 22D, the pixel device 200 according to this exemplary embodiment may include a substrate 21, a planarization layer 421, lower and upper adhesive layers 230 and 340, the LEDs 20, 30, and 40, a first lower pad 217, a first upper pad 219, a second lower pad 317, a second upper pad 319, a third lower pad 417, a third upper pad 419, connection vias 50v, and pixel device pads 50r, 50g, 50b, and 50c.

Since the pixel device 200 according to this exemplary embodiment is substantially similar to the pixel device 100 described with reference to FIGS. 2A through 2C, same or similar reference numerals are given to same components, and thus, detailed descriptions thereof are omitted to avoid redundancy. In particular, the pixel device 200 according to this exemplary embodiment, as compared to the pixel device 100 described with reference to FIGS. 2A through 2C, has characteristics that first through third lower pads 217, 317, and 417 and first through third upper pads 219, 319, and 419 are disposed on respective corresponding LEDs 20, 30, and 40, and the LEDs 20, 30, and 40 partially overlap one another.

The pixel device 200 may include the first through third floors disposed on the substrate 21, and these floors may be bonded through the adhesive layers 230 and 340, respectively. For example, as shown in FIG. 23A, the first floor includes the LED 20, the first lower pad 217, and the first upper pad 219; the second floor includes the LED 30, the second lower pad 317, and the second upper pad 319 as shown in FIG. 23B; and the third floor includes the LED 40, the third lower pad 417, and the third upper pad 419. In this exemplary embodiment, the pixel device 200 is shown and described as having a single pixel, but may have a plurality of pixels in other exemplary embodiments. In this case, a plurality of LEDs is disposed on each of the floors, and the lower pads and the upper pads may be disposed on each of the LEDs.

Since the substrate 21 is same as the substrate 21 described with reference to FIGS. 2A through 2C, a detailed description thereof is omitted to avoid redundancy. The substrate 21 may also be omitted in some exemplary embodiments. The pixel device 200 of this exemplary embodiment may also include at least one light blocking layer 213, 313, or 413 disposed around the LEDs 20, 30, and 40, as shown in FIGS. 2B and 2C, but they are omitted for convenience of description.

(First Floor)

Referring to FIGS. 22A, 22B, 22C and 23A, the LED 20 is disposed on the substrate 21. As described above, the LED 20 includes a first conductivity type semiconductor layer 23, an active layer 25, and a second conductivity type semiconductor layer 27.

The LED 20 may be patterned such that a portion of the first conductivity type semiconductor layer 23 is exposed through the second conductivity type semiconductor layer 27 and the active layer 25. As shown in FIG. 22B, a portion of an upper surface of the first conductivity type semiconductor layer 23 is exposed.

As shown in FIG. 23A, the LED 20 may include a central region CA and peripheral regions PA1 and PA2 extending from the central region. The central region CA may have a vertically elongated rectangular shape, without being limited thereto, and may have various shapes such as a square shape and a circular shape. The peripheral regions PA1 and PA2 may be disposed on opposite sides with the central region CA interposed therebetween. The peripheral regions PA1 and PA2 may be disposed symmetrically with each other. For example, the peripheral region PA1 of the LED 20 may extend leftward from one end of the central region CA, and the peripheral region PA2 may extend rightward from the other end of the central region CA. Accordingly, the peripheral regions PA1 and PA2 may be disposed so as to be far apart from each other.

The first conductivity type semiconductor layer 23 may be exposed in the peripheral region PA1. An upper surface of the substrate 21 may be exposed in regions other than the central region CA and the peripheral regions PA1 and PA2.

The first lower pad 217 is disposed on the first conductivity type semiconductor layer 23 exposed in the peripheral region PA1, and the first upper pad 219 is disposed on the second conductivity type semiconductor layer in the peripheral region PA2.

In this exemplary embodiment, since the first lower pad 217 and the first upper pad 219 are disposed on the LED 20, the first lower pad 217 and the first upper pad 219 may contact the first and second conductivity type semiconductor layers 23 and 27, respectively. Accordingly, in this exemplary embodiment, the lower connection lines are omitted. Furthermore, the first lower pad 217 and the first upper pad 219 may be formed directly on the LED 20, so that the insulation layer 215 and the planarization layer 221 described in the pixel device 100 may be omitted.

(Second Floor)

The second floor may include the LED 30, the second lower pads 317, and the second upper pads 319. The second floor may be attached to the first floor by the lower adhesive layer 230. The lower adhesive layer 230 may cover the first lower pad 217, the LED 20, and the first upper pad 219. Further, the lower adhesive layer 230 may contact the substrate 21 exposed around the LED 20.

The LED 30 may be attached to the lower adhesive layer 230. The LED 30 is disposed so as to partially overlap the LED 20. As shown in FIG. 23B, for example, the LED may include a central region CA and peripheral regions PA1 and PA2. The central region CA of the LED 30 may overlap the central region CA of the LED 20, and the peripheral regions PA1 and PA2 of the LED 30 may be disposed on opposite sides of the central region CA, so as not to overlap the LED 20, respectively. In this exemplary embodiment, the peripheral regions PA1 and PA2 of the LED 30 may be symmetrically arranged on left and right sides of the central region CA with respect to the central region CA. Since a material and a layer structure of the LED 30 are same as those described for the pixel device 100, detailed descriptions thereof are omitted.

The LED 30 may be patterned such that a portion of the first conductivity type semiconductor layer 33 is exposed through the second conductivity type semiconductor layer 37 and the active layer 35. As shown in FIG. 22C, a portion of an upper surface of the first conductivity type semiconductor layer 33 is exposed. The first conductivity type semiconductor layer 33 may be exposed in the peripheral region PA1 of the LED 30.

The second lower pad 317 is disposed on the first conductivity type semiconductor layer 33 exposed in the peripheral region PA1, and the second upper pad 319 is disposed on the second conductivity type semiconductor layer 37 in the peripheral region PA2.

In this exemplary embodiment, since the second lower pad 317 and the second upper pad 319 are disposed on the LED 30, the second lower pad 317 and the second upper pad 319 may contact the first and second conductivity type semiconductor layers 33 and 37, respectively. Accordingly, in this exemplary embodiment, the lower connection lines are omitted. Furthermore, the second lower pad 317 and the second upper pad 319 may be formed directly on the LED 30, so that the insulation layer 315 and the planarization layer 321 described in the pixel device 100 may be omitted.

(Third Floor)

The third floor may include the LED 40, the third lower pad 417, and the third upper pad 419. The third floor may be attached to the second floor by the upper adhesive layer 340.

The upper adhesive layer 340 may cover the LED 30, the second lower pad 317, and the second upper pad 319, and may also cover the lower adhesive layer 230.

The LED 40 may be attached to the upper adhesive layer 340. The LED 40 is disposed so as to partially overlap the LED 30. Further, the LED 40 is disposed so as to partially overlap the LED 20. As shown in FIG. 23C, for example, the LED 40 may include a central region CA and peripheral regions PA1 and PA2. The central region CA of the LED 40 may overlap the central regions CA of the LEDs 20 and 30, and the peripheral regions PA1 and PA2 of the LED 40 may be disposed on opposite sides of the central region CA so as not to overlap either the LED 20 or the LED 30, respectively. For example, the peripheral regions PA1 and PA2 of the LED 40 may be disposed diagonally on left and right sides of the central region CA with respect to the central region CA. For example, the peripheral region PA2 may extend rightward from one end of the central region CA, and the peripheral region PA1 may extend leftward from the other end of the central region CA. Since a material and a layer structure of the LED 40 are same as those described for the pixel device 100, detailed descriptions thereof are omitted.

The LED 40 may be patterned such that a portion of the first conductivity type semiconductor layer 43 is exposed through the second conductivity type semiconductor layer 47 and the active layer 45. As shown in FIG. 22D, a portion of an upper surface of the first conductivity type semiconductor layer 43 is exposed. The first conductivity type semiconductor layer 43 may be exposed in the peripheral region PA1 of the LED 40.

The third lower pad 417 is disposed on the first conductivity type semiconductor layer 43 exposed in the peripheral region PA1, and the third upper pad 419 is disposed on the second conductivity type semiconductor layer in the peripheral region PA2.

In this exemplary embodiment, since the third lower pad 417 and the third upper pad 419 are disposed on the LED 40, the third lower pad 417 and the third upper pad 419 may contact the first and second conductivity type semiconductor layers 43 and 47, respectively. Accordingly, in this exemplary embodiment, the lower connection lines are omitted. Furthermore, the third lower pad 417 and the third upper pad 419 may be formed directly on the LED 40, so that the insulation layer 415 described in the pixel device 100 may be omitted.

The planarization layer 421 covers the LED 40, the third lower pad 417, and the third upper pad 419. The planarization layer 421 may cover a surface morphology formed by the LEDs 40 to provide a flat upper surface. The planarization layer 421 may be formed of a light-transmitting insulating material such as polyimide (PI) or epoxy molding compound (EMC).

(Pixel Device Pad)

The pixel device pads 50r, 50g, 50b, and 50c may be disposed on the third floor. In this exemplary embodiment, since the third upper pad 419 is disposed under the planarization layer 421, the upper insulation layer 423 of the pixel device 100 may be omitted.

The pixel device pads 50r, 50g, 50b, and 50c may be disposed on the planarization layer 421. The pixel device pads 50r, 50g, 50b, and 50c may be electrically connected to the first through third lower pads 217, 317, and 417 and the first through third upper pads 219, 319, and 419 through the connection vias 50v.

In this exemplary embodiment, the connection vias 50v are disposed on corresponding LEDs among the LEDs 20, 30, and 40, and may be laterally spaced apart from the other LEDs. The connection vias 50v do not pass through the LEDs 20, 30, and 40, and thus, the LEDs may not be subjected to etching during the process of forming the connection vias 50v.

The pixel device pad 50r may be electrically connected to the third upper pad 419 through the connection via 50v passing through the planarization layer 421. The pixel device pad 50*g* may be electrically connected to the second upper pads 319 through the connection via 50*v* passing through the planarization layer 421 and the upper adhesive layer 340. In addition, the pixel device pad 50*b* may be electrically connected to the first upper pad 219 through the connection via 50*v* passing through the planarization layer 421, the upper adhesive layer 340, and the lower adhesive layer 230.

Meanwhile, the pixel device pad 50*c* may be commonly electrically connected to the first through third lower pads 217, 317, and 417 through the connection via 50*v*. As shown in FIG. 22A, since the first lower pad 217, the second lower pad 317, and the third lower pad 417 are disposed so as not to overlap one another, the pixel device pads 50*c* may be commonly electrically connected to the first lower pad 217, the second lower pad 317, and the third lower pad 417 through a plurality of connection vias 50*v* spaced apart from one another.

In this exemplary embodiment, the LED 20 may emit blue light, the LED 30 may emit green light, and the LED 40 may emit red light. In another exemplary embodiment, the LED 20 may emit green light, the LED 30 emit blue light, and the LED 40 emit red light. The pixel device 200 may be flip-bonded to a circuit board 1001 using the pixel device pads 50*r*, 50*g*, 50*b*, and 50*c*, and light generated from the LEDs 20, 30, and 40 may be emitted towards the circuit board 1001.

In this exemplary embodiment, the LEDs 20, 30, and 40 are partially vertically stacked one above another to constitute pixels. Each of the LEDs 20, 30, and 40 constitutes a sub-pixel. The LEDs 20, 30, and 40 are disposed on the first through third floors, respectively, and the lower pads 217, 317, and 417 and the upper pads 219, 318, and 419 connected to the LEDs 20, 30, and 40 are also disposed on corresponding floors. Since the pixel device 200 according to this exemplary embodiment may be manufactured in a substantially similar manner that described in the manufacturing method of the pixel device 100, a detailed description thereof will be omitted to avoid redundancy. In particular, each of the floors is manufactured through different processes and then attached to one another using the lower and upper adhesive layers 230 and 340. Accordingly, before bonding the floors, electrical and/or optical characteristics of the LEDs 20, 30, or 40 in each of the floors may be evaluated to detect any defective LEDs, and repair may be performed for each of the floors if necessary. As such, the defective LEDs may be easily repaired, and as a result, a process yield of the pixel device may be improved.

In this exemplary embodiment, the cathodes of the LEDs 20, 30, and 40 disposed on different floors are described as being commonly electrically connected to one another, and vice versa.

In this exemplary embodiment, a width of a region where the lower pads 217, 317, and 417 are disposed may be formed smaller than that of a light emitting region where the plurality of LEDs overlaps. Alternatively, at least one LED may have a groove such that the lower pads 217, 317, and 417 are disposed in a region protruding outward from the light emitting region. Alternatively, in plan view, each of the lower pads 217, 317, and 417 may be disposed to be spaced apart so as not to overlap one another, and may be disposed in a groove region of an LED not electrically connected therewith.

Figure 24:
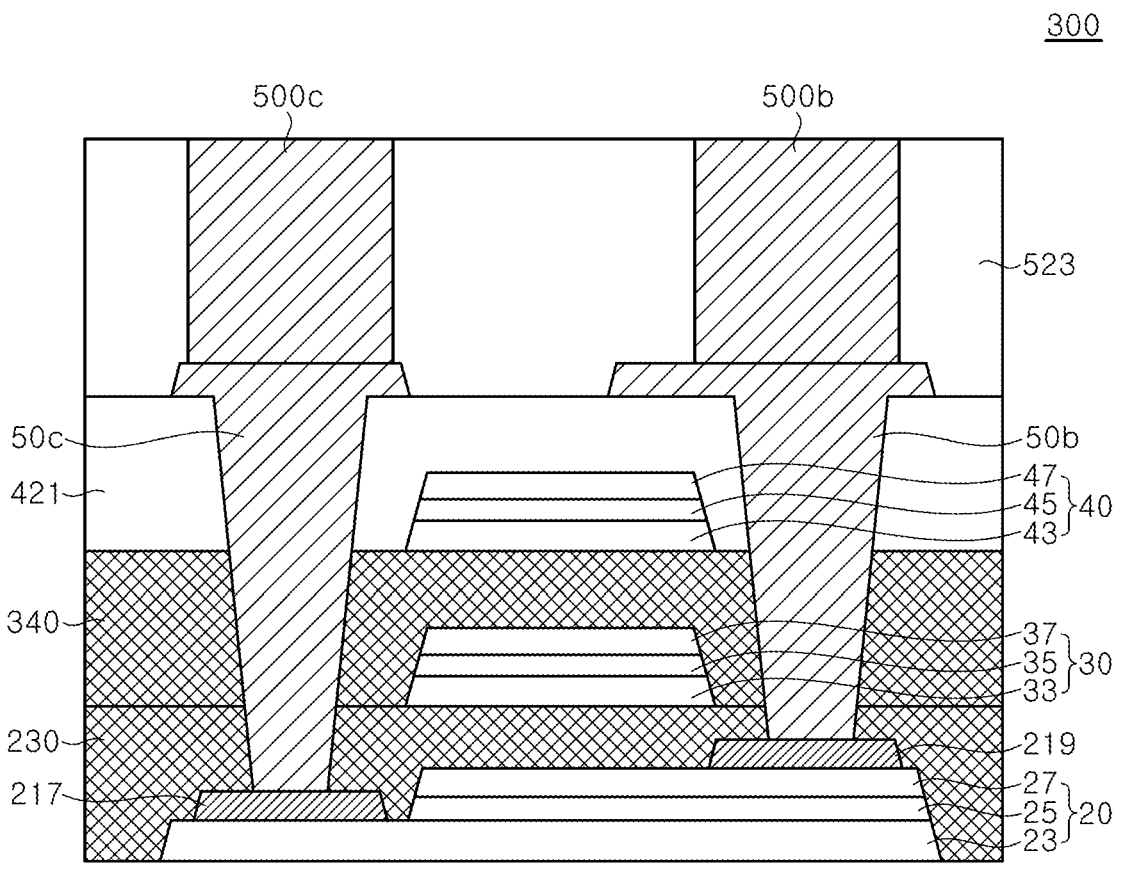
FIG. 24 is a schematic cross-sectional view illustrating a pixel device according to another exemplary embodiment.

FIG. 24 is a schematic cross-sectional view illustrating a pixel device 300 according to another exemplary embodiment.

Referring to FIG. 24, the pixel device 300 according to this exemplary embodiment is substantially similar to the pixel device 200 described with reference to FIGS. 22A through 22D, except that it includes metal pads 500*b* and 500*c* and an upper insulating material layer 523.

The upper insulating material layer 523 may be thicker than the planarization layer 421. The upper insulating material layer 523 may be formed of polyimide or an epoxy molding compound. The upper insulating material layer 523 may have openings exposing the pixel device pads 50*r*, 50*g*, 50*g*, and 50*c*, and the metal pads 500*b* and 500*c* may fill the openings in the upper insulating material layer 523. Although FIG. 24 shows two metal pads 500*b* and 500*c* formed on the pixel device pads 50*b* and 50*c*, the metal pads may also be disposed on the pixel device pads 50*r* and 50*g*. The metal pads may be electrically connected to corresponding pixel device pads 50*r*, 50*g*, 50*b*, and 50*c*. In this exemplary embodiment, for convenience of description, it is referred to as the pixel device pads 50*r*, 50*g*, 50*b*, and 50*c* and the metal pads 500*b* and 500*c*, but the metal pads 500*b* and 500*c* may function as final pixel device pads of the pixel device 300, and the pixel device pads 50*r*, 50*g*, 50*g*, and 50*c* may function as intermediate connection pads. The pixel device 300 may be mounted on the circuit board 1001 using the metal pads.

In this exemplary embodiment, the substrate 21 previously described will be omitted. The substrate 21 may be separated from the first floor using, for example, a laser lift-off technique or the like. Accordingly, the first floor may be exposed to the outside.

Figure 25:
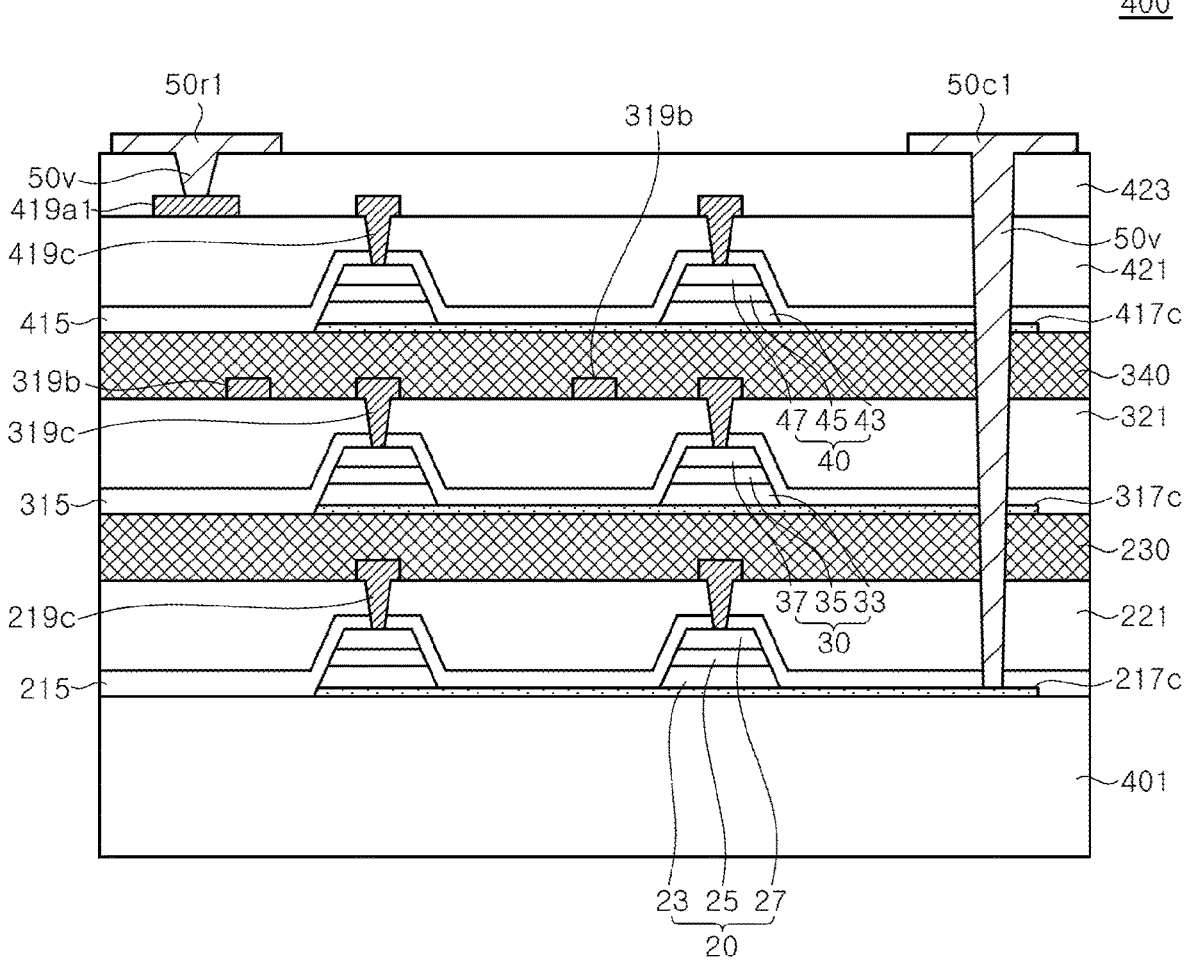
FIG. 25 is a schematic cross-sectional view illustrating a pixel device according to another exemplary embodiment.

FIG. 25 is a schematic cross-sectional view illustrating a pixel device 400 according to another exemplary embodiment.

Referring to FIG. 25, since the pixel device 400 according to this exemplary embodiment is substantially similar to the pixel device 100 described with reference to FIGS. 2A through 2C, same or similar reference numerals are given to same components, and thus, detailed descriptions thereof are omitted to avoid redundancy.

Compared to the pixel device 100 described with reference to FIGS. 2A through 2C, in the pixel device 400 according to this exemplary embodiment, the first through third lower contact layers 217*c*, 317*c*, and 417*c* are disposed on corresponding LEDs 20, 30, and 40, respectively, instead of the first through third lower contacts, the first through third lower connection lines, and the first through third lower pads of FIGS. 2A through 2C. As shown in FIG. 25, the first through third lower contact layers 217*c*, 317*c*, and 417*c* are disposed on light exiting surfaces of corresponding LEDs 20, 30, and 40, respectively. The first through third lower contact layers 217*c*, 317*c*, and 417*c* may be disposed so as to face the first through third upper contacts 219*c*, 319*c*, and 419*c* with the corresponding LEDs 20, 30, and 40 interposed therebetween. Accordingly, electric flow is generated vertically inside of each of the LEDs 20, 30, and 40, thereby improving luminous efficiency.

The pixel device 400 may include first through third floors disposed on a substrate 401, and these floors may be bonded through the adhesive layers 230 and 340, respectively. As shown in FIG. 25, the first lower contact layer 217*c* is disposed between the substrate 401 and the LEDs 20, the second lower contact layer 317*c* is disposed between the lower adhesive layer 230 and the LEDs 30, and the third lower contact layer 417*c* is disposed between the upper adhesive layer 340 and the LEDs 40. A plurality of LEDs may be disposed on each of the first through third floors, and the first through third lower contact layers 217*c*, 317*c*, and 417c may electrically connect adjacent LEDs. Furthermore, the first through third lower contact layers 217c, 317c, and 417c may extend to the outside of the LEDs 20, 30, and 40, respectively, and serve as pads to which the vias 50v are connected.

In this exemplary embodiment, the substrate 401 may be a substrate attached to the LED 20, unlike a growth substrate of the LED 20. In some exemplary embodiments, the substrate 401 may be omitted.

(First Floor)

Referring to FIG. 25, the LED 20 is disposed on the substrate 401. As described above, the LED 20 includes the first conductivity type semiconductor layer 23, the active layer 25, and the second conductivity type semiconductor layer 27.

The first conductivity type semiconductor layer 23 of the LED 20 may include a first surface facing the active layer 25 and a second surface opposite the first surface, and a growth substrate is removed to expose the second surface of the first conductivity type semiconductor layer 23.

The first lower contact layer 217c is disposed on the exposed second surface of the first conductivity type semiconductor layer 23, and the first upper contact layer 219c is disposed on the second conductivity type semiconductor layer. The first lower contact layer 217c may extend to the outside of the LED 20 and electrically connected to the pixel device pad 50c1 through the via 50v. The first lower contact layer 217c may electrically connect adjacent LEDs 20, and furthermore, a plurality of first lower contact layers 217c may be disposed. The first lower contact layers 217c may be electrically connected to different pixel device pads (e.g., 50c1 and 50c2 of FIG. 2A).

The first lower contact layer 217c includes a region overlapping the LED 20, and may additionally extend to the outside of the LED 20. The first lower contact layer 217c may be formed of a light-transmitting material, such as a metallic material or a conductive oxide layer. In particular, the first lower contact layer 217c may be formed of a material that is transparent to light emitted from the LEDs 20, 30, and 40.

(Second Floor)

The second floor may be attached to the first floor by the lower adhesive layer 230. The LEDs 30 may be arranged on the lower adhesive layer 230. The second lower contact layer 317c is disposed between the lower adhesive layer 230 and the LEDs 30. The LEDs 30 are disposed so as to at least partially overlap the LEDs 20, respectively.

The first conductivity type semiconductor layer 33 of the LED 30 may include a first surface facing the active layer 35 and a second surface opposite to the first surface, and a growth substrate is removed to expose the first conductivity type semiconductor layer 33.

The second lower contact layer 317c is disposed on the exposed second surface of the first conductivity type semiconductor layer 33, and the second upper contact layer 319c is disposed on the second conductivity type semiconductor layer. The second lower contact layer 317c and the second upper contact 319c may be electrically connected to the first and second conductivity type semiconductor layers 33 and 37, respectively.

The second lower contact layer 317c may extend to the outside of the LED 30, and electrically connected to the pixel device pad 50c1 through the via 50v. The second lower contact layer 317c may electrically connect adjacent LEDs 30, and furthermore, a plurality of second lower contact layers 317c may be disposed. The second lower contact layers 317c may be electrically connected to different pixel device pads (e.g., 50c1 and 50c2 of FIG. 2A).

The second lower contact layer 317c includes a region overlapping the LED 30, and may additionally extend to the outside of the LED 30. The second lower contact layer 317c may be formed of a light-transmitting material such as a metallic material or a conductive oxide layer. In particular, the second lower contact layer 317c may be formed of a material that is transparent to light emitted from the LEDs 30 and 40.

(Third Floor)

The third floor may be attached to the second floor by the upper adhesive layer 340. The LEDs 40 may be arranged on the upper adhesive layer 430. The third lower contact layer 417c is disposed between the upper adhesive layer 340 and the LEDs 40. The LEDs 40 are disposed so as to at least partially overlap the LEDs 30, respectively.

The first conductivity type semiconductor layer 43 of the LED 40 may include a first surface facing the active layer 45 and a second surface opposite to the first surface, and a growth substrate is removed to expose the first conductivity type semiconductor layer 43.

The third lower contact layer 417c is disposed on the exposed second surface of the first conductivity type semiconductor layer 43, and the third upper contact layer 419c is disposed on the second conductivity type semiconductor layer 47. The third lower contact layer 417c and the third upper contact 419c may be electrically connected to the first and second conductivity type semiconductor layers 43 and 47, respectively.

The third lower contact layer 417c may extend to the outside of the LED 40, and electrically connected to the pixel device pad 50c1 through the via 50v. The third lower contact layer 417c may electrically connect adjacent LEDs 40, and furthermore, a plurality of third lower contact layers 417c may be disposed. The third lower contact layers 417c may be electrically connected to different pixel device pads (e.g., 50c1 and 50c2 of FIG. 2A).

The third lower contact layer 417c includes a region overlapping the LED 40, and may additionally extend to the outside of the LED 40. The third lower contact layer 417c may be formed of a light-transmitting material such as a metallic material or a conductive oxide layer. In particular, the third lower contact layer 417c may be formed of a material that is transparent to light emitted from the LEDs 40.

In this exemplary embodiment, the first through third lower contact layers 217c, 317c, and 417c may be directly connected to the via 50v, but the inventive concepts are not limited thereto. For example, as described with reference to FIGS. 2A through 2C, the first through third lower pads may be formed on the insulation layers 215, 315, and 415, respectively, may be electrically connected to the first through third lower contact layers 217c, 317c, and 417c, respectively, and the via 50v may be electrically connected through the first to third lower contact pads. Accordingly, the first through third lower pads may be formed of a material having a light transmittance different from those of the first through third lower contact layers 217c, 317c, and 417c.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A pixel device, comprising:
a first floor including a first LED, a first lower pad, and a first upper pad electrically connected to the first LED;
a second floor disposed over the first floor, and including a second LED, a second lower pad, and a second upper pad electrically connected to the second LED, the second floor further including a second insulation layer covering the second LED and a second planarization layer covering the second insulation layer; and
a third floor disposed over the second floor, and including a third LED, a third lower pad, and a third upper pad electrically connected to the third LED,
wherein the third floor further includes a third insulation layer covering the third LED and a third planarization layer covering the third insulation layer, the third LED, and the third lower pad;
the third lower pad is disposed between the third insulation layer and the second planarization layer; and
the third upper pad is disposed above the third planarization layer, and the third lower pad extends from a bottom of the third LED toward an outside of the third LED.

2. The pixel device of claim 1, wherein the first LED, the second LED, and the third LED are configured to emit visible light of different colors from one another.

3. The pixel device of claim 1, wherein:
the first, second, and third lower pads are electrically connected to one another; and
the first, second, and third upper pads are electrically isolated from one another.

4. The pixel device of claim 1, further comprising:
a lower adhesive layer bonding the first floor and the second floor; and
an upper adhesive layer bonding the second floor and the third floor.

5. The pixel device of claim 1, wherein the first, second, and third LEDs overlap one another in a vertical direction.

6. The pixel device of claim 5, wherein the first, second, and third LEDs partially overlap one another.

7. The pixel device of claim 1, further comprising:
a light blocking layer surrounding the first LED, the second LED, or the third LED.

8. The pixel device of claim 1, further comprising a first insulation layer covering the first LED and a first planarization layer covering the first insulation layer,
wherein the first upper pad is disposed on the first planarization layer.

9. The pixel device of claim 8, wherein the first lower pad is disposed between the first insulation layer and the first planarization layer or on the first planarization layer.

10. The pixel device of claim 1, wherein:
the second floor includes the second insulation layer covering the second LED and the second planarization layer covering the second insulation layer; and
the second upper pad is disposed on the second planarization layer.

11. The pixel device of claim 10, wherein the second lower pad is disposed between the second insulation layer and the second planarization layer or on the second planarization layer.

12. The pixel device of claim 1, further comprising:
an upper insulation layer covering the third floor; and
pixel device pads disposed on the upper insulation layer, wherein the pixel device pads are electrically connected to at least one of the first, second, and third lower pads and the first, second, and third upper pads, respectively.

13. The pixel device of claim 12, wherein:
each of the first, second, and third LEDs is formed in plural;
the first, second, and third LEDs are arranged in a matrix of n×m (n, m is a positive integer) on the first, second, and third floors, respectively; and
a number of pixel pad electrodes is (3n+m).

14. The pixel device of claim 12, wherein:
the pixel device pads are electrically connected to at least one of the first, second, and third lower pads and the first, second, and third upper pads through connection vias; and
the connection vias are spaced apart from the first, second, and third LEDs in a lateral direction.

15. The pixel device of claim 1, wherein:
the first, second, and third lower pads are electrically connected to cathodes of the first, second, and third LEDs, respectively; and
the first, second, and third upper pads are electrically connected to anodes of the first, second, and third LEDs, respectively.

16. A display apparatus, comprising:
a circuit board; and
a pixel device disposed on the circuit board, the pixel device comprising:
a first floor including a first LED, a first lower pad, and a first upper pad electrically connected to the first LED;
a second floor disposed over the first floor, and including a second LED, a second lower pad, and a second upper pad electrically connected to the second LED, the second floor further including a second insulation layer covering the second LED and a second planarization layer covering the second insulation layer; and
a third floor disposed over the second floor, and including a third LED, a third lower pad, and a third upper pad electrically connected to the third LED,
wherein the third floor further includes a third insulation layer covering the third LED and a third planarization layer covering the third insulation layer, the third LED, and the third lower pad;
the third lower pad is disposed between the third insulation layer and the second planarization layer; and
the third upper pad is disposed above the third planarization layer, and the third lower pad extends from a bottom of the third LED toward an outside of the third LED.

17. The display apparatus of claim 16, wherein the pixel device further comprises an upper insulation layer disposed on the third floor and pixel device pads disposed on the upper insulation layer,
wherein the pixel device pads are bonded to the circuit board.

18. The display apparatus of claim 17, wherein:
the pixel device pads are electrically connected to at least one of the first, second, and third lower pads and the first, second, and third upper pads through connection vias, and
the connection vias are spaced apart from the first, second, and third LEDs in a lateral direction.

* * * * *